US012720889B2

(12) United States Patent
Miyanami et al.

(10) Patent No.: US 12,720,889 B2
(45) Date of Patent: Aug. 25, 2026

(54) IMAGING DEVICE, MANUFACTURING METHOD THEREOF, AND ELECTRONIC APPARATUS

(71) Applicant: SONY SEMICONDUCTOR SOLUTIONS CORPORATION, Kanagawa (JP)

(72) Inventors: Yuki Miyanami, Kanagawa (JP); Atsushi Okuyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/529,624

(22) Filed: Dec. 5, 2023

(65) Prior Publication Data

US 2024/0105743 A1    Mar. 28, 2024

Related U.S. Application Data

(63) Continuation of application No. 16/972,657, filed as application No. PCT/JP2019/023429 on Jun. 13, 2019, now Pat. No. 11,888,006.

(30) Foreign Application Priority Data

Jun. 15, 2018 (JP) ................................ 2018-114537
Jun. 10, 2019 (JP) ................................ 2019-108072

(51) Int. Cl.
*H01L 27/146* (2006.01)
*H10F 39/00* (2025.01)
*H10F 39/18* (2025.01)

(52) U.S. Cl.
CPC ....... *H10F 39/8057* (2025.01); *H10F 39/024* (2025.01); *H10F 39/18* (2025.01); *H10F 39/807* (2025.01)

(58) Field of Classification Search
CPC .... H10F 39/8057; H10F 39/024; H10F 39/18; H10F 39/807; H10F 39/014;
(Continued)

(56) References Cited

U.S. PATENT DOCUMENTS 8,325,254 B2 12/2012 Yanagita et al.
8,749,679 B2 6/2014 Shinohara
(Continued)

FOREIGN PATENT DOCUMENTS

JP 2008-060195 3/2008
JP 2013-098446 5/2013
(Continued)

OTHER PUBLICATIONS

International Search Report and Written Opinion for International (PCT) Patent Application No. PCT/JP2019/023429, dated Aug. 27, 2019, 6 pages.
(Continued)

*Primary Examiner* — Jay C Kim
(74) *Attorney, Agent, or Firm* — SHERIDAN ROSS P.C.

(57) ABSTRACT

An imaging device having a superior light-shielding property for a charge-holding section is provided. The imaging device includes: an Si {111} substrate extending along a horizontal plane; a photoelectric conversion section provided in the Si {111} substrate and generating charges corresponding to a light reception amount by photoelectric conversion; a charge-holding section provided in the Si {111} substrate and holding charges transferred from the photoelectric conversion section; and a light-shielding section including a horizontal light-shielding part positioned between the photoelectric conversion section and the charge-holding section in a thickness direction and extending along the horizontal plane and a vertical light-shielding part orthogonal thereto. The horizontal light-shielding sec-
(Continued)

tion includes a first plane along a first crystal plane of the Si {111} substrate of a plane index {111} orthogonal to the thickness direction, and a second plane along a second crystal plane of the Si {111} substrate inclined to the thickness direction.

18 Claims, 64 Drawing Sheets

(58) Field of Classification Search
CPC ............... H10F 39/199; H10F 39/8053; H10F 39/8063; H10F 39/8067; H10F 39/8023; H10F 39/80373; H10F 39/804; H04N 25/62; H04N 25/628; H04N 25/70
See application file for complete search history.

(56) References Cited

U.S. PATENT DOCUMENTS

| | | | | |
|---|---|---|---|---|
| 8,941,198 | B2 * | 1/2015 | Enomoto | H10F 39/811 257/432 |
| 8,941,200 | B2 | 1/2015 | Egawa | |
| 9,123,653 | B2 * | 9/2015 | Yamaguchi | H10F 39/1825 |
| 9,133,566 | B2 | 9/2015 | Twitchen et al. | |
| 9,153,612 | B2 | 10/2015 | Miyanami | |
| 9,165,962 | B2 | 10/2015 | Tanida | |
| 9,276,032 | B2 * | 3/2016 | Suzuki | H10F 39/024 |
| 9,324,753 | B2 | 4/2016 | Kato et al. | |
| 9,691,804 | B2 * | 6/2017 | Huang | H10F 39/806 |
| 9,882,154 | B2 * | 1/2018 | Yamaguchi | H10K 30/10 |
| 10,468,451 | B2 * | 11/2019 | Togashi | H10F 39/8027 |
| 10,515,988 | B2 | 12/2019 | Tayanaka et al. | |
| 10,714,532 | B2 | 7/2020 | Togashi et al. | |
| 10,991,746 | B2 | 4/2021 | Wu et al. | |
| 11,222,912 | B2 | 1/2022 | Furukawa et al. | |
| 11,476,285 | B2 | 10/2022 | Manda et al. | |
| 11,728,361 | B2 * | 8/2023 | Kubo | H10F 39/8057 257/292 |
| 2007/0075253 | A1 * | 4/2007 | Misawa | G01T 1/1644 250/370.11 |
| 2008/0316345 | A1 | 12/2008 | Onodera | |
| 2011/0284979 | A1 | 11/2011 | Mizuno | |
| 2015/0035028 | A1 | 2/2015 | Fan et al. | |
| 2015/0129943 | A1 | 5/2015 | Kato et al. | |
| 2016/0155774 | A1 | 6/2016 | Hasegawa et al. | |
| 2016/0204153 | A1 | 7/2016 | Tayanaka | |
| 2018/0033809 | A1 | 2/2018 | Tayanaka | |
| 2021/0249456 | A1 | 8/2021 | Miyanami et al. | |

FOREIGN PATENT DOCUMENTS

| | | |
|---|---|---|
| JP | 2015-046477 | 3/2015 |
| JP | 2015-095468 | 5/2015 |
| JP | 2016-103541 | 6/2016 |
| JP | 2016-534557 | 11/2016 |
| WO | WO-2013065569 A1 | 5/2013 |
| WO | WO 2016/136486 | 9/2016 |
| WO | WO-2018008614 A1 | 1/2018 |

OTHER PUBLICATIONS

Official Action for U.S. Appl. No. 16/972,657, dated Nov. 18, 2022, 6 pages. Restriction Requirement.

Official Action for U.S. Appl. No. 16/972,657, dated Feb. 14, 2023, 11 pages.

Official Action for U.S. Appl. No. 16/972,657, dated Jun. 27, 2023, 13 pages.

Notice of Allowance for U.S. Appl. No. 16/972,657. dated Sep. 7, 2023, 9 pages.

* cited by examiner 101
111
121
123
SIGNAL PROCESSING SECTION
119
RAMP WAVE MODULE
COLUMN SIGNAL PROCESSING SECTION
CLOCK MODULE
DATA STORAGE SECTION
HORIZONTAL DRIVE SECTION
117
116
115
114
113
122
VERTICAL DRIVE SECTION
SYSTEM CONTROL SECTION
118
112

111(101)
121A
121B
12
12V 12H
54 17 54
12A 16 53 18 52H 17 52 53
11A 12B 11S3
S1
11S1
S1
P P N N
N N N N
11
N~ P P N~ P P N~ P N~ P
13 (13A)
14
11B 51A 51B 52V 15 CF LNS 13 (13B)
51

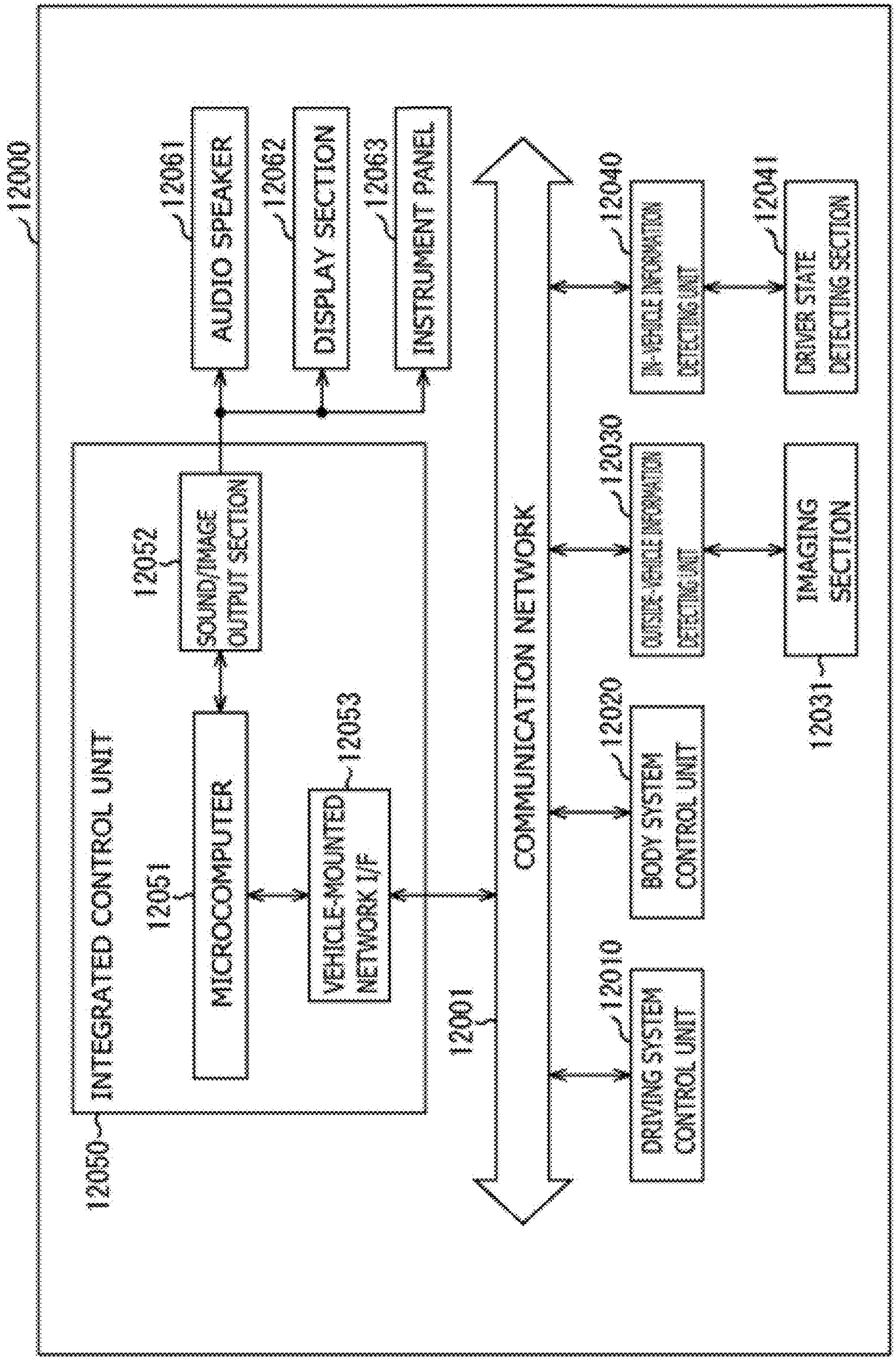

FIG. 29
12000
12050
INTEGRATED CONTROL UNIT
12051
MICROCOMPUTER
12052
SOUND/IMAGE OUTPUT SECTION
12053
VEHICLE-MOUNTED NETWORK I/F
12061
AUDIO SPEAKER
12062
DISPLAY SECTION
12063
INSTRUMENT PANEL
12001
COMMUNICATION NETWORK
12010
DRIVING SYSTEM CONTROL UNIT
12020
BODY SYSTEM CONTROL UNIT
12030
OUTSIDE-VEHICLE INFORMATION DETECTING UNIT
12031
IMAGING SECTION
12040
IN-VEHICLE INFORMATION DETECTING UNIT
12041
DRIVER STATE DETECTING SECTION

IMAGING DEVICE, MANUFACTURING METHOD THEREOF, AND ELECTRONIC APPARATUS

CROSS REFERENCE TO RELATED APPLICATIONS

This application is a continuation of U.S. patent application Ser. No. 16/972,657, filed Dec. 7, 2020, which is a national stage application under 35 U.S.C. 371 and claims the benefit of PCT Application No. PCT/JP2019/023429 having an international filing date of Jun. 13, 2019, which designated the United States, which PCT application claimed the benefit of Japanese Patent Application Nos. 2018-114537, filed Jun. 15, 2018 and 2019-108072, filed Jun. 10, 2019, the entire disclosures of each of which are incorporated herein by reference.

TECHNICAL FIELD

The present disclosure relates to an imaging device that captures an image by performing photoelectric conversion, a method of manufacturing the imaging device, and an electronic apparatus including an imaging element.

BACKGROUND ART

Heretofore, there has been proposed, in a backside illumination type solid-state imaging device of a global shutter system, formation of a horizontal light-shielding section and a vertical light-shielding section in the vicinity of a charge-holding section that holds charges transferred from a photoelectric conversion section (e.g., see PTL 1).

CITATION LIST

Patent Literature

PTL 1: International Publication No. WO 2016/136486

SUMMARY OF THE INVENTION

In such a solid-state imaging device, for example, when light having passed through without being absorbed in the photoelectric conversion section enters the charge-holding section, there is a possibility that a noise may be generated.

It is therefore desired to provide an imaging device with a superior light-shielding property for a charge-holding section.

An imaging device according to an embodiment of the present disclosure includes: a photoelectric conversion section generating charges corresponding to an amount of light reception by means of photoelectric conversion; a charge-holding section holding the charges transferred from the photoelectric conversion section; and a light-shielding section including a horizontal light-shielding part positioned between the photoelectric conversion section and the charge-holding section in a first direction and extending along a horizontal plane and a vertical light-shielding part orthogonal to the horizontal light-shielding part. Here, the horizontal light-shielding part is formed, for example, by performing crystalline anisotropic etching on an Si substrate using an etching solution. For example, in a case of etching using an alkaline solution, the etching progresses from a reaction between an Si dangling bond and an OH ion as a starting point. Therefore, the more the number of the dangling bond exposed to the surface is, the more likely etching is to progress, and the more the number of the backbond extending to side of the bulk is, the less likely etching is to progress. That is, the horizontal light-shielding part includes three Si-backbonds or less in a direction substantially horizontal to a front surface of the substrate. Meanwhile, the horizontal light-shielding part includes three Si backbonds in a direction substantially vertical to the front surface of the Si substrate. To give a description using the schematic explanatory view of FIG. 32, for example, when side of the Si dangling bond is defined as a positive direction with respect to a normal line of an Si {111} plane, the Si backbond means an atomic bonding extending in a negative direction opposite to the positive direction. FIG. 32 exemplifies three backbonds at angles of −19.47° to +19.47° relative to the {111} plane. Specifically, in a case of providing the photoelectric conversion section, the horizontal light-shielding part, and the charge-holding section in the Si {111} substrate, the horizontal light-shielding part includes a first plane along a first crystal plane of the Si {111} substrate being orthogonal to the first direction and represented by a plane index {111}, and a second plane along a second crystal plane of the Si {111} substrate being inclined relative to the first direction and represented by the plane index {111}.

In addition, an electronic apparatus as an embodiment of the present disclosure is provided with the above-described imaging device.

A method of manufacturing an imaging device as an embodiment of the present disclosure includes the following operations (A) to (D).

(A) Preparing an Si {111} substrate having a first direction as a thickness direction and including a first crystal plane represented by a plane index {111} extending along a horizontal plane orthogonal to the first direction.

(B) Forming, in the Si {111} substrate, a photoelectric conversion section generating charges corresponding to an amount of light reception by means of photoelectric conversion.

(C) Forming, in the Si {111} substrate, a charge-holding section holding the charges transferred from the photoelectric conversion section.

(D) Forming a light-shielding section including a horizontal light-shielding part positioned between the photoelectric conversion section and the charge-holding section in the first direction and extending along the horizontal plane and a vertical light-shielding part orthogonal to the horizontal light-shielding part.

Here, a first crystal plane of the Si {111} substrate orthogonal to the first direction and represented by the plane index {111} and a second crystal plane of the Si {111} substrate inclined relative to the first direction and represented by the plane index {111} are each formed by performing crystalline anisotropic etching on the Si {111} substrate using an etching solution to thereby form the horizontal light-shielding part including a first plane along the first crystal plane and a second plane along the second crystal plane.

The imaging element and the electronic apparatus as respective embodiments of the present disclosure, the above-described configuration is provided with a light shielding layer with high dimensional accuracy that is more easily formable by crystalline anisotropic etching using an etching solution such as an alkaline aqueous solution, for example. In addition, the method of manufacturing the imaging element of the present disclosure allows for the imaging element including the light-shielding layer with high dimensional accuracy.

According to the imaging device and the electronic apparatus as the respective embodiments of the present disclosure, it is possible to suppress generation of a noise, and thus to achieve a superior imaging capability. In addition, according to the method of manufacturing the imaging device as an embodiment of the present disclosure, it is possible to manufacture the above-described imaging element.

It is to be noted that the effects of the present disclosure are not limited thereto, and may be any of the effects described below.

BRIEF DESCRIPTION OF THE DRAWINGS

FIG. 29 is a block diagram depicting an example of schematic configuration of a vehicle control system.

MODES FOR CARRYING OUT THE INVENTION

Hereinafter, description is given in detail of embodiments of the present disclosure with reference to the drawings. It is to be noted that description is given in the following order.

1. First Embodiment
   An example of a solid-state imaging device with an island-shaped Si-remaining region in a level occupied by a horizontal light-shielding part.
2. Second Embodiment
   An example of a solid-state imaging device with a band-shaped Si-remaining region in a level occupied by the horizontal light-shielding part.
3. Third Embodiment
   An example of a solid-state imaging device further including an additional light-shielding section.
4. Fourth Embodiment
   An example of a solid-state imaging device having a structure in which a light-shielding section and an element separation section are integrated.
5. Modification Example of Fourth Embodiment
   An example of a solid-state imaging device in which a light-shielding section and an element separation section are integrated and only a vertical light-shielding part is present in a band-shaped Si-remaining region.
6. Fifth Embodiment
   An example of a solid-state imaging device having a three-dimensional structure.
7. Sixth Embodiment
   An example of a solid-state imaging device in which a horizontal light-shielding part and an element separation section are integrated by etching from back surface side of a semiconductor substrate, with the horizontal light-shielding part and the element separation section being provided as a light-shielding section.
8. Modification Example of Sixth Embodiment
   An example of a solid-state imaging device further including an additional light-shielding section.
9. Modification Example of Sixth Embodiment
   An example of a solid-state imaging device further including a vertical light-shielding part.
10. Modification Example of Sixth Embodiment
   An example of a solid-state imaging device having a three-dimensional structure.
11. Example of Application to Electronic Apparatus
12. Example of Application to Mobile Body
13. Other Modification Examples

1. First Embodiment

[Configuration of Solid-State Imaging Device 101]

Figure 1:
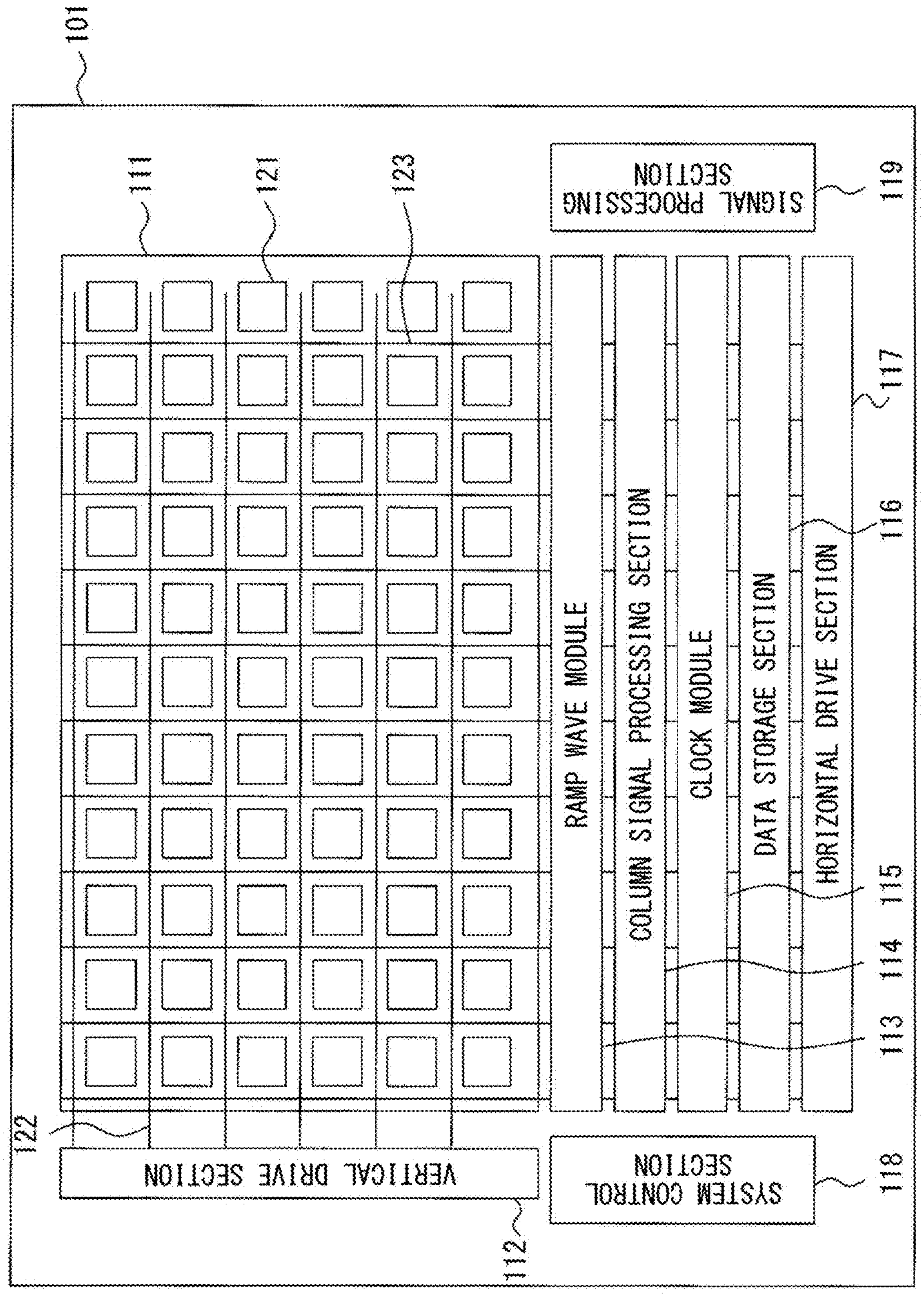
FIG. 1 is a block diagram illustrating an configuration example of a function of an imaging device according to a first embodiment of the present disclosure.

FIG. 1 is a block diagram illustrating a functional configuration example of a solid-state imaging device 101 according to a first embodiment of the present technology.

The solid-state imaging device 101 is, for example, a backside illumination type image sensor of a so-called global shutter system, such as a CMOS (Complementary Metal Oxide Semiconductor) image sensor. The solid-state imaging device 101 receives light from a subject and performs photoelectric conversion to generate an image signal, thereby capturing an image.

The global shutter system is a system in which global exposure is performed, which basically starts exposure simultaneously for all pixels and finishes the exposure simultaneously for all the pixels. As used herein, all the pixels refer to all of pixels of a portion appearing in an image, and exclude a dummy pixel, or the like. In addition, the global shutter system also includes a system in which a region where global exposure is performed is moved while performing global exposure in a unit of a plurality of rows (e.g., several tens of rows) instead of all pixels simultaneously when a time difference or an image distortion is small enough to be unproblematic. In addition, the global shutter system also includes a system in which global exposure is performed on pixels of a predetermined region, instead of all of the pixels of the portion appearing in the image.

The backside illumination type image sensor refers to an image sensor having a configuration in which a photoelectric conversion section such as a photodiode that receives light from a subject and converts the light into an electric signal is provided between a light-receiving surface on which light from the subject is incident and a wiring layer provided with a wiring line of a transistor, etc. that drives each pixel. It is to be noted that the present technology is not limited to the application to the CMOS image sensor.

The solid-state imaging device 101 includes, for example, a pixel array section 111, a vertical drive section 112, a ramp wave module 113, a column signal processing section 114, a clock module 115, a data storage section 116, a horizontal drive section 117, a system control section 118, and a signal processing section 119.

In the solid-state imaging device 101, the pixel array section 111 is formed on a semiconductor substrate 11 (described later). A peripheral circuit, such as the vertical drive section 112 to the signal processing section 119, is formed, for example, on the same semiconductor substrate 11 as the pixel array section 111.

The pixel array section 111 includes a plurality of sensor pixels 121 each including a photoelectric conversion element that generates and accumulates charges corresponding to an amount of light incident from the subject. As illustrated in FIG. 1, the sensor pixels 121 are arranged in each of a horizontal direction (row direction) and a vertical direction (column direction). In the pixel array section 111, pixel drive lines 122 are wired along the row direction for each pixel row including the sensor pixels 121 arranged in line in the row direction, whereas vertical signal lines 123 are wired along the column direction for each pixel column including the sensor pixels 121 arranged in line in the column direction.

The vertical drive section 112 includes a shift register, an address decoder, and the like. The vertical drive section 112 supplies respective signals or the like to the plurality of sensor pixels 121 via the plurality of pixel drive lines 122, to thereby drive all of the plurality of sensor pixels 121 in the pixel array section 111 simultaneously or in a unit of pixel rows.

The ramp wave module 113 generates a ramp wave signal to be used for A/D (Analog/Digital) conversion of a pixel signal, and supplies the generated ramp wave signal to the column signal processing section 114. The column signal processing section 114 includes, for example, a shift register, an address decoder, and the like, and performs noise cancellation processing, correlation double sampling processing, A/D conversion processing, or the like to generate a pixel signal. The column signal processing section 114 supplies the generated pixel signal to the signal processing section 119.

The clock module 115 supplies a clock signal for operation to each section of the solid-state imaging device 101.

The horizontal drive section 117 sequentially selects a unit circuit corresponding to a pixel column of the column signal processing section 114. As a result of selective scanning by the horizontal drive section 117, a pixel signal having undergone signal processing for each unit circuit in the column signal processing section 114 is sequentially outputted to the signal processing section 119.

The system control section 118 includes a timing generator or the like that generates various timing signals. On the basis of timing signals generated by the timing generator, the system control section 118 performs drive control of the vertical drive section 112, the ramp wave module 113, the column signal processing section 114, the clock module 115, and the horizontal drive section 117.

The signal processing section 119 performs signal processing such as arithmetic processing on the pixel signal supplied from the column signal processing section 114 while temporarily storing data in the data storage section 116 as necessary, and outputs an image signal including each pixel signal.

[Configuration of Sensor Pixel 121]

Figure 2:
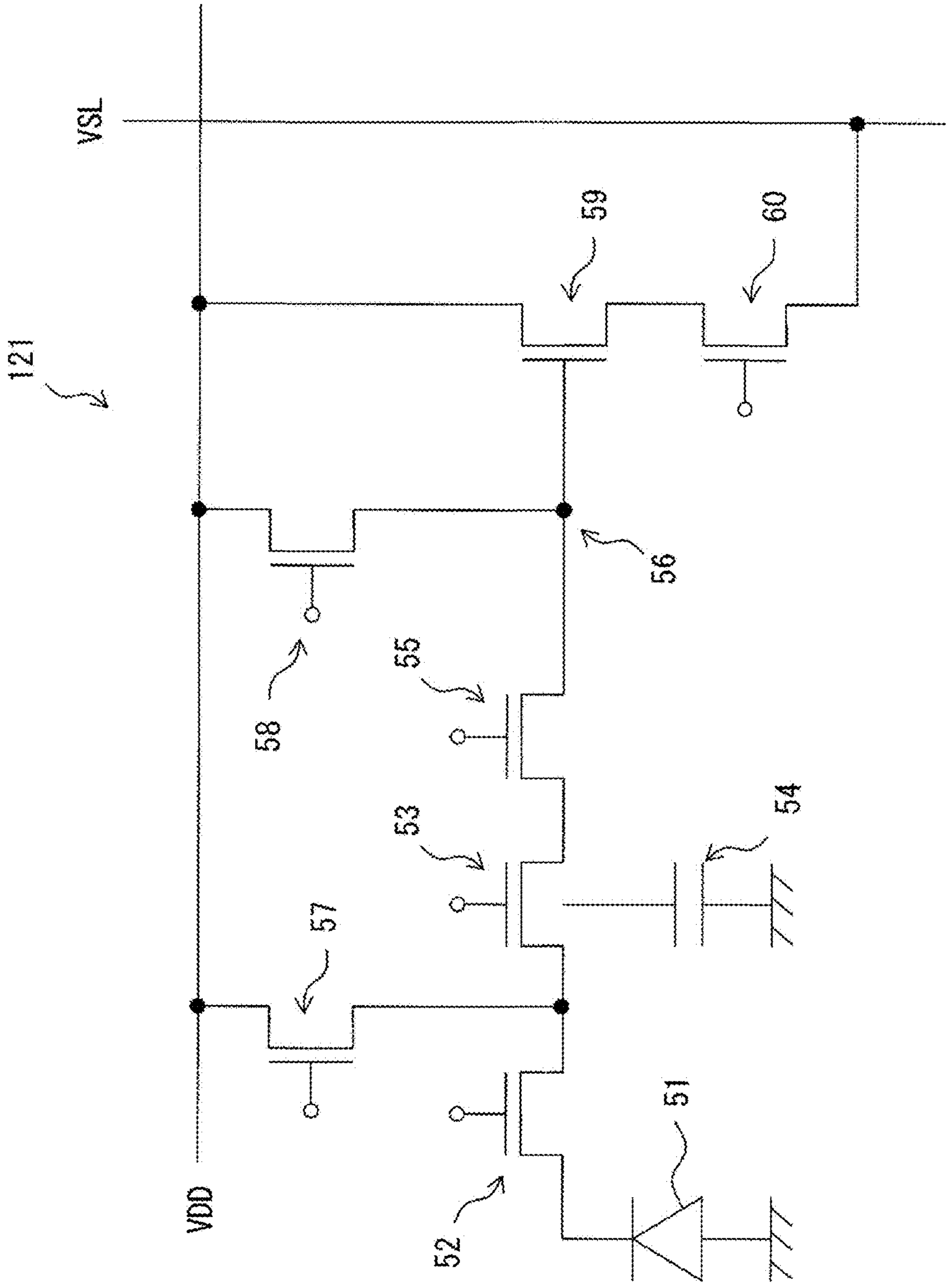
FIG. 2 is a circuit diagram illustrating a circuit configuration of one sensor pixel in the imaging device illustrated in FIG. 1.

Next, description is given, with reference to FIG. 2, of a circuit configuration example of the sensor pixel 121 formed in the pixel array section 111 in FIG. 1. FIG. 2 illustrates a circuit configuration example of one sensor pixel 121 of the pixel array section 111.

In the example of FIG. 2, the sensor pixel 121 in the pixel array section 111 includes a photoelectric conversion section 51, a first transfer transistor (TRX) 52, a second transfer transistor (TRM) 53, a charge-holding section (MEM) 54, a third transfer transistor (TRG) 55, a charge-voltage converting section (FD) 56, a discharge transistor (OFG) 57, a reset transistor (RST) 58, an amplification transistor (AMP) 59, and a selection transistor (SEL) 60.

In addition, in this example, the TRX 52, the TRM 53, the TRG 55, the OFG 57, the RST 58, the AMP 59 and the SEL 60 are each an N type MOS transistor. Drive signals S52, S53, S55, S57, S58, and S60 are supplied to respective gate electrodes of the TRX 52, the TRM 53, the TRG 55, the OFG 57, the RST 58 and the SEL 60, respectively. The drive signal S52, S53, S55, S57, S58, and S60 are each a pulse signal in which a high level state is an active state (ON state) and a low level state is a non-active state (OFF state). It is to be noted that, hereinafter, bringing a drive signal into an active state is also referred to as turning a drive signal ON, and bringing a drive signal into a non-active state is also referred to as turning a drive signal OFF.

The photoelectric conversion section 51 is, for example, a photoelectric conversion element including a P-N junction photodiode, and receives light from a subject, and generates and accumulates charges corresponding to an amount of the light reception by means of photoelectric conversion.

The TRX 52 is coupled between the photoelectric conversion section 51 and the TRM 53, and transfers charges accumulated in the photoelectric conversion section 51 to the MEM 54 in response to the drive signal S52 applied to the gate electrode of the TRX 52.

The TRM 53 controls a potential of the MEM 54 in response to the drive signal S53 to be applied to the gate electrode of the TRM 53. For example, when the drive signal S53 is turned ON and the TRM 53 is turned ON, the potential of the MEM 54 is deepened. In addition, when the S53 is turned OFF and the TRM 53 is turned OFF, the potential of the MEM 54 becomes shallow. When the drive signal S52 and the drive signal the S53 are turned ON and the TRX 52 and the TRM 53 are turned ON, charges accumulated in the photoelectric conversion section 51 are transferred to the MEM 54 via the TRX 52 and the TRM 53.

The MEM 54 is a region that temporarily holds charges accumulated in the photoelectric conversion section 51 in order to achieve the global shutter function.

The TRG 55 is coupled between the TRM 53 and the FD 56, and transfers the charges held in the MEM 54 to the FD 56 in response to the drive signal S55 to be applied to the gate electrode of the TRG 55. For example, when the drive signal S53 is turned OFF; the TRM 53 is turned OFF; the drive signal S55 is turned ON; and the TRG 55 is turned ON, the charges held in the MEM 54 are transferred to the FD 56 via the TRM 53 and the TRG 55.

The FD 56 is a floating diffusion region that converts the charges transferred from the MEM 54 via the TRG 55 into an electric signal (e.g., a voltage signal) to be outputted. The RST 58 is coupled to the FD 56, and a vertical signal line VSL is coupled to the FD 56 via the AMP 59 and the SEL 60.

The OFG 57 has a drain coupled to a power source VDD and a source coupled to a wiring line between the TRX 52 and the TRM 53. In response to the drive signal S57 to be applied to a gate electrode of the OFG 57, the OFG 57 initializes or resets the photoelectric conversion section 51. For example, when the drive signal S52 and the drive signal S57 are turned ON and the TRX 52 and the OFG 57 are turned ON, a potential of the photoelectric conversion section 51 is reset to a voltage level of the power source VDD. That is, the photoelectric conversion section 51 is initialized.

In addition, the OFG 57 forms an overflow path between the TRX 52 and the power source VDD, and discharges charges overflowed from the photoelectric conversion section 51 to the power source VDD.

The RST 58 has a drain coupled to the power source VDD and a source coupled to the FD 56. In response to the drive signal S58 to be applied to a gate electrode of the RST 58, the RST 58 initializes, i.e., resets each region from the MEM 54 to the FD 56. For example, when the drive signal S55 and the drive signal S58 are turned ON and the TRG 55 and the RST 58 are turned ON, potentials of the MEM 54 and the FD 56 are reset to the voltage level of the power source VDD. That is, the MEM 54 and the FD 56 are initialized.

The AMP 59 has a gate electrode coupled to the FD 56 and a drain coupled to the power source VDD, and serves as an input section of a source follower circuit that reads the charges obtained by photoelectric conversion at the photoelectric conversion section 51. That is, a source of the AMP 59 is coupled to the vertical signal line VSL via the SEL 60 to thereby cause the AMP 59 to configure a source follower circuit together with a constant current source coupled to one end of the vertical signal line VSL.

The SEL 60 is coupled between the source of the AMP 59 and the vertical signal line VSL, and the gate electrode of the SEL 60 is supplied with the drive signal S60 as a selection signal. When the drive signal S60 is turned ON, the SEL 60 is brought into a conductive state, and the sensor pixel 121 provided with the SEL 60 is brought into a selected state. When the sensor pixel 121 is in the selected state, a pixel signal outputted from the AMP 59 is read by the column signal processing section 114 via the vertical signal line VSL.

In addition, in the pixel array section 111, the plurality of pixel drive lines 122 are wired for respective pixel rows, for example. Then, the drive signals S52, S53, S55, S57, S58, and S60 are supplied to selected sensor pixels 121 from the vertical drive section 112 through the plurality of pixel drive lines 122.

It is to be noted that a pixel circuit illustrated in FIG. 2 is an example of a pixel circuit that is able to be used in the pixel array section 111, and it is also possible to use a pixel circuit having another configuration. In addition, hereinafter, each transistor of the RST 58, the AMP 59, and the SEL 60 is referred to as a pixel transistor.

Figure 3:
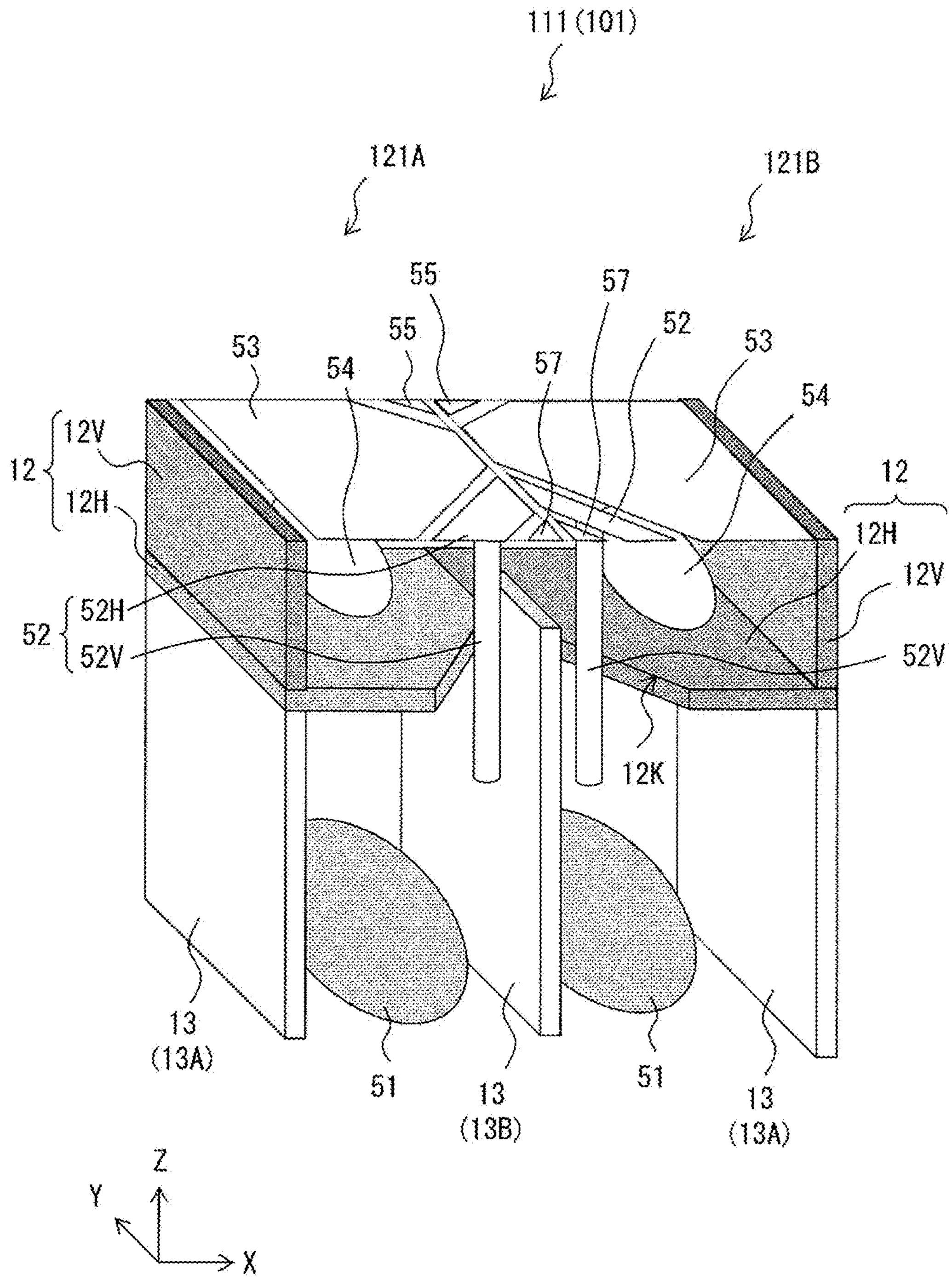
FIG. 3 is a perspective view schematically illustrating a configuration of some of sensor pixels in the imaging device illustrated in FIG. 1.
Figure 4A:
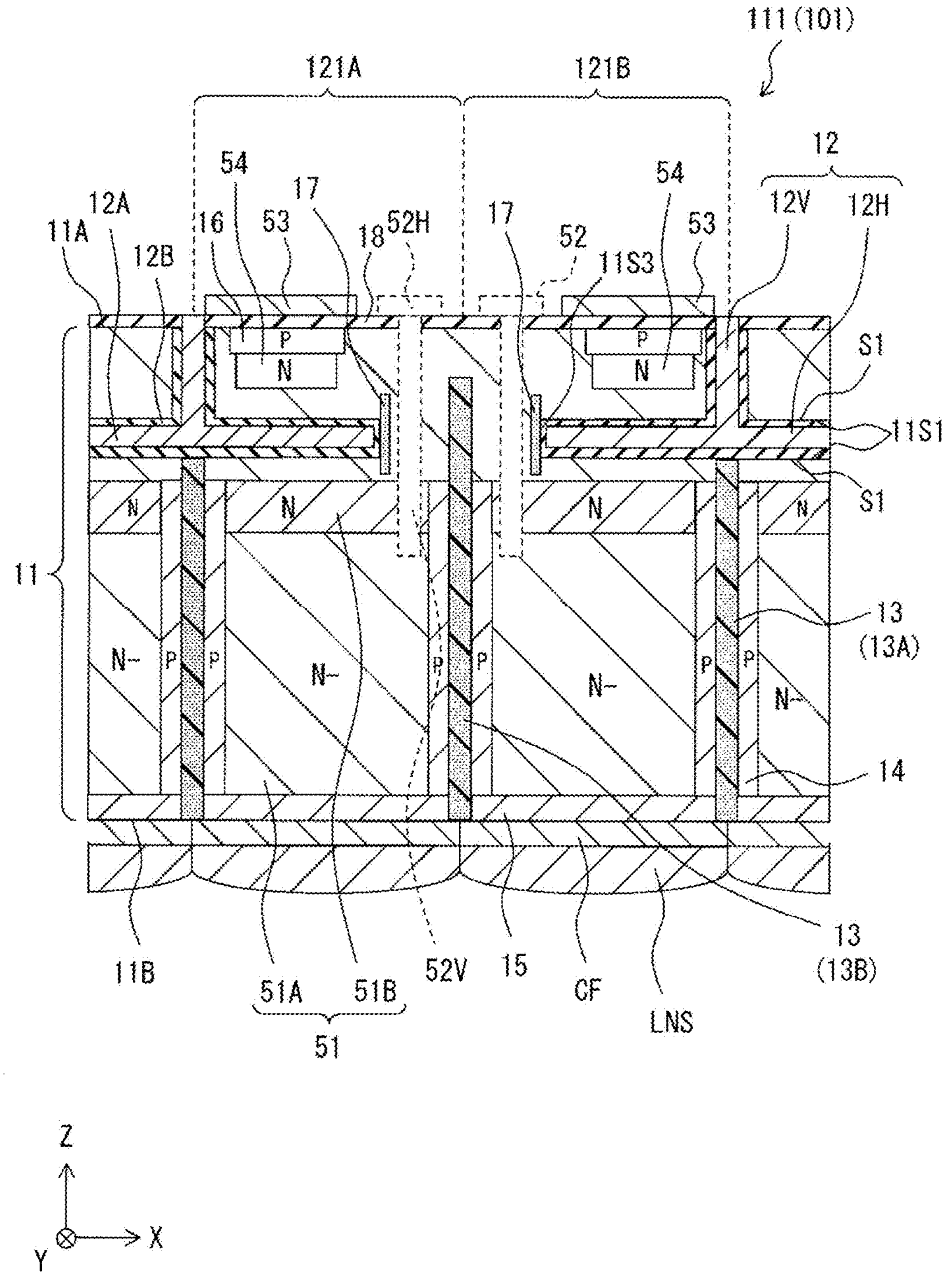
FIG. 4A is a first cross-sectional view schematically illustrating a configuration of some of the sensor pixels in the imaging device illustrated in FIG. 1.
Figure 4B:
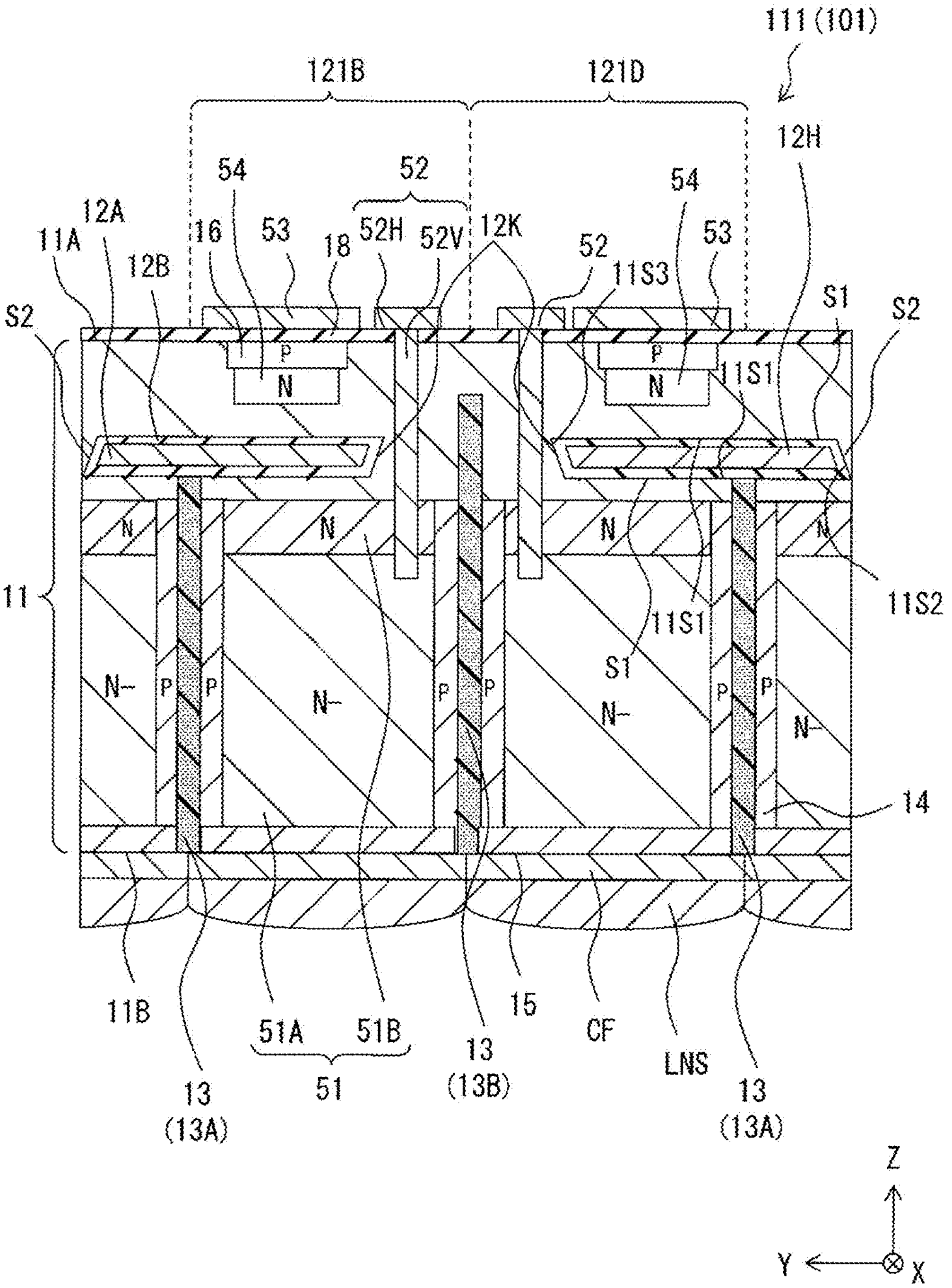
FIG. 4B is a second cross-sectional view schematically illustrating the configuration of some of the sensor pixels in the imaging device illustrated in FIG. 1.
Figure 5A:
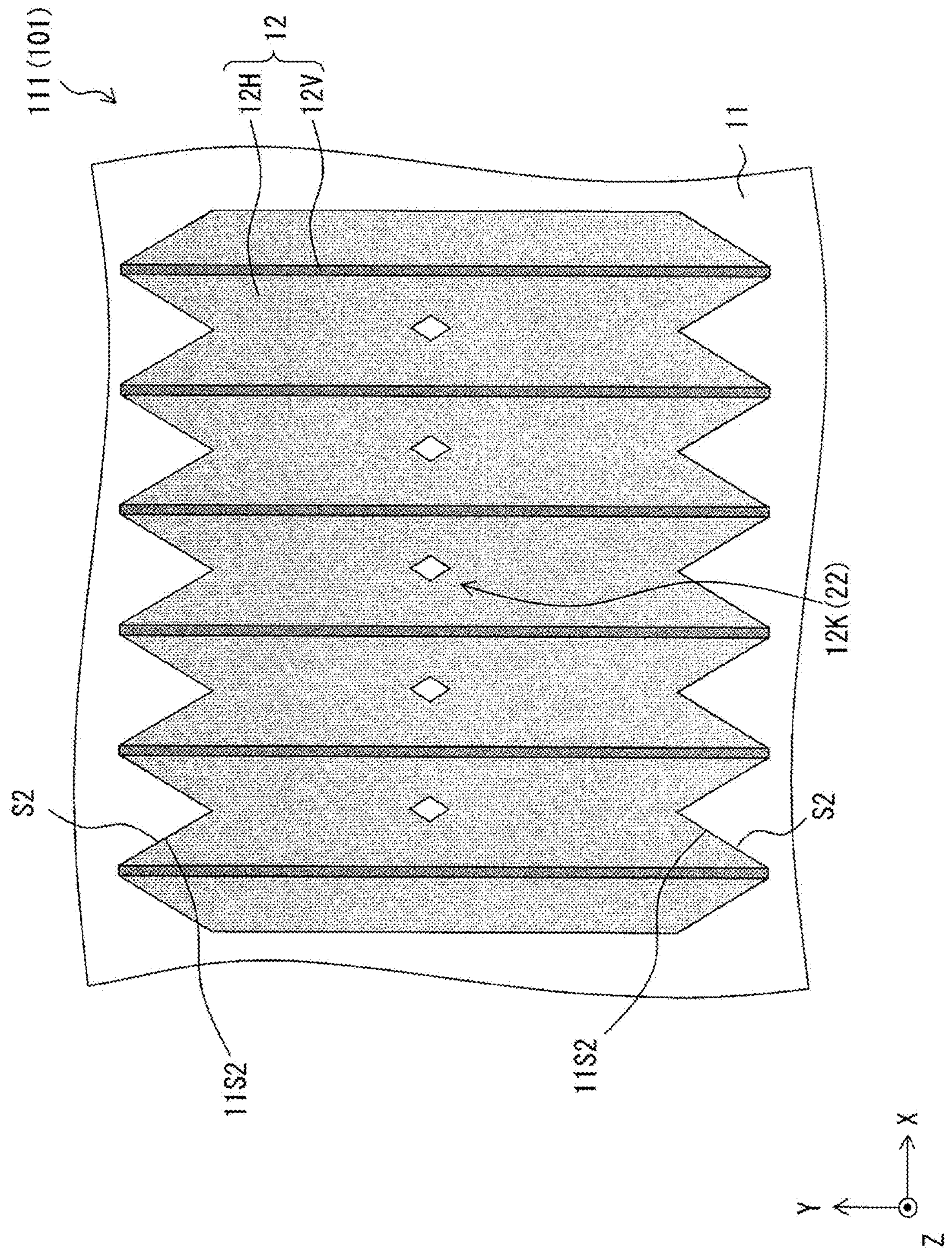
FIG. 5A is a plan view schematically illustrating an overall configuration of a pixel array section in the imaging device illustrated in FIG. 1.
Figure 5B:
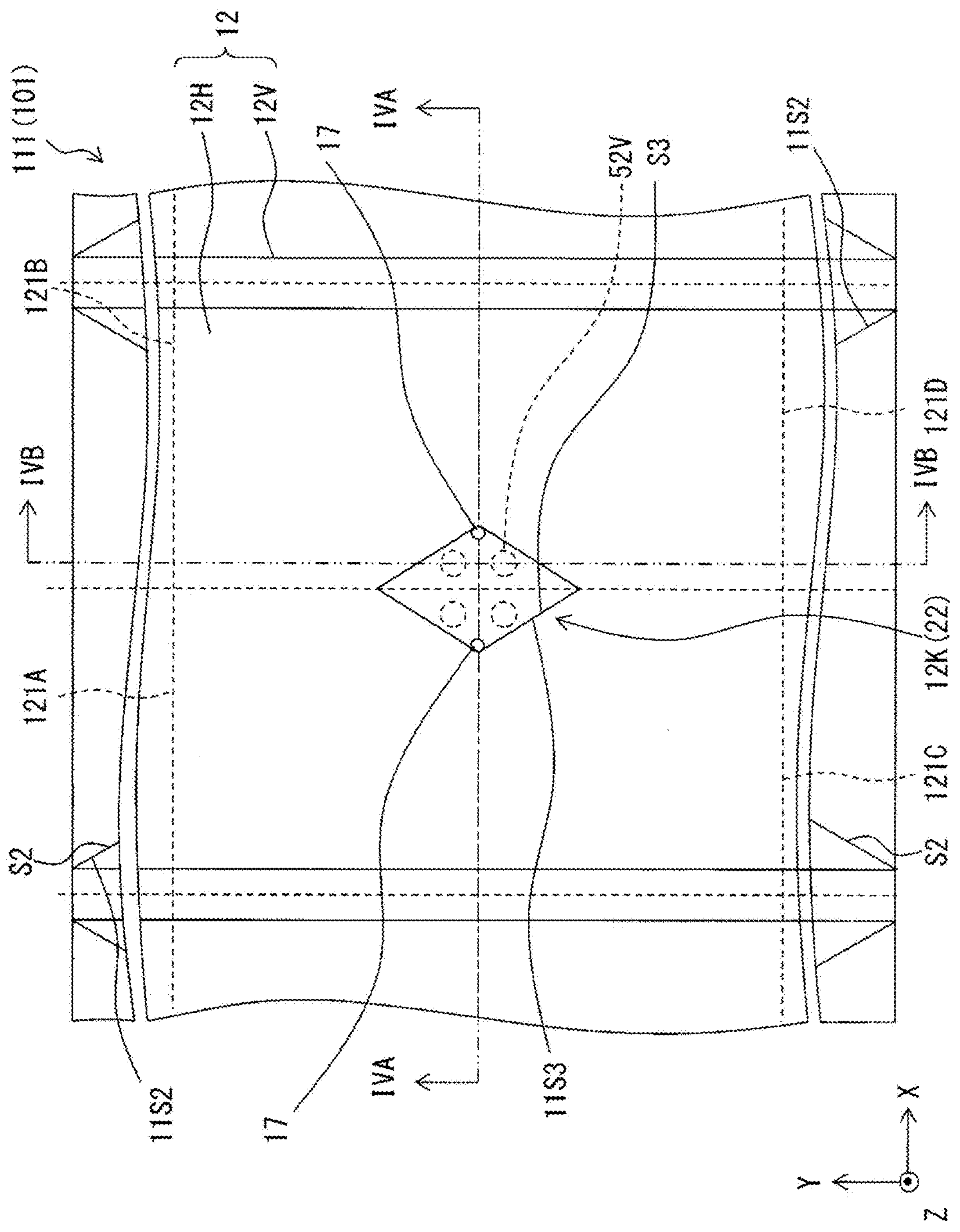
FIG. 5B is a plan view schematically illustrating, in an enlarged manner, a main part of the pixel array section illustrated in FIG. 5A.

FIG. 3 is a perspective view schematically illustrating configurations of any two adjacent sensor pixels 121A and 121B adjacent to each other in the solid-state imaging device 101. FIGS. 4A and 4B are each a cross-sectional view schematically illustrating configurations of the sensor pixels 121A and 121B. Further, FIG. 5A is a plan view schematically illustrating an overall configuration of the pixel array section 111. FIG. 5B is an enlarged plan view of a partial region of the pixel array section 111, and schematically illustrates configurations of four sensor pixels 121A to 121D adjacent to each other. It is to be noted that, in FIGS. 5A and 5B, a shape of mainly a light-shielding section 12 (described later) is indicated by a solid line, and other components are partially omitted. In addition, FIG. 4A illustrates a cross-section in a direction of an arrow along a line IVA-IVA illustrated in FIG. 5B, and FIG. 4B illustrates a cross-section in a direction of an arrow along a line IVB-IVB illustrated in FIG. 5B. FIGS. 3 to 5B illustrate one to four sensor pixels 121 of the plurality of sensor pixels 121 in the solid-state imaging device 101; other sensor pixels 121 in the solid-state imaging device 101 also have substantially the same configuration as that illustrated in FIGS. 3 to 5B. In addition, in the present specification, a plane on which the semiconductor substrate 11 extends is defined as an XY plane, and a thickness direction of the semiconductor substrate 11 is defined as a Z-axis direction.

It is to be noted that the symbols "P" and "N" in the diagram represent a P type semiconductor region and an N type semiconductor region, respectively. Further, an ending "+" and "−" in symbols of "P++", "P+", "P−", and "P−−" each represent an impurity concentration of the P type semiconductor region. Similarly, the ending "+" and "—" in symbols of "N++", "N+", "N−" and "N−−" each represent an impurity concentration of the N type semiconductor region. Here, more numbers of "+" indicates higher impurity concentration, and more numbers of "—" indicate lower impurity concentration. The same applies to the drawings as described hereinafter.

The solid-state imaging device 101 includes the semiconductor substrate 11, the photoelectric conversion section 51 embedded in the semiconductor substrate 11, the TRX 52, the TRM 53, the MEM 54, the TRG 55, the OFG 57, the light-shielding section 12, an element separation section 13, an etching stopper 17, a color filter CF, and a light-receiving lens LNS. It is to be noted that, in the solid-state imaging device 101, a back surface 11B (FIGS. 4A and 4B) serves as the light-receiving surface.

The semiconductor substrate 11 includes, for example, an Si {111} substrate. The Si {111} substrate refers to a single-crystal silicon substrate having a crystal orientation of {111}. The semiconductor substrate 11 includes the back surface 11B which is a light-receiving surface for receiving light from a subject transmitted through the light-receiving lens LNS and the color filter CF, and a front surface 11A on side opposite to the back surface 11B.

The photoelectric conversion section 51 includes, for example, an N− type semiconductor region 51A and an N type semiconductor region 51B, in order from a position close to the back surface 11B. After light incident on the back surface 11B is photoelectrically converted to generate charges in the N− type semiconductor region 51A, the charges are accumulated in the N type semiconductor region 51B. It is to be noted that a boundary between the N− type semiconductor region 51A and the N type semiconductor region 51B is not necessarily clear; for example, it is sufficient for N type impurity concentration to be gradually increased from the N− type semiconductor region 51A toward the N type semiconductor region 51B.

The light-shielding section 12 is a member that functions to hinder light from being incident on the MEM 54, and is provided to surround the MEM 54. Specifically, the light-shielding section 12 includes, for example, a horizontal light-shielding part 12H that is provided on side opposite to the back surface 11B of the semiconductor substrate 11 as viewed from the photoelectric conversion section 51 and extends along a horizontal plane (XY plane), and a vertical light-shielding part 12V that extends along a YZ plane to be orthogonal to the horizontal light-shielding part 12H. As illustrated in FIG. 5B, the vertical light-shielding part 12V is a wall part that is provided at a boundary part between the sensor pixels 121 adjacent to each other in an X-direction in a plan view, and extends in a Y-direction. The vertical light-shielding part 12V is exposed to the front surface 11A of the Si {111} substrate. In addition, as illustrated in FIG. 4, the horizontal light-shielding part 12H is positioned between the photoelectric conversion section 51 and the MEM 54 in the Z-axis direction, and, as illustrated in FIGS. 5A and 5B, the horizontal light-shielding part 12H is provided across the entire XY plane in the pixel array section 111 except an opening 12K. Light incident from the back surface 11B and transmitted through the photoelectric conversion section 51 without being absorbed by the photoelectric conversion section 51 is reflected at the horizontal light-shielding part 12H of the light-shielding section 12, and is incident on the photoelectric conversion section 51 again. That is, the horizontal light-shielding part 12H of the light-shielding section 12 functions as a reflector, and functions to suppress generation of a noise due to incidence of light transmitted through the photoelectric conversion section 51 on the MEM 54. In addition, the vertical light-shielding part 12V of the light-shielding section 12 functions to prevent generation of a noise such as color mixture due to incidence of leakage light from a neighboring sensor pixel 121 on the photoelectric conversion section 51.

Further, the horizontal light-shielding part 12H includes a pair of first planes 51, a pair of second planes S2, and a third plane S3. The pair of first planes 51 are each a plane along a first crystal plane 11S1 of the semiconductor substrate 11, and are opposed to each other in the Z-axis direction (see FIGS. 4A and 4B). It is to be noted that the first crystal plane 11S1 in the semiconductor substrate 11 is represented by a plane index {111}. In addition, the pair of second planes S2 are each a plane along a second crystal plane 1152 of the semiconductor substrate 11, and are positioned at both ends of the pixel array section 111 in a Y-axis direction (see FIG. 4B). The second crystal plane 1152 of the semiconductor substrate is not located in an effective pixel region, but in a peripheral pixel region surrounding the effective pixel region. For example, in FIG. 4B, the sensor pixel 121B and the sensor pixel 121D form the effective pixel region, and the outside thereof constitutes the peripheral pixel region. It is to be noted that the second crystal plane 11S2 in the semiconductor substrate 11 is represented by the plane index {111}, and is inclined by about 19.5° relative to the Z-axis direction. That is, the inclination angle of the second crystal plane 11S2 relative to the horizontal plane (XY plane) is about 70.5°. In addition, as illustrated in FIGS. 5A and 5B, the second crystal plane 11S2 is inclined relative to the X-axis and the Y-axis in the horizontal plane (XY plane), and forms an angle of, for example, about 30° relative to the Y-axis. Further, the third plane S3 is, for example, a plane defining the contour of the opening 12K having a rhombic planar shape, and is a plane along a third crystal plane 1153 of the semiconductor substrate 11. Similarly to the second crystal plane 11S2, the third crystal plane 11S3 of the semiconductor substrate 11 is inclined by about 19.5° relative to the Z-axis direction. That is, the inclination angle of the third crystal plane 11S3 relative to the horizontal plane (XY plane) is about 70.5°. In this manner, an Si-remaining region 22 other than a region occupied by the horizontal light-shielding part 12H in a horizontal plane orthogonal to the thickness direction forms an island shape, and forms a rhombic shape in the example of FIGS. 5A and 5B.

In addition, the light-shielding section 12 has a two-layer structure of an inner layer part 12A and an outer layer part 12B surrounding the periphery thereof. The inner layer part 12A includes, for example, a material having a light-shielding property including at least one of a single metal, a metal alloy, a metal nitride, or a metal silicide. More specifically, examples of a constituent material of the inner layer part 12A include Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), and a tungsten silicon compound. Among those, Al (aluminum) is the most optically preferable material. It is to be noted that the inner layer part 12A may be configured by graphite or an organic material. The outer layer part 12B is configured by, for example, an insulating material such as SiOx (silicon oxide). The outer layer part 12B secures an electric insulation property between the inner layer part 12A and the semiconductor substrate 11.

The element separation section 13 is a wall-like member that extends, at a boundary position between the sensor pixels 121 adjacent to each other, in the Z-axis direction to penetrate the semiconductor substrate 11, and surrounds each photoelectric conversion section 51. The element separation section 13 allows the sensor pixels 121 adjacent to each other to be electrically separated. The element separation section 13 is configured by, for example, an insulating material such as silicon oxide. It is to be noted that, in FIG. 3 and FIGS. 4A and 4B, out of the element separation sections 13, the one provided at a position corresponding to the vertical light-shielding part 12V in the Z-axis direction is denoted by an element separation section 13A, whereas the one including a portion at a position corresponding to the opening 12K in the Z-axis direction is denoted by an element separation section 13B. The element separation section 13A abuts with the horizontal light-shielding part 12H, for example. Meanwhile, a portion of the element separation section 13B penetrates the opening 12K in the Z-axis direction to protrude toward side of the front surface 11A beyond the horizontal light-shielding part 12H.

The etching stopper 17 is provided at both ends of the opening 12K in an X-axis direction. The etching stopper 17 has a function of inhibiting progress of etching upon formation of the horizontal light-shielding part 12H by wet etching processing. The etching stopper 17 exhibits, for example, etching resistance to an etching solution that is able to perform etching in a <110> direction of the semiconductor substrate 11, for example, to an alkaline aqueous solution. It is possible to use, as the etching stopper 17, for example, an impurity element such as B (boron), a crystal defect structure having undergone hydrogen ion implantation, an insulator such as an oxide, or the like.

Each gate electrode in the TRX 52, the TRM 53, the TRG 55, and the OFG 57 are each provided on the front surface 11A of the semiconductor substrate 11, with an insulating layer 18 interposed therebetween. In addition, the MEM 54, which is the N type semiconductor region, is embedded in the semiconductor substrate 11, and is disposed between the front surface 11A and the horizontal light-shielding part 12H. Further, a P type semiconductor region 16 is provided between MRM 54 and the front surface 11A.

The TRX 52 includes, as gate electrodes, a horizontal terminal section 52H and a vertical terminal section 52V. The horizontal terminal section 52H is provided on the front surface 11A of the semiconductor substrate 11. The vertical terminal section 52V extends along the Z-axis direction from the horizontal terminal section 52H downward, and penetrates the opening 12K and the N type semiconductor region 51B sequentially to reach the inside of the N− type semiconductor region 51A. The vertical terminal section 52V is provided in the Si-remaining region 22 other than the region occupied by the horizontal light-shielding part 12H (region corresponding to the opening 12K) in the horizontal plane. The TRX 52 is a component through which charges travel from the photoelectric conversion section 51 to the MEM 54.

The solid-state imaging device 101 further includes a P type semiconductor region 14 provided along a side surface of the element separation section 13 between the element separation section 13 and the photoelectric conversion section 51. The solid-state imaging device 101 further includes a fixed-charge film 15 provided between the photoelectric conversion section 51 and the back surface 11B. The fixed-charge film 15 is exposed to the back surface 11B. The fixed-charge film 15 has negative fixed charges in order to suppress generation of a dark current caused by an interface state of the back surface 11B, which is the light-receiving surface of the semiconductor substrate 11. An electric field induced by the fixed-charge film 15 causes a hole accumulation layer to be formed in the vicinity of the back surface 11B of the semiconductor substrate 11. The hole accumulation layers suppress generation of electrons from the back surface 11B.

The color filter CF is provided to be in contact with the fixed-charge film 15. The light-receiving lens LNS is positioned on side opposite to the fixed-charge film 15 as viewed from the color filter CF, and is provided to be in contact with the color filter CF.

[Method of Manufacturing Solid-State Imaging Device 101]

Next, description is given, with reference to FIGS. 6A to 6I, of an example of the method of manufacturing the solid-state imaging device 101. It is to be noted that description is given here mainly of a step of forming the light-shielding section 12.

Figure 6A:
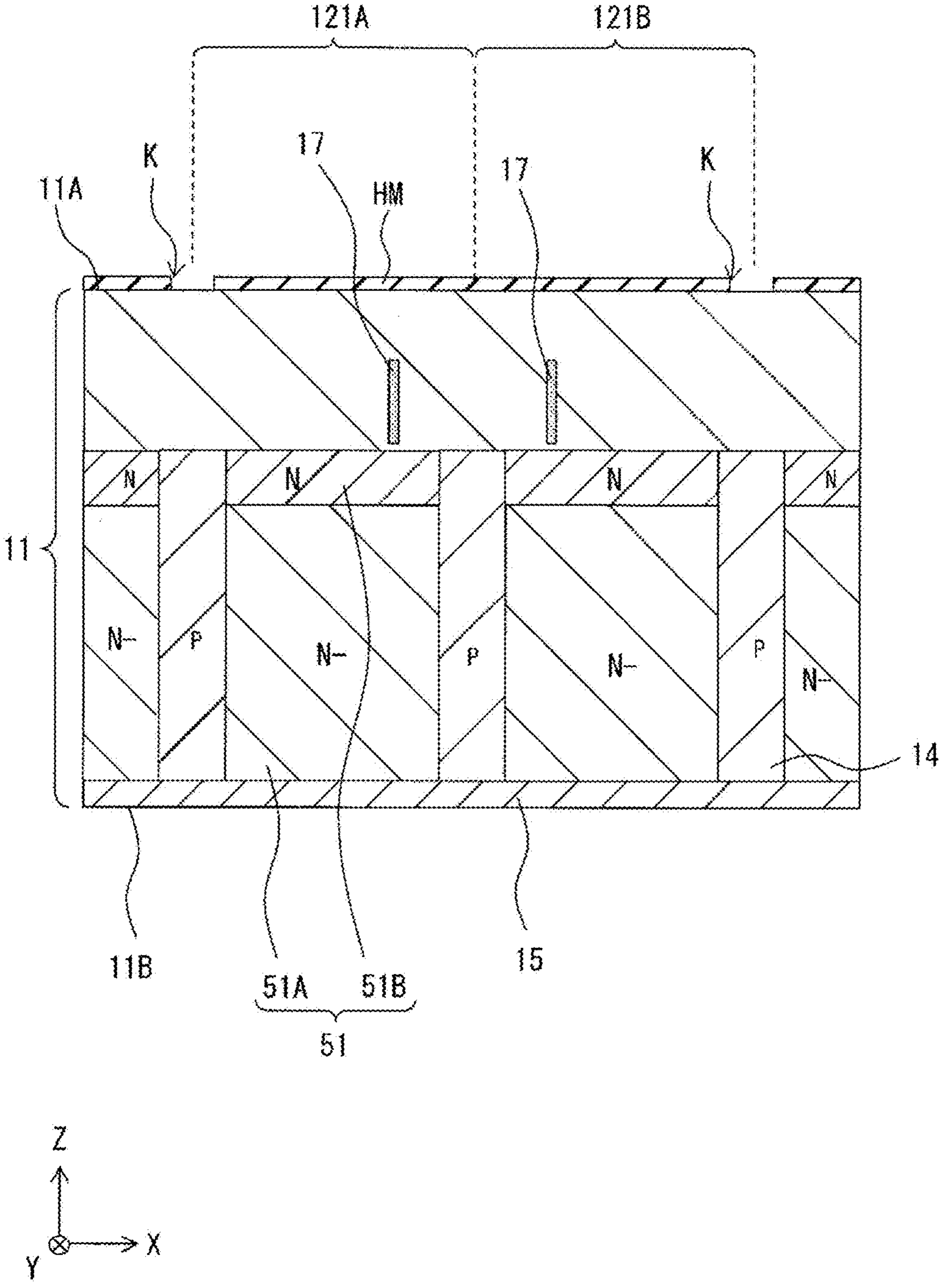
FIG. 6A is a cross-sectional view of one step in a method of manufacturing the imaging device illustrated in FIG. 1.

First, as illustrated in FIG. 6A, the semiconductor substrate 11 is prepared, in which the photoelectric conversion section 51, the P type semiconductor region 14, the fixed-charge film 15, and the etching stopper 17 are formed at respective predetermined positions, and then a hard mask HM selectively covering the front surface 11A is formed. The hard mask HM has an opening K at a position where the vertical light-shielding part 12V of the light-shielding section 12 is to be formed, and the hard mask HM includes, for example, an insulating material such as SiN (silicon nitride) and $SiO_2$ (silicon oxide). It is to be noted that the etching stopper 17 is formed, for example, by forming a trench having a predetermined depth from the front surface 11A of the semiconductor substrate 11 at a predetermined position, and then filling the trench with an insulator such as an oxide.

Figure 6B:
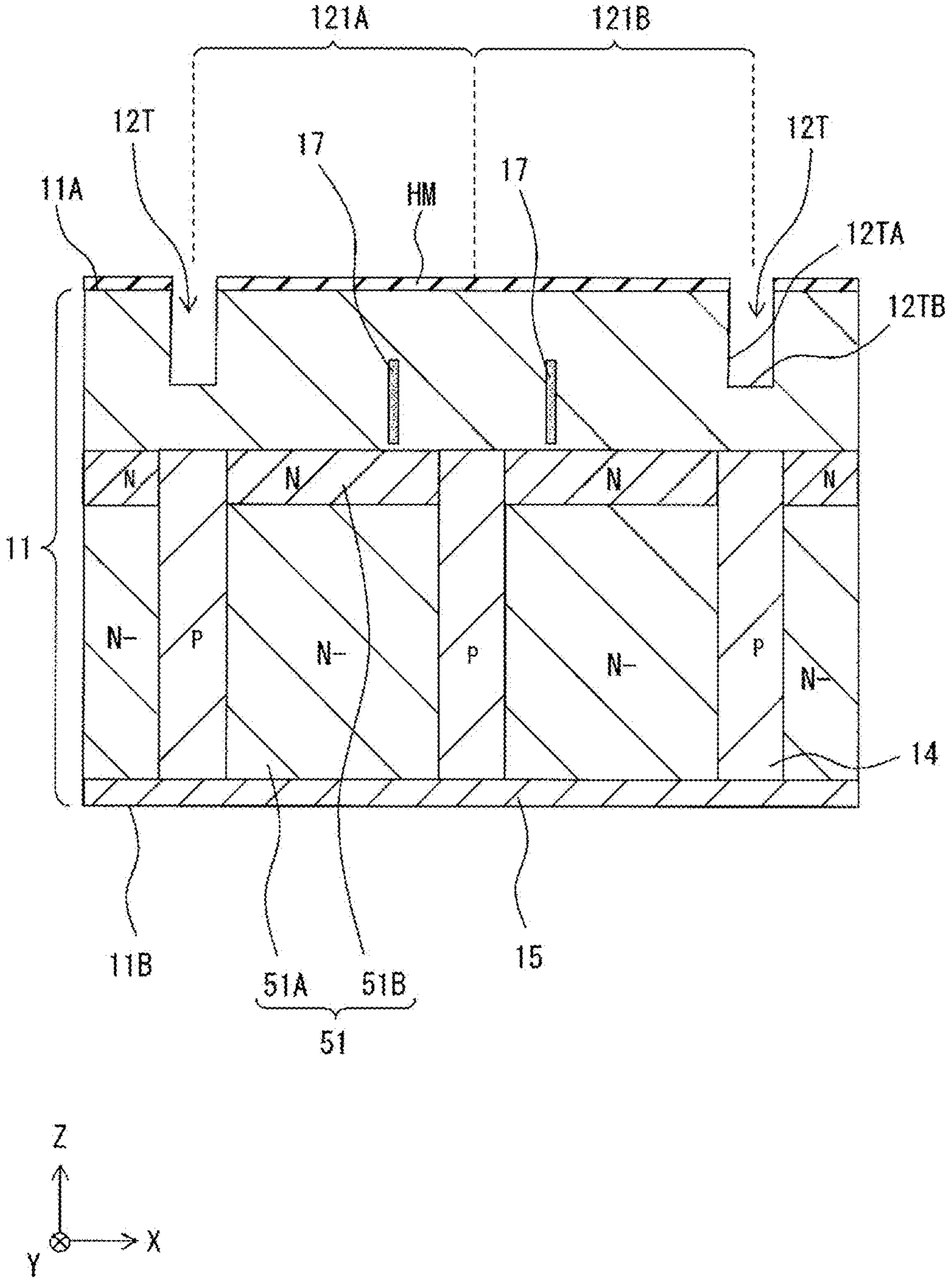
FIG. 6B is a cross-sectional view of one step subsequent to FIG. 6A.

Next, as illustrated in FIG. 6B, dry etching utilizing the hard mask HM is used to thereby dig down an exposed part at the opening K of the Si {111} constituting the semiconductor substrate 11, thereby forming a trench 12T at a position where the vertical light-shielding part 12V is to be formed. The depth of the trench 12T at this time corresponds to a dimension in the Z-axis direction of the vertical light-shielding part 12V to be formed subsequently. It is to be noted that, when carrying out wet etching on the semiconductor substrate 11 described later, the etching processing progresses slightly also in a <111> direction, an thus it is better to adjust the depth of the trench 12T in consideration thereof.

Figure 6C:
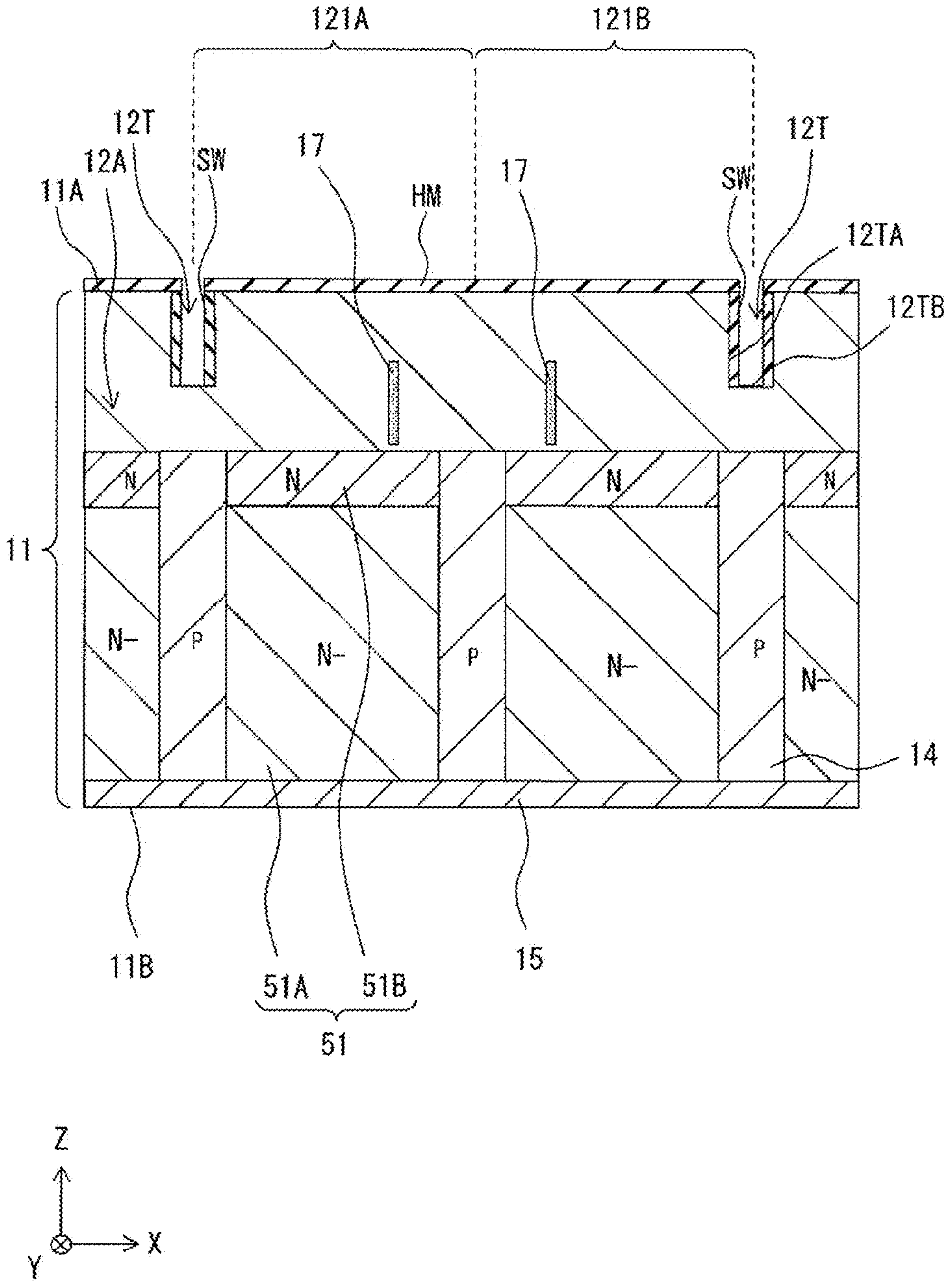
FIG. 6C is a cross-sectional view of one step subsequent to FIG. 6B.

Subsequently, as illustrated in FIG. 6C, a sidewall SW is formed to cover a side surface and a bottom surface of the trench 12T. When forming the sidewall SW, for example, an insulating film including SiN, $SiO_2$, or the like is formed to cover an inner surface of the trench 12T, i.e., a side surface 12TA and a bottom surface 12TB of the trench 12T, and then only the insulating film covering the bottom surface 12TB of the trench 12T is removed by dry etchback. At this time, in order for the hard mask HM selectively covering the front surface 11A to remain without being removed by dry etchback, it is better to use, as a constituent material of the sidewall SW, the one different from the constituent material of the hard mask HM.

Figure 6D:
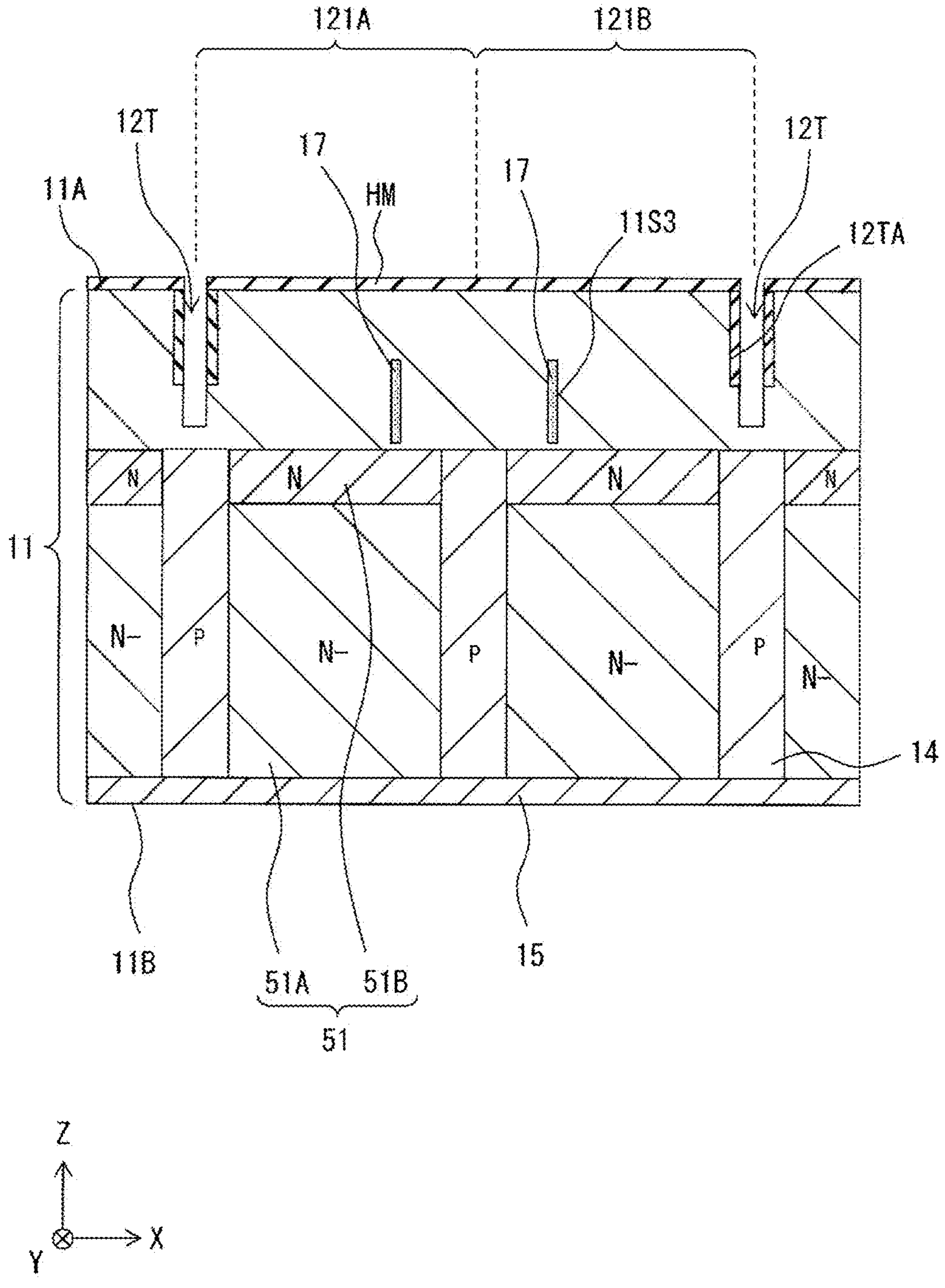
FIG. 6D is a cross-sectional view of one step subsequent to FIG. 6C.

Subsequently, as illustrated in FIG. 6D, the Si {111} constituting the semiconductor substrate 11 is partially removed by dry etchback to further dig down the bottom surface 12TB of the trench 12T as necessary. At this time, for example, the bottom surface 12TB is further dug down by a depth corresponding to the thickness of the horizontal light-shielding part 12H. Also in this case, when carrying out wet etching on the semiconductor substrate 11 described later, the etching processing progresses slightly also in the <111> direction, and thus it is better to adjust the digging depth from the bottom surface 12TB of the trench 12T in consideration thereof. It is to be noted that this processing may not be carried out.

Figure 6E:
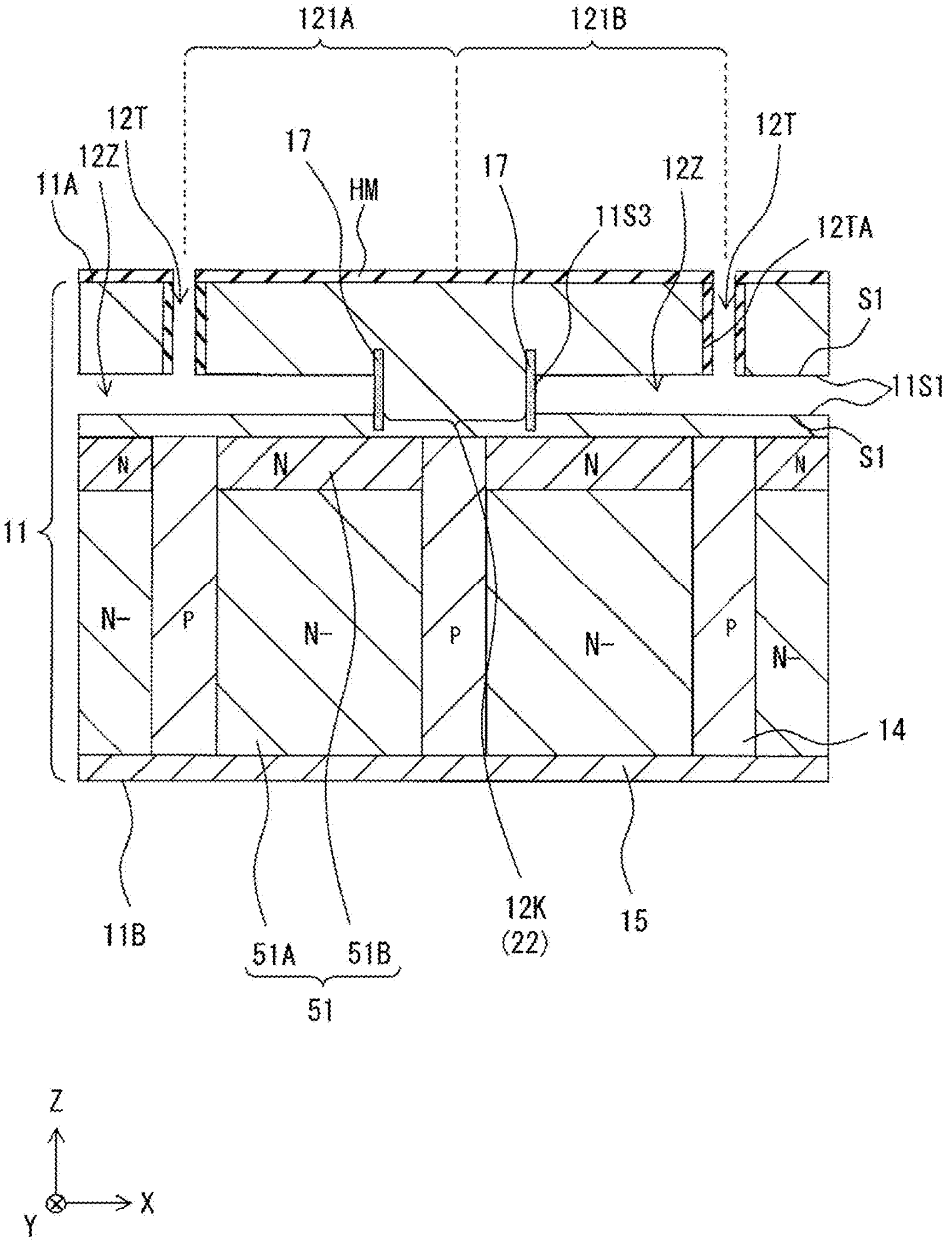
FIG. 6E is a cross-sectional view of one step subsequent to FIG. 6D.
Figure 6F:
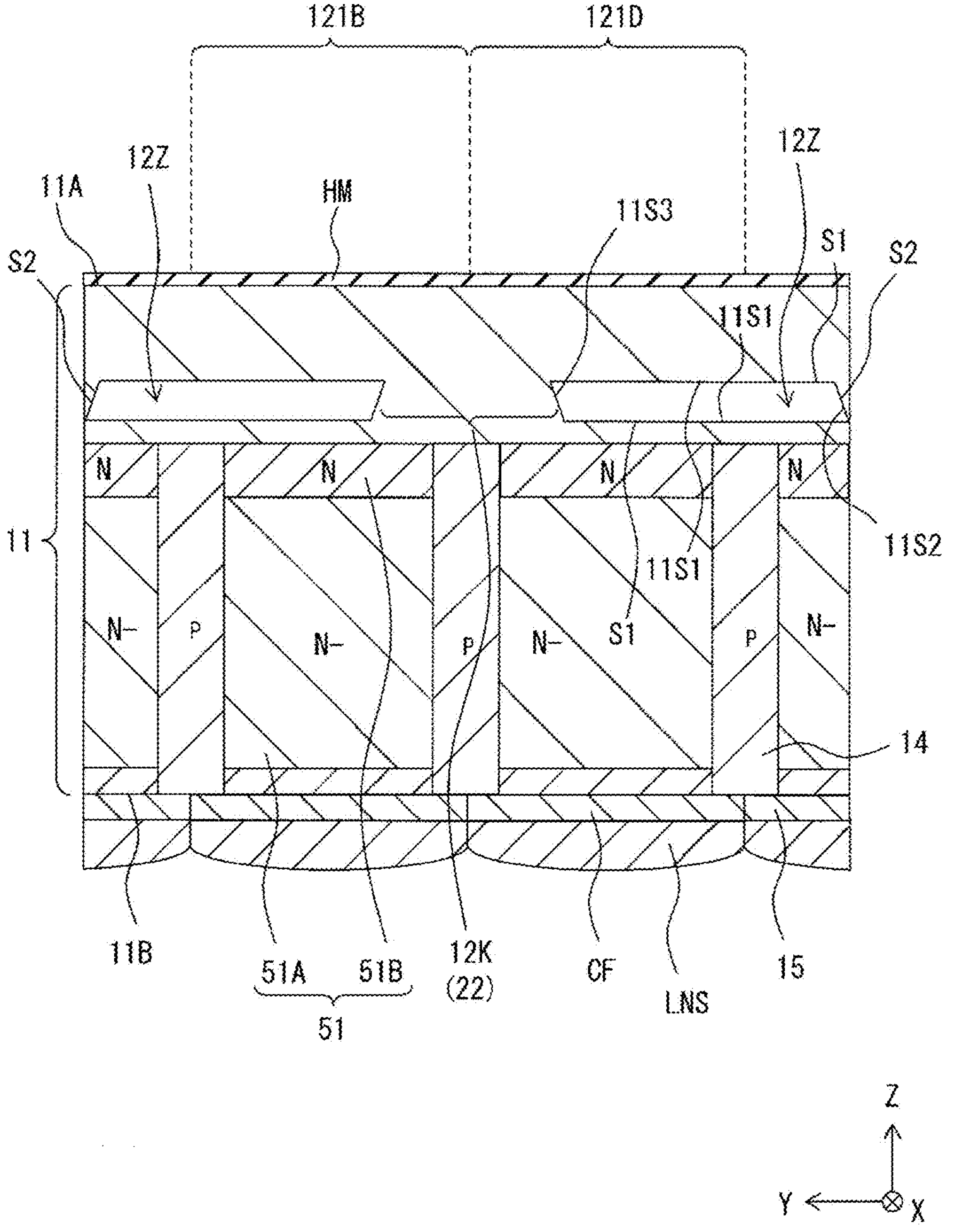
FIG. 6F is another cross-sectional view of one step subsequent to FIG. 6D.

Next, as illustrated in FIGS. 6E and 6F, a predetermined alkaline aqueous solution is injected into the trench 12T, and wet etching is performed to thereby partially remove the Si {111} constituting the semiconductor substrate 11. As the alkaline aqueous solution, KOH, NaOH, or CsOH, etc. is applicable for an inorganic solution, and EDP (ethylenediamine pyrocatechol aqueous solution), $N_2H_4$ (hydrazine), $NH_4OH$ (ammonium hydroxide), or TMAH (tetramethylammonium hydroxide), etc. is applicable for an organic solution. Here, crystalline anisotropic etching utilizing properties of different etching rates is performed depending on the plane orientation of the Si {111}. Specifically, in the Si {111} substrate, an etching rate of the <110> direction, i.e., a direction with one or two Si backbonds is sufficiently higher than an etching rate of the <111> direction, i.e., a direction with three Si backbonds. Accordingly, in the present embodiment, the etching in the X-axis direction progresses, whereas almost no etching progresses in the Y-axis direction and the Z-axis direction. As a result, a space 12Z, which is surrounded by the first crystal plane 11S1, the second crystal plane 11S2, and the third crystal plane 11S3 and is to be in communication with the trench 12T, is formed inside the semiconductor substrate 11 that is the Si {111} substrate. It is to be noted that the distance of the progress of the etching in the <110> direction may be adjusted by etching processing time using an alkaline aqueous solution on the semiconductor substrate 11. However, by providing the etching stopper 17 in advance at a predetermined position as in the present embodiment, it is possible to easily control the progress of the etching in the <110> direction, and thus to accurately secure a region where the Si {111} remains. The progress of the etching in the <110> direction is stopped by the etching stopper 17, and as a result two third crystal planes 11S3 represented by the plane index {111} extending with the etching stopper 17 as a base point are formed (see FIG. 5B). It is to be noted that FIG. 5B illustrates a state in which four third crystal planes 11S3 extending with two etching stoppers 17 as base points form a rhombus in a plan view. The rhombic region surrounded by the four third crystal planes 11S3 corresponds to the Si-remaining region 22 in which the Si {111} surrounded by the horizontal light-shielding part 12H of the light-shielding section 12 finally remains. In addition, the second crystal plane 11S2 (FIG. 5B) is also formed in parallel with the formation of the third crystal plane 11S3.

Figure 6G:
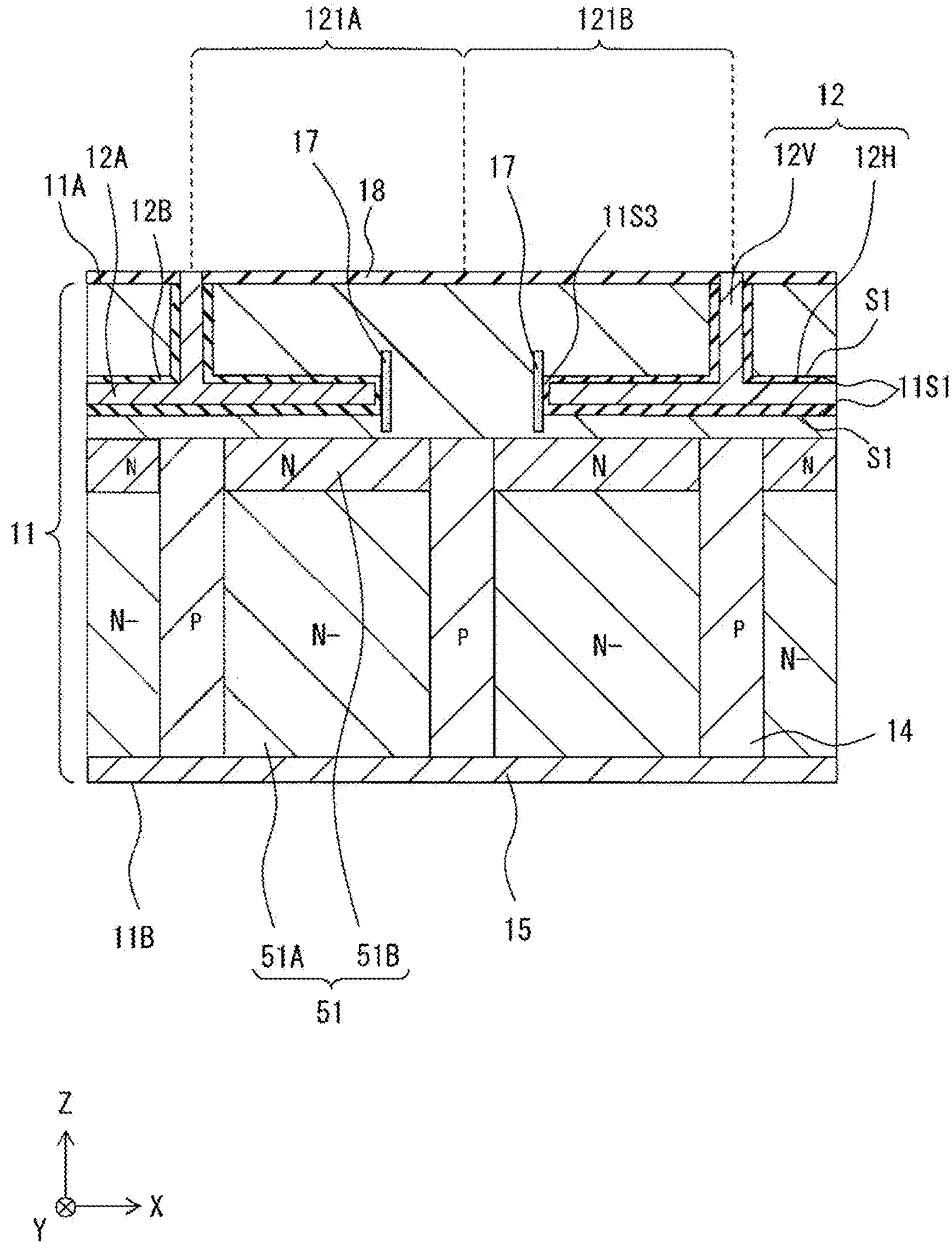
FIG. 6G is a cross-sectional view of one step subsequent to FIGS. 6E and 6F.

After the formation of the space 12Z, the hard mask HM and the sidewall SW are removed, for example, by wet etching, as illustrated in FIG. 6G. It is to be noted that there may be a case where isotropic dry etching is able to be used to remove the hard mask HM and the sidewall SW. In the wet etching, in a case where the hard mask HM or the like includes $SiO_2$, for example, it is better to use a chemical solution containing HF (hydrofluoric acid) such as DHF (dilute hydrofluoric acid) or BHF (buffered hydrofluoric acid), and in a case where the hard mask HM or the like includes SiN, it is better to use a chemical solution containing hot phosphoric acid (hot phosphoric acid) or HF. It is to be noted that the hard mask HM and the sidewall SW may not be removed. Thereafter, the outer layer part 12B is formed using an insulating material or the like to cover the side surface 12TA of the trench 12T and an inner surface of the space 12Z as well as the front surface 11A of the semiconductor substrate 11, and further the inner layer part 12A is infilled so as to fill the trench 12T and the space 12Z. This allows for formation of the light-shielding section 12 including the vertical light-shielding part 12V that occupies the trench 12T and the horizontal light-shielding part 12H that occupies the space 12Z. It is to be noted that, in order to infill the space 12Z without gap, it is desirable that the width of the trench 12T (dimension in the X-axis direction) be larger than the thickness of the space 12Z (dimension in the Z-axis direction). In addition, in a case where the inner layer part 12A is infilled with the above-mentioned metal material at this stage, it is difficult to perform subsequent processing involving high temperature. Therefore, it is better to temporarily fill the trench 12T and the space 12Z using a temporary filling material having relatively superior heat resistance such as $SiO_2$, SiN, or polysilicon, and to replace the temporary filling material with a predetermined metal material after the subsequent step involving high temperature is finished, e.g., after a forming step of the element separation section 13 is finished.

Figure 6H:
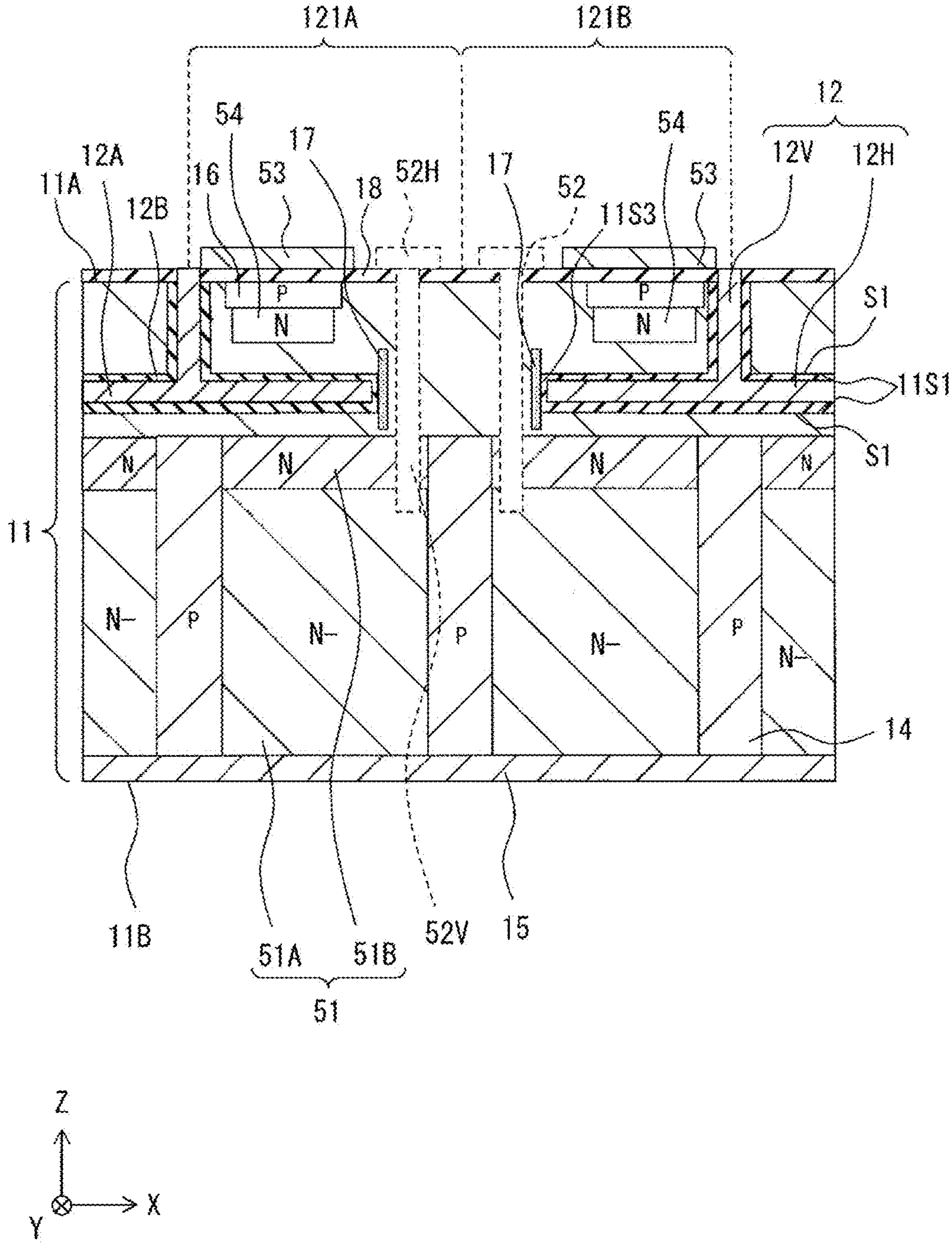
FIG. 6H is a cross-sectional view of one step subsequent to FIG. 6G.
Figure 6I:
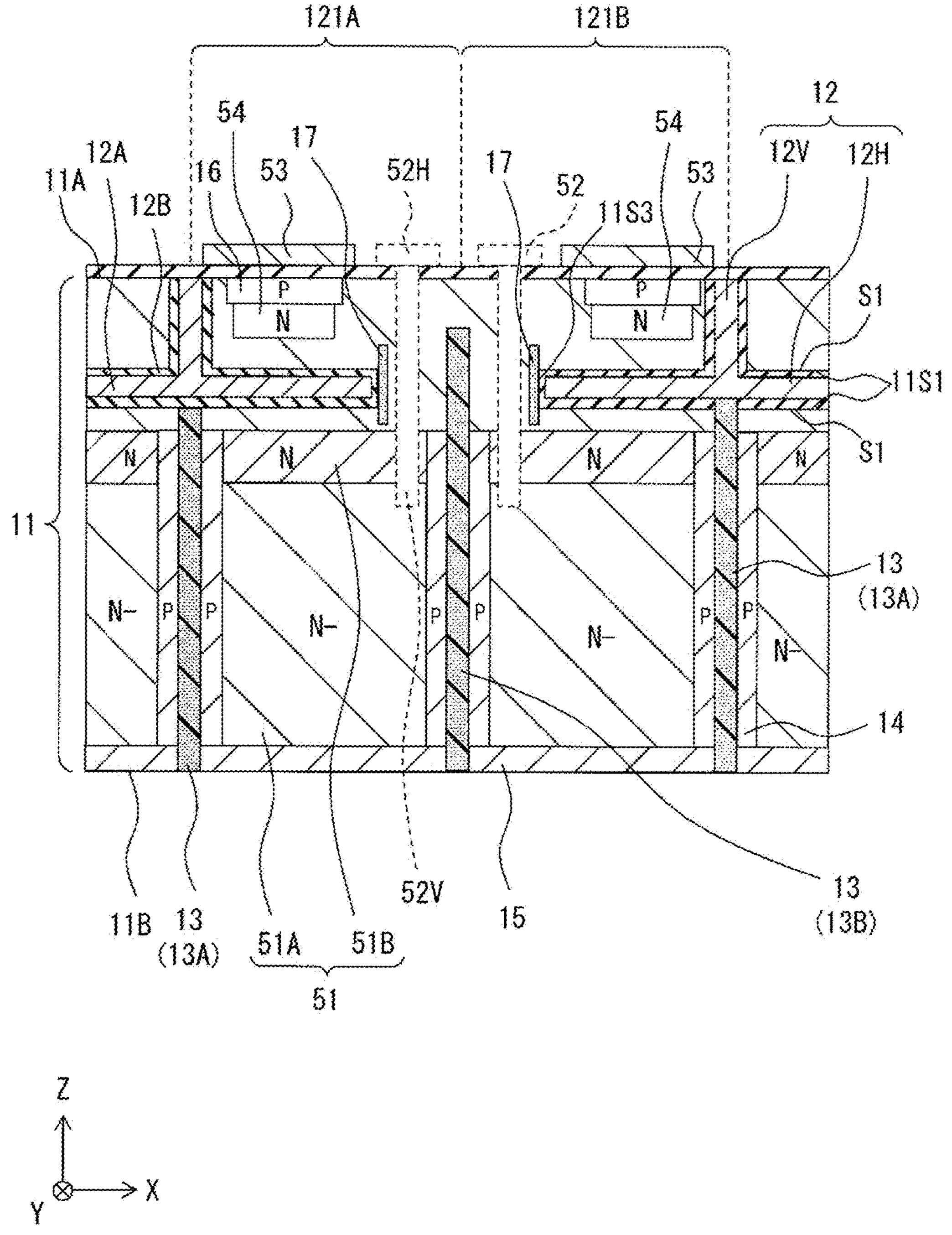
FIG. 6I is a cross-sectional view of one step subsequent to FIG. 6H.

Subsequently, as illustrated in FIG. 6H, a known method is used to form the TRX 52, the TRM 53, the MEM 54, the TRG 55, and the OFG 57. Thereafter, as illustrated in FIG. 6I, each element separation section 13 is formed at a boundary position between the sensor pixels 121. Upon the formation of the element separation section 13, a trench is formed by dry etching from the back surface 11B, for example. At that time, a trench is formed, which has a depth reaching the horizontal light-shielding part 12H. Thereafter, the trench is infilled with a predetermined material to obtain the element separation section 13. Finally, the color filter CF and the light-receiving lens LNS are joined in order onto the back surface 11B to thereby complete the solid-state imaging device 101.

[Workings and Effects of Solid-State Imaging Device 101]

As described above, in the solid-state imaging device 101 of the present embodiment, the vertical light-shielding part 12V is provided at a boundary position between the sensor pixels 121. Therefore, it is possible to prevent light having leaked from one sensor pixel 121 to another adjacent sensor pixel 121 from being incident on the photoelectric conversion section 51 of the other sensor pixel 121, and thus to prevent generation of a noise such as color mixture.

In addition, the solid-state imaging device 101 of the present embodiment is provided with the horizontal light-shielding part 12H positioned between the photoelectric conversion section 51 and the MEM 54 in the thickness direction and extending along the horizontal plane. Therefore, it is possible to hinder light transmitted through the photoelectric conversion section 51 without being absorbed by the photoelectric conversion section 51 in each sensor pixel 121 from being incident on the MEM 54. Thus, it is possible to prevent generation of a noise. This effect appears more remarkably as time for accumulation of charges in the MEM 54 becomes longer.

In addition, in the solid-state imaging device 101 of the present embodiment, the horizontal light-shielding part 12H is provided inside the semiconductor substrate 11 that is the Si {111} substrate. The horizontal light-shielding part 12H includes the first plane 51 along the first crystal plane 11S1 and the second plane S2 along the second crystal plane 11S2 that is inclined relative to the first plane Si. Here, the first crystal plane 11S1 and the second crystal plane 11S2 are each represented by the plane index {111}. Accordingly, the horizontal light-shielding part 12H is easily formable by crystalline anisotropic etching using an etching solution such as an alkaline aqueous solution and has high dimensional accuracy. In particular, the solid-state imaging device 101 of the present embodiment is provided with the etching stopper 17 in advance, thus improving controllability during the crystalline anisotropic etching, and thus allowing the horizontal light-shielding part 12H having still higher dimensional accuracy to be easily obtained.

In addition, in the solid-state imaging device 101 of the present embodiment, the presence of the horizontal light-shielding part 12H makes it possible to avoid an influence of an electric field generated in each transistor (e.g., TRX 52, etc.) in each of the sensor pixels 121 over the photoelectric conversion section 51. That is, a dark current generated by the electric field of each transistor flows into the photoelectric conversion section 51, thus making it possible to prevent the generation of a noise.

Further, in the solid-state imaging device 101 of the present embodiment, the Si {111} substrate is used as the semiconductor substrate 11, and thus channel mobility becomes higher than a case of using an Si (100) substrate, thus making it possible to expect an improvement in a charge-transfer property.

In addition, in the method of manufacturing the solid-state imaging device 101 of the present embodiment, crystalline anisotropic etching is performed using an alkaline aqueous solution on the Si {111} substrate upon the formation of the light-shielding section 12, thus achieving high controllability. Moreover, no recrystallization occurs, which becomes an issue in a technique utilizing selective Epi growth or in a method utilizing an SON (Silicon On Nothing) technique. Thus, it is possible to avoid an adverse effect on an imaging capability.

2. Second Embodiment

[Configuration of Solid-State Imaging Device 102]

Figure 7:
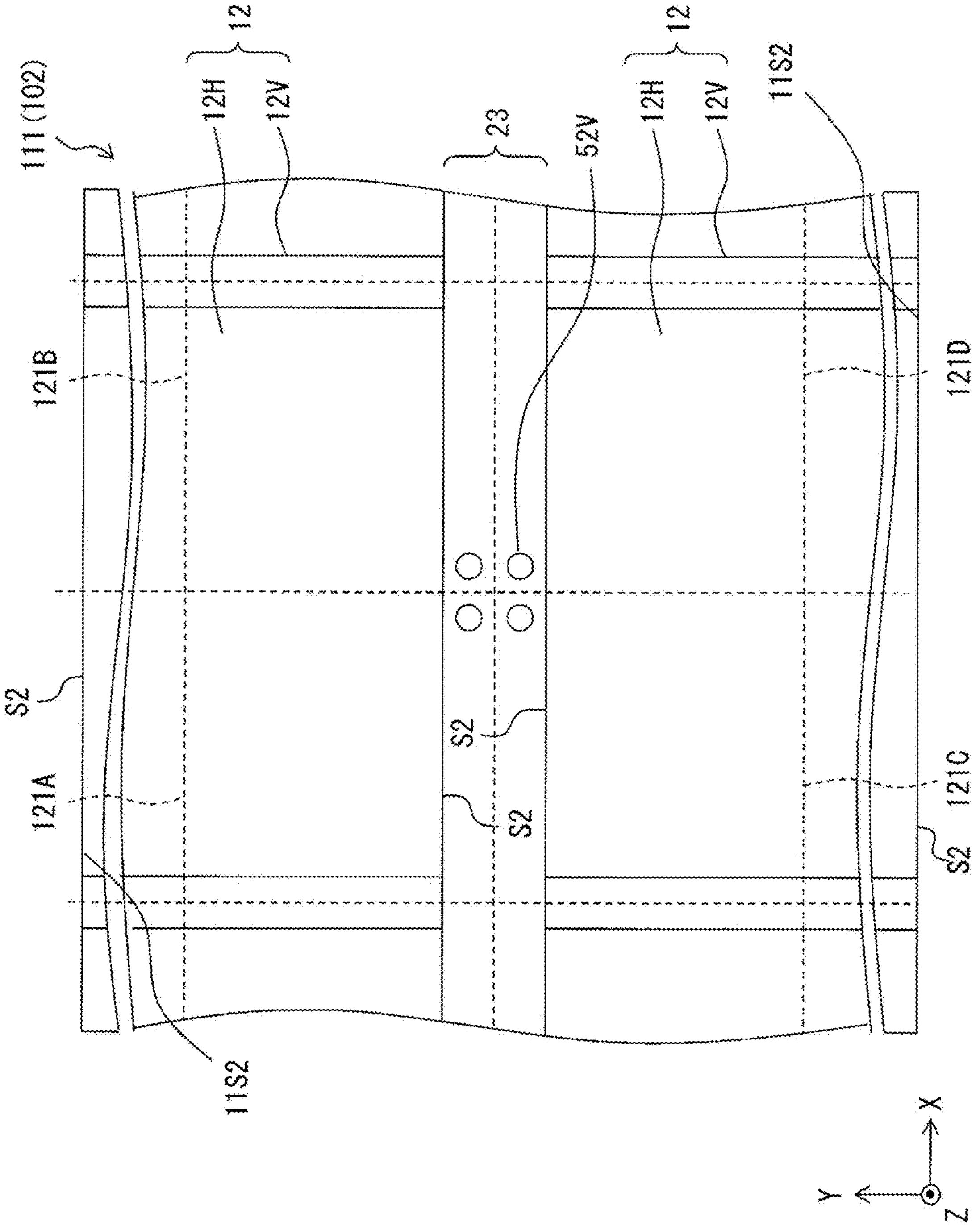
FIG. 7 is a plan view schematically illustrating a configuration of some of sensor pixels in an imaging device according to a second embodiment of the present disclosure.

FIG. 7 is an enlarged plan view of a partial region of the pixel array section 111 in a solid-state imaging device 102 according to a second embodiment of the present technology, and schematically illustrates configurations of the four sensor pixels 121A to 121D adjacent to each other. It is to be noted that FIG. 7 corresponds to FIG. 5B of the first embodiment, and mainly indicates a shape of the light-shielding section 12 with a solid line.

In the solid-state imaging device 101 according to the foregoing first embodiment, the opening 12K is formed in the horizontal light-shielding part 12H of the light-shielding section 12, and the island-shaped Si-remaining region 22 is provided. Meanwhile, in the solid-state imaging device 102 according to the present embodiment, the light-shielding section 12 is separated by a band-shaped Si-remaining region 23 extending in the X-axis direction. In addition, the solid-state imaging device 102 according to the present embodiment includes no etching stopper 17. Except for these points, the solid-state imaging device 102 has a substantially similar configuration, in other points, to that of the solid-state imaging device 101 according to the foregoing first embodiment.

As described above, in the solid-state imaging device 102 according to the present embodiment, it is possible to form the horizontal light-shielding part 12H in the light-shielding section 12 without using the etching stopper 17, thus making it possible to simplify the manufacturing process. In addition, an area of the Si-remaining region 23 is larger than an area of the Si-remaining region 22 of the solid-state imaging device 101 according to the foregoing first embodiment, thus making it possible to enhance mechanical strength at the time of forming the space 12Z. However, the solid-state imaging device 101 is more advantageous than the solid-state imaging device 102 in terms of a light-shielding property.

3. Third Embodiment

[Configuration of Solid-State Imaging Device 103]

Figure 8:
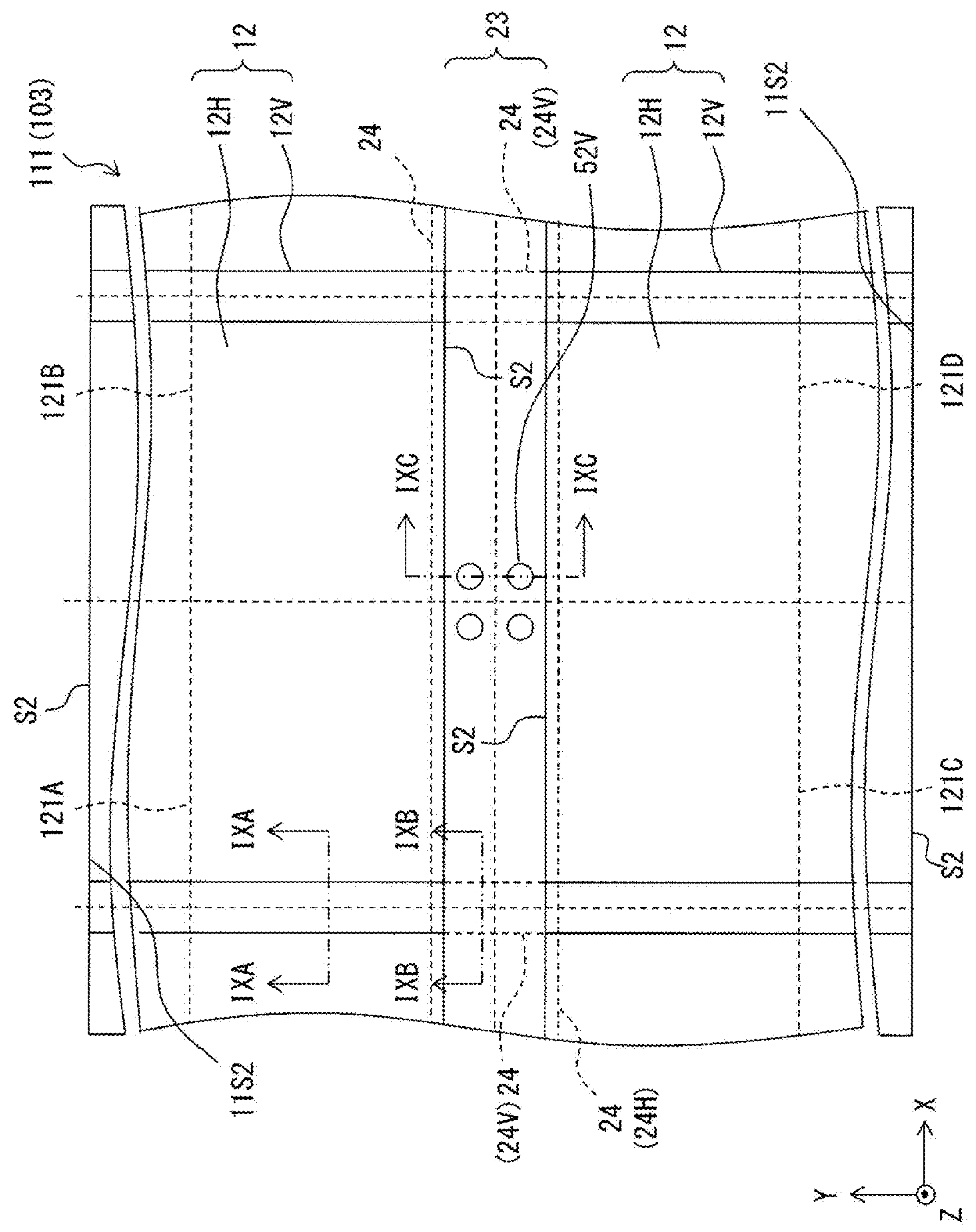
FIG. 8 is a plan view schematically illustrating a configuration of some of sensor pixels in an imaging device according to a third embodiment of the present disclosure.
Figure 9A:
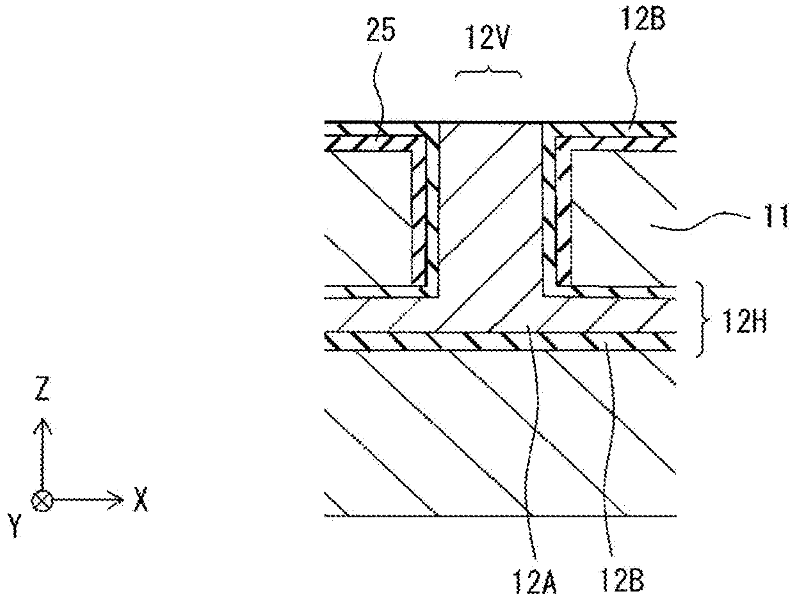
FIG. 9A is a first cross-sectional view schematically illustrating a configuration of some of the sensor pixels in the imaging device illustrated in FIG. 8.
Figure 9B:
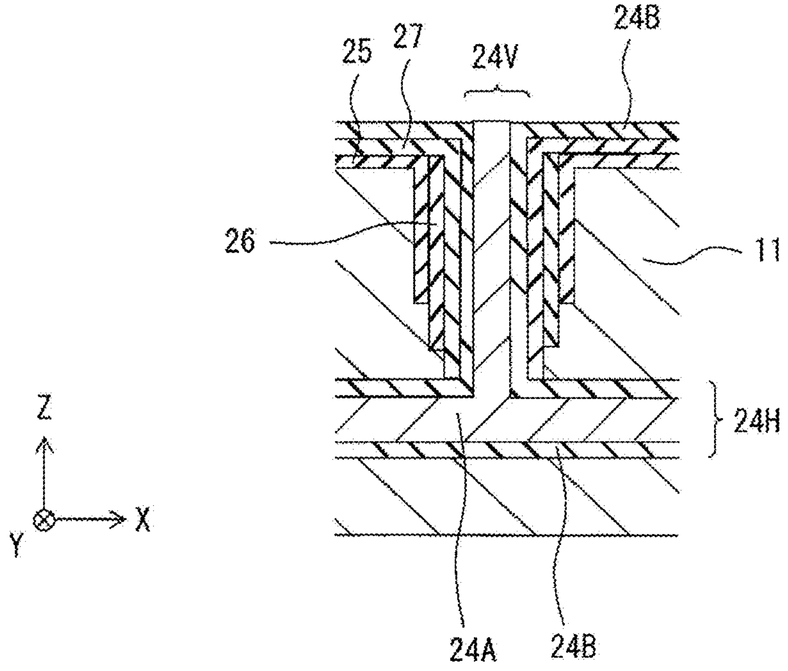
FIG. 9B is a second cross-sectional view schematically illustrating the configuration of some of the sensor pixels in the imaging device illustrated in FIG. 8.
Figure 9C:
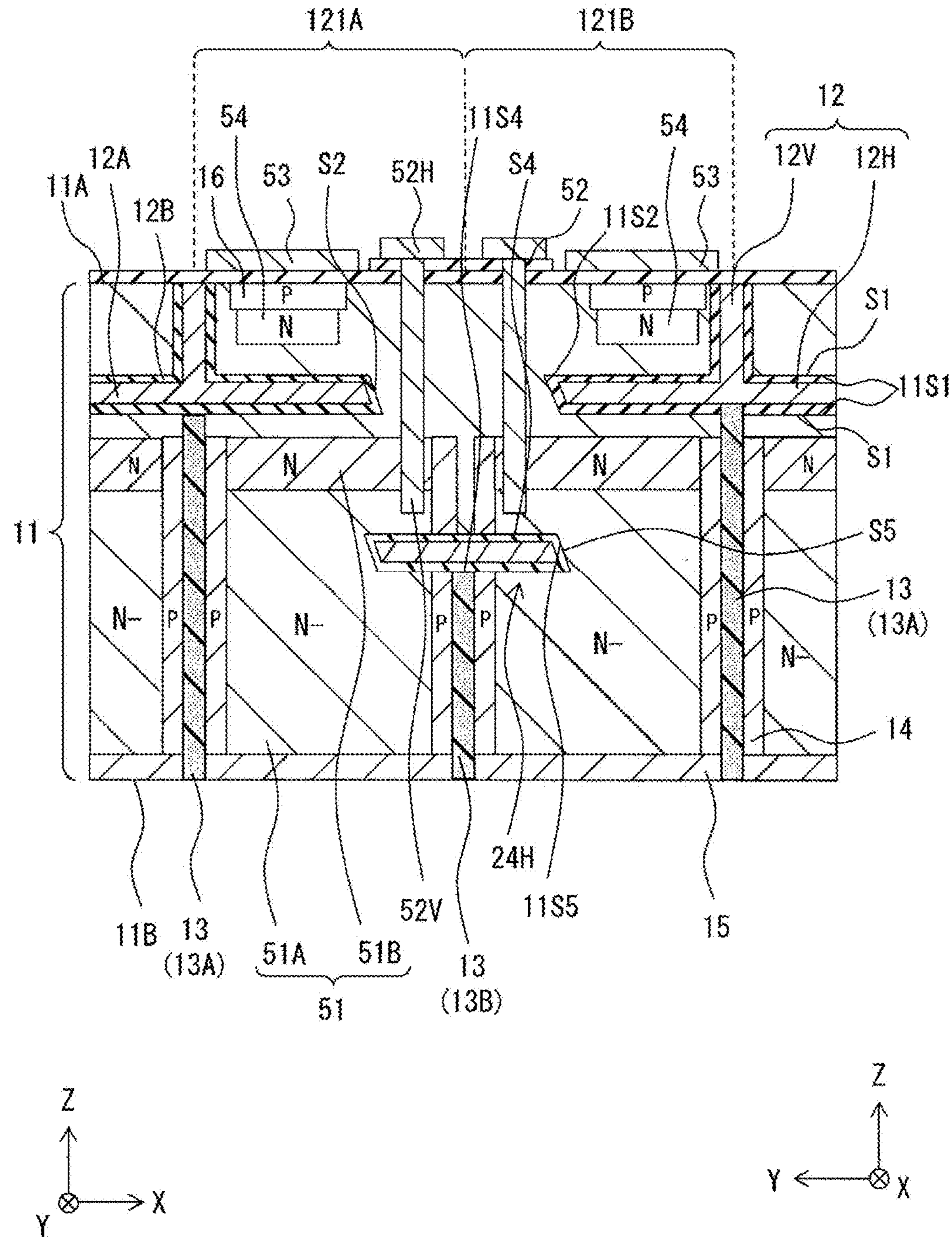
FIG. 9C is a third cross-sectional view schematically illustrating the configuration of some of the sensor pixels in the imaging device illustrated in FIG. 8.
Figure 10:
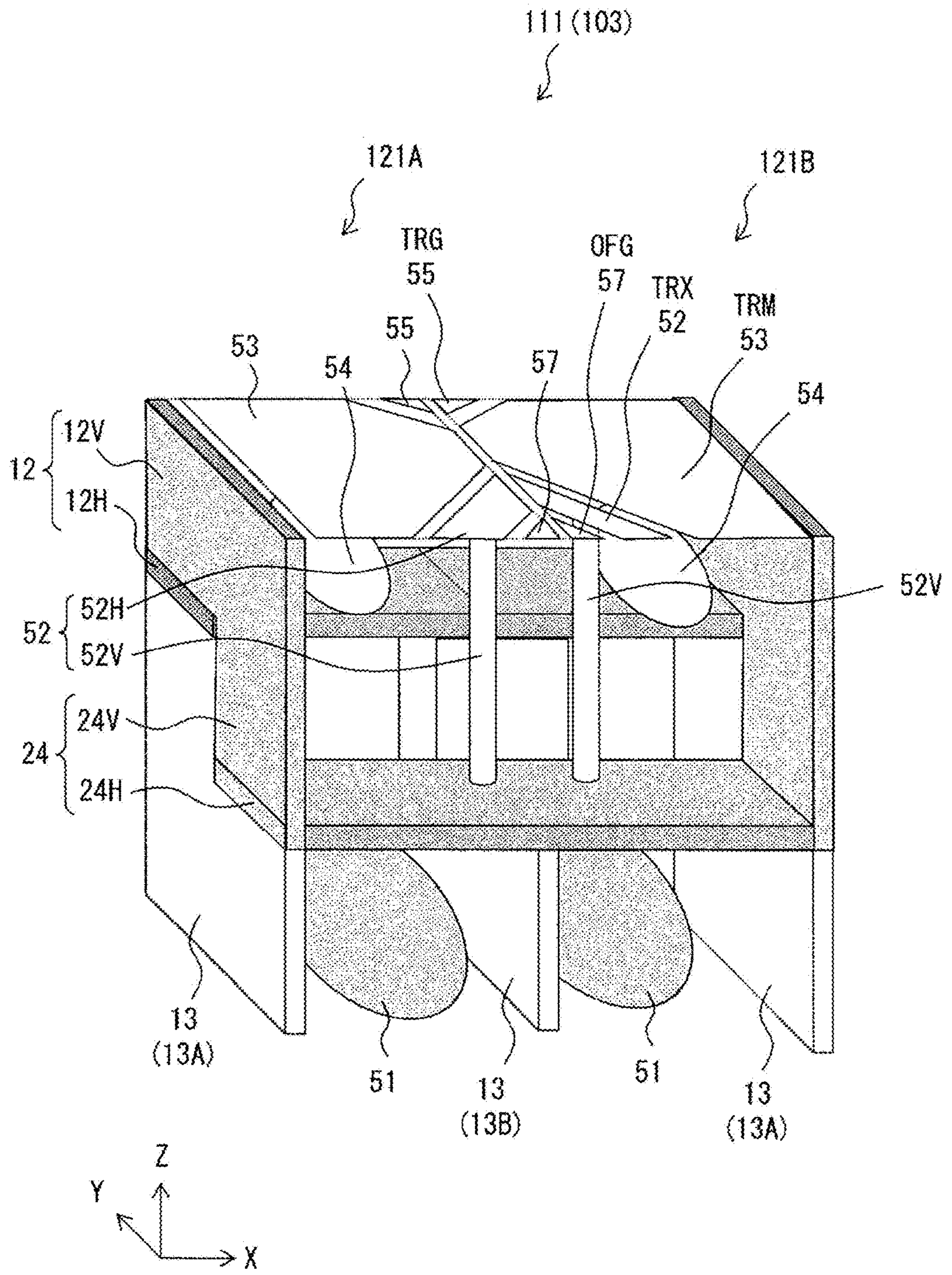
FIG. 10 is a perspective view schematically illustrating the configuration of some of the sensor pixels in the imaging device illustrated in FIG. 8.

FIG. 8 is an enlarged plan view of a partial region of the pixel array section 111 in a solid-state imaging device 103 according to a third embodiment of the present technology, and schematically illustrates configurations of the four sensor pixels 121A to 121D adjacent to each other. It is to be noted that FIG. 8 corresponds to FIG. 5B of the first embodiment, and mainly indicates shapes of the light-shielding section 12 and a light-shielding section 24 (described later) with a solid line. In addition, FIG. 9A illustrates a cross-section in a direction of an arrow along a line IXA-IXA indicated in FIG. 8; FIG. 9B illustrates a cross-section in a direction of an arrow along a line IXB-IXB indicated in FIG. 8; and FIG. 9C illustrates a cross-section in a direction of an arrow along a line IXC-IXC indicated in FIG. 8. It is to be noted that FIG. 9A to FIG. 9B only illustrate the vicinity of the light-shielding section 24, and descriptions of some of components are omitted. Further, FIG. 10 is a perspective view schematically illustrating configurations of any two sensor pixels 121A and 121B adjacent to each other in the solid-state imaging device 103, and corresponds to FIG. 3 of the first embodiment.

In the solid-state imaging device 103 of the present embodiment, the light-shielding section 24 is further provided in addition to the light-shielding section 12. Except for this point, the solid-state imaging device 103 has a substantially similar configuration, in other points, to that of the solid-state imaging device 102 according to the foregoing second embodiment.

The light-shielding section 24 is provided in the Si-remaining region 23 in which the Si {111} remains in the level in which the light-shielding section 12 is provided. Similarly to the light-shielding section 12, the light-shielding section 24 includes a horizontal light-shielding part 24H extending along the horizontal plane (XY plane), and a vertical light-shielding part 24V extending along the YZ plane to be orthogonal to horizontal light-shielding part 24H. As illustrated in FIG. 10, the vertical light-shielding part 12V is a wall part on the extension of the vertical light-shielding part 12V in the Y-axis direction, and is provided at a boundary part between the sensor pixels 121 adjacent to each other in the X-axis direction in a plan view. In addition, the horizontal light-shielding part 24H is positioned at a deep position distant from the front surface 11A in the Z-axis direction, i.e., below the vertical terminal section 52V in the Z-axis direction. As illustrated in FIG. 8, the horizontal light-shielding part 24H extends in the X-axis direction in a band-shaped manner to occupy a region corresponding to the Si-remaining region 23. Light incident from the back surface 11B and transmitted through the photoelectric conversion section 51 without being absorbed by the photoelectric conversion section 51 is reflected at the horizontal light-shielding part 24H of the light-shielding section 24, and is incident on the photoelectric conversion section 51 again. That is, the horizontal light-shielding part 24H of the light-shielding section 24 also functions as a reflector similarly to the horizontal light-shielding part 12H, and functions to suppress generation of a noise due to incidence of light transmitted through the photoelectric conversion section 51 on the MEM 54.

Further, the horizontal light-shielding part 24H includes a pair of fourth planes S4 and a pair of fifth planes S5. The pair of fourth planes S4 are each a plane along a fourth crystal plane 1154 of the semiconductor substrate 11, and are opposed to each other in the Z-axis direction (see FIG. 9A to FIG. 9C). It is to be noted that the fourth crystal plane 11S4 in the semiconductor substrate 11 is represented by the plane index {111}. In addition, the pair of fifth planes S5 are each a plane along a fifth crystal plane 11S5 of the semiconductor substrate 11, and are positioned at both ends of the pixel array section 111 in the Y-axis direction (see FIG. 9C). It is to be noted that the fifth crystal plane 11S5 in the semiconductor substrate 11 is represented by the plane index {111}, and is inclined by about 19.5° relative to the Z-axis direction. That is, the inclination angle of the fifth crystal plane 11S5 relative to the horizontal plane (XY plane) is, for example, about 70.5°.

It is to be noted that an insulating layer 25 is provided around the vertical light-shielding part 12V, and insulating layers 25 to 27 are provided around the vertical light-shielding part 24V. The insulating layers 25 to 27 are each used as a mask at the time of process of the light-shielding section 12 and the light-shielding section 24.

[Method of Manufacturing Solid-State Imaging Device 103]

Here, description is given, with reference to FIGS. 11A to 11D and FIGS. 12A to 12D, of steps of forming the light-shielding section 12 and the light-shielding section 24. FIGS. 11A to 11D are each a cross-sectional view of a main part of a step of forming the light-shielding section 12, and correspond to FIG. 9A. FIGS. 12A to 12D are each a cross-sectional view of a main part of a step of forming the light-shielding section 24, and correspond to FIG. 9B.

Figure 11A:
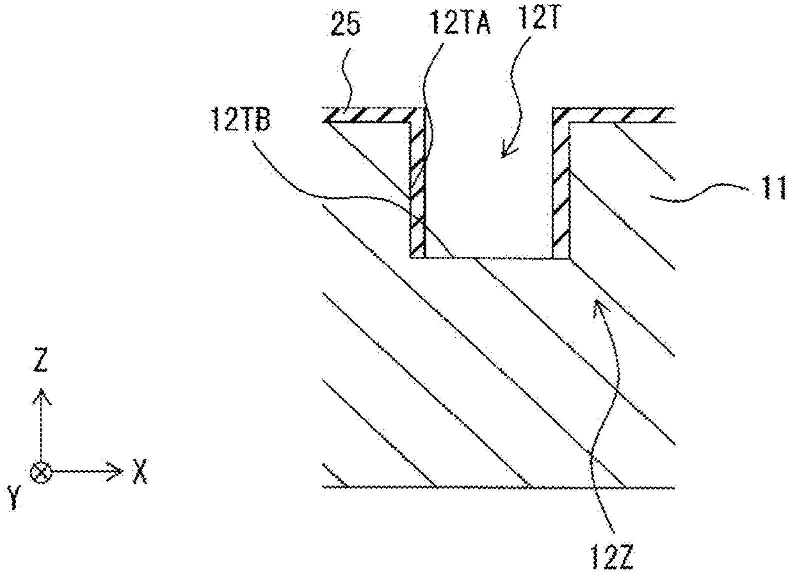
FIG. 11A is a cross-sectional view of one step in a method of manufacturing the imaging device illustrated in FIG. 8.
Figure 12A:
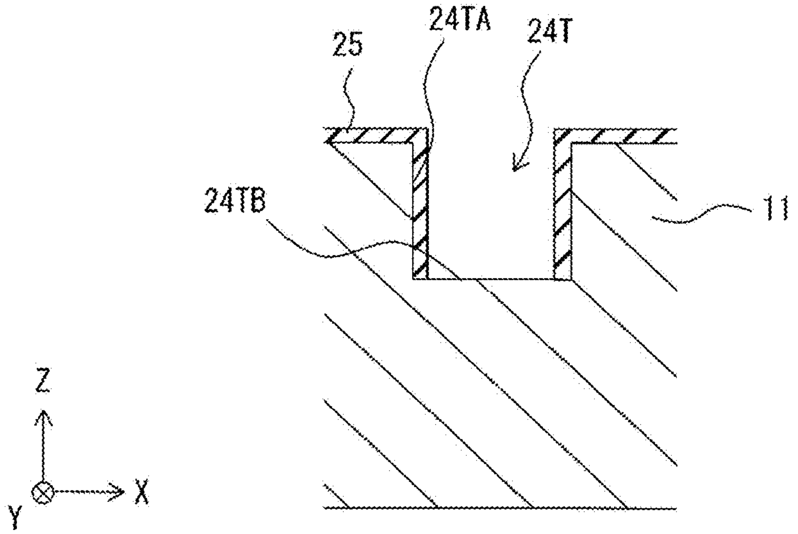
FIG. 12A is another cross-sectional view of one step in the method of manufacturing the imaging device illustrated in FIG. 8.

First, as illustrated in FIGS. 11A and 12A, similarly to the solid-state imaging device 101 of the first embodiment, the trench 12T is formed at a position where the vertical light-shielding part 12V is to be formed, and a trench 24T is formed at a position where the vertical light-shielding part 24V is to be formed. At that time, the insulating layer 25 is selectively formed, as a film, to cover the front surface 11A, and thereafter the insulating layer 25 is used as a hard mask to partially remove the Si {111} constituting the semiconductor substrate 11 by dry etchback. The depth of the trench 12T at this time corresponds to a dimension in the Z-axis direction of the vertical light-shielding part 12V formed subsequently. Next, the insulating layer 25 is further formed to cover the side surface 12TA and the bottom surface 12TB of the trench 12T as well as a side surface 24TA and a bottom surface 24TB of the trench 24T. Thereafter, the dry etchback is used to remove only parts, of the insulating layer 25, that cover the bottom surfaces 12TB and 24TB.

Figure 11B:
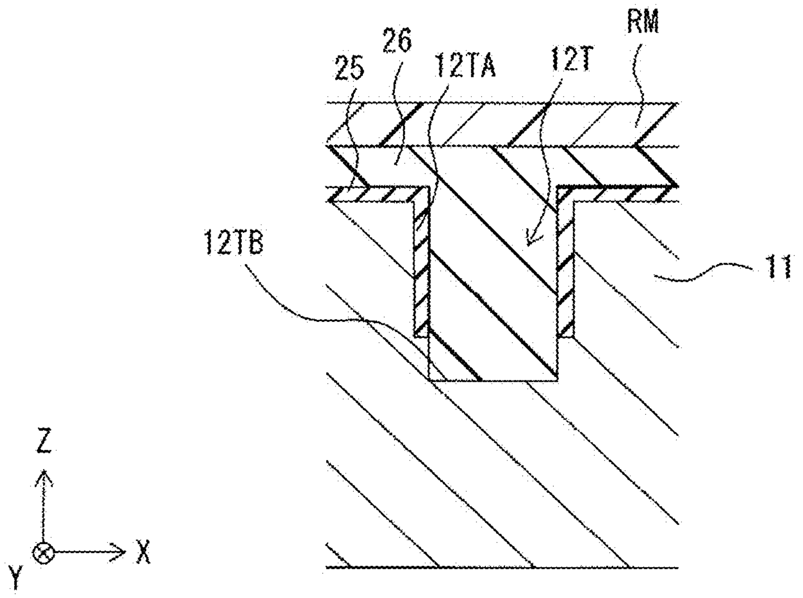
FIG. 11B is a cross-sectional view of one step subsequent to FIG. 11A.
Figure 12B:
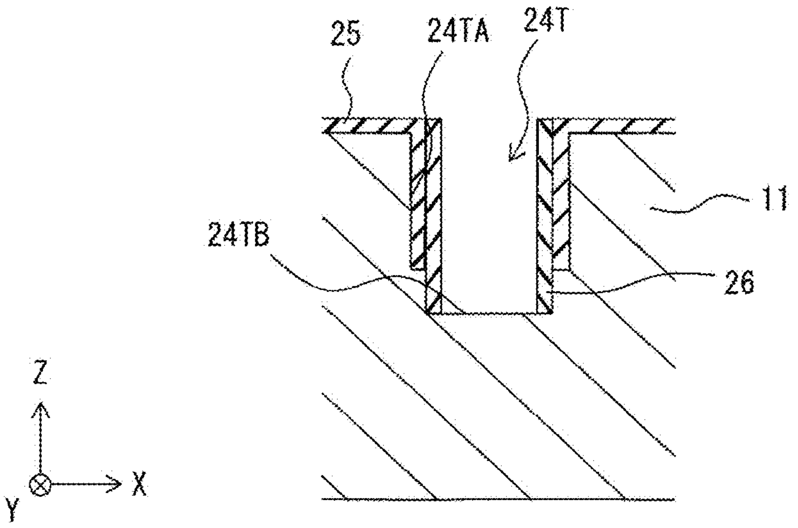
FIG. 12B is a cross-sectional view of one step subsequent to FIG. 12A.

Subsequently, as illustrated in FIGS. 11B and 12B, the Si {111} constituting the semiconductor substrate 11 is partially removed by dry etchback to further dig down each of the bottom surface 12TB of the trench 12T and the bottom surface 24TB of the trench 24T. Thereafter, the insulating layer 26 is formed all over to fill the trench 12T and the trench 24T, followed by formation of a resist mask RM by means of a photolithography method to selectively cover a part, of the insulating layer 26, that fills the trench 12T (FIG. 11B). Thereafter, the dry etchback is used to partially remove the insulating layer 26, which fills the trench 24T, not covered by the resist mask RM. This allows only a part, of the insulating layer 26, covering the side surface 24TA of the trench 24T to remain, leading to a state where the Si {111} is exposed to the bottom surface 24TB of the trench 24T (FIG. 11A). It is to be noted that the insulating layer 25 and the insulating layer 26 each include an insulating material such as $SiO_2$ or SiN. However, it is desirable that the insulating layer 25 and the insulating layer 26 include materials different from each other.

Figure 11C:
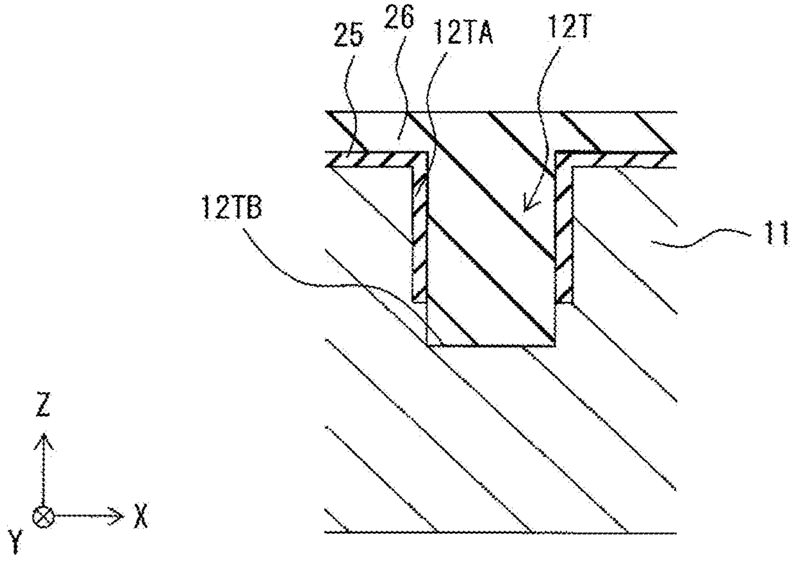
FIG. 11C is a cross-sectional view of one step subsequent to FIG. 11B.
Figure 12C:
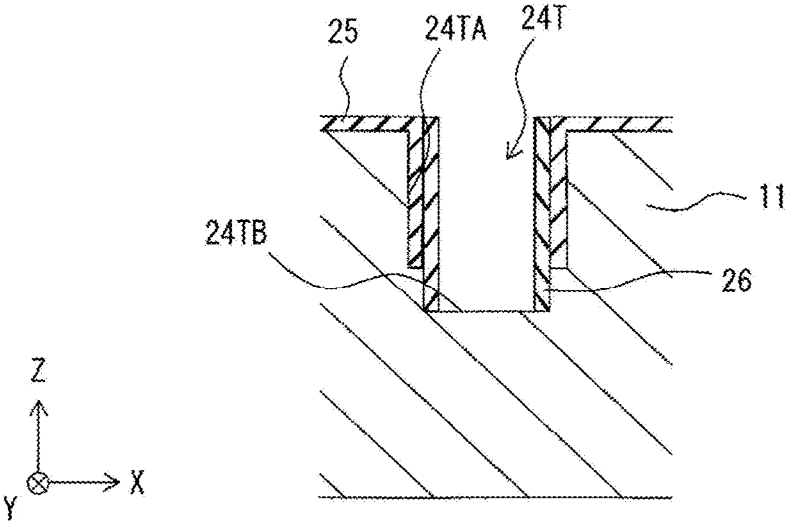
FIG. 12C is a cross-sectional view of one step subsequent to FIG. 12B.

Subsequently, as illustrated in FIG. 12C, the resist mask RM is removed. Thereafter, as illustrated in FIG. 11C, the dry etchback is used to further dig down the Si {111} exposed to the bottom surface 24TB of the trench 24T uncovered by the insulating layer 26. Thereafter, a CVD method is adopted to further form the insulating layer 27 using, for example, the same material as that of the insulating layer 25, and the dry etchback is used to remove the insulating layer 27 covering the bottom surface TB.

Figure 11D:
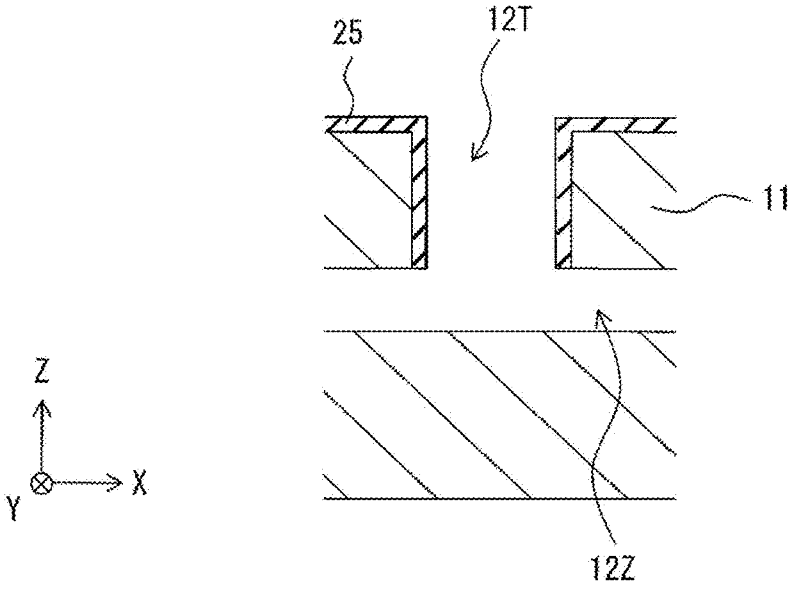
FIG. 11D is a cross-sectional view of one step subsequent to FIG. 11C.
Figure 12D:
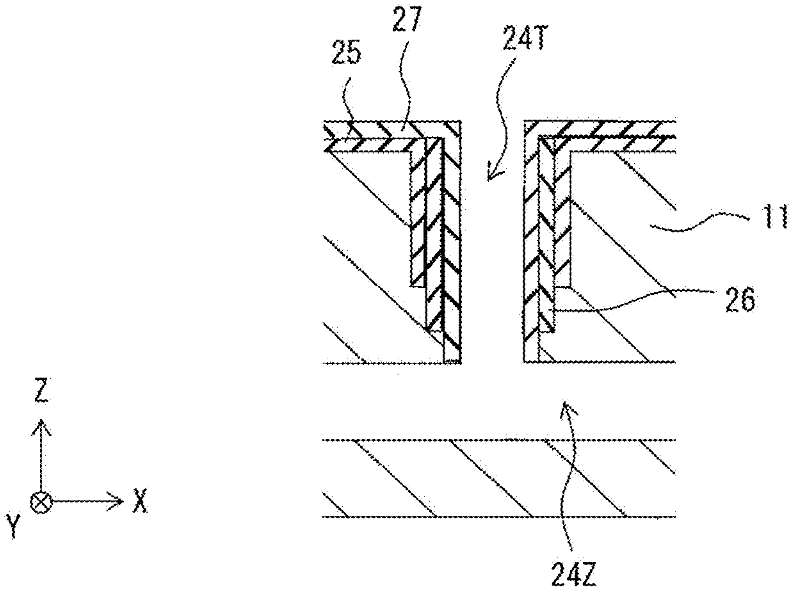
FIG. 12D is a cross-sectional view of one step subsequent to FIG. 12C.

Subsequently, as illustrated in FIG. 12D, the Si {111} exposed to the bottom surface 24TB of the trench 24T is subjected to crystalline anisotropic etching using an alkaline aqueous solution similarly to the foregoing first embodiment to thereby form a space 24Z. Next, as illustrated in FIG. 11D, the insulating layer 26 filling the trench 12T is dissolved and removed by phosphoric acid or the like, for example, and then is subjected to crystalline anisotropic etching using an alkaline aqueous solution to thereby form the space 12Z.

Thereafter, the outer layer part 12B is formed using an insulating material or the like to cover the insulating layer 25 and an inner surface of the space 12Z, and further the inner layer part 12A is infilled so as to fill the trench 12T and the space 12Z. This allows for formation of the light-shielding section 12 including the vertical light-shielding part 12V that occupies the trench 12T and the horizontal light-shielding part 12H that occupies the space 12Z. Similarly, an outer layer 24B is formed using an insulating material or the like to cover the insulating layer 27 and the inner surface of the space 24Z, and further an inner layer 24A is infilled so as to fill the trench 24T and the space 24Z. This allows for formation of the light-shielding section 24 including the vertical light-shielding part 24V that occupies the trench 24T and the horizontal light-shielding part 24H that occupies the space 24Z.

[Workings and Effects of Solid-State Imaging Device 103]

As described above, in the solid-state imaging device 103 of the present embodiment, the additional light-shielding section 24 is further provided in a region overlapping the Si-remaining region 23 where no horizontal light-shielding part 12H of the light-shielding section 12 is formed in a plan view. Therefore, it is possible to further hinder light transmitted through the photoelectric conversion section 51 without being absorbed by the photoelectric conversion section 51 in each sensor pixel 121 from being incident on the MEM 54. Thus, it is possible to further prevent generation of a noise.

4. Fourth Embodiment

[Configuration of Solid-State Imaging Device 104]

Figure 13:
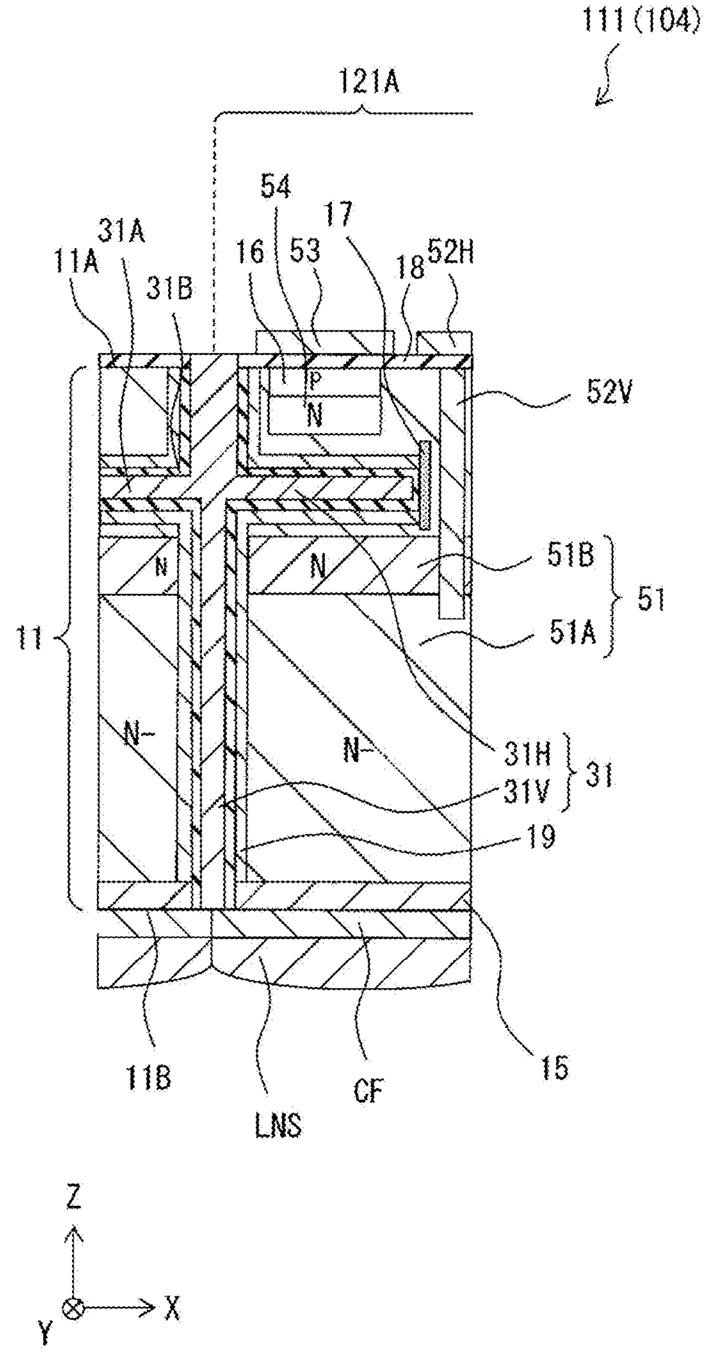
FIG. 13 is a cross-sectional view schematically illustrating a configuration of some of sensor pixels in an imaging device according to a fourth embodiment of the present disclosure.

FIG. 13 is an enlarged cross-sectional view of a partial region of the pixel array section 111 in a solid-state imaging device 104 according to a fourth embodiment of the present technology. It is to be noted that, FIG. 13 corresponds to FIG. 4A of the first embodiment, and mainly illustrates a structure of the sensor pixel 121A.

The solid-state imaging device 101, etc. of the first embodiment includes the element separation section 13 formed from the back surface 11B. Meanwhile, in the solid-state imaging device 104 of the present embodiment, a light-shielding section and an element separation section are integrated. That is, the solid-state imaging device 104 is provided with a light-shielding section 31 including a vertical light-shielding part 31V extending in the Z-axis direction from the front surface 11A of the semiconductor substrate 11 up to the back surface 11B thereof and a horizontal light-shielding part 31H extending in a horizontal plane to be orthogonal to the vertical light-shielding part 31V. The light-shielding section 31 has a two-layer structure of an inner layer part 31A and an outer layer part 31B surrounding the periphery thereof. The inner layer part 31A and the outer layer part 31B are configured by, for example, the same type of materials as those of the inner layer part 12A and the outer layer part 12B, respectively. Further, a solid-phase diffusion layer 19 including a P type region and an N type region is formed around the light-shielding section 31.

[Method of Manufacturing Solid-State Imaging Device 104]

Here, description is given, with reference to FIGS. 14A to 14H, of steps of forming the light-shielding section 31 and the solid-phase diffusion layer 19. FIGS. 14A to 14H are each a cross-sectional view of a main part of a step of forming the light-shielding section 31 and the solid-phase diffusion layer 19, and correspond to FIG. 13.

Figure 14A:
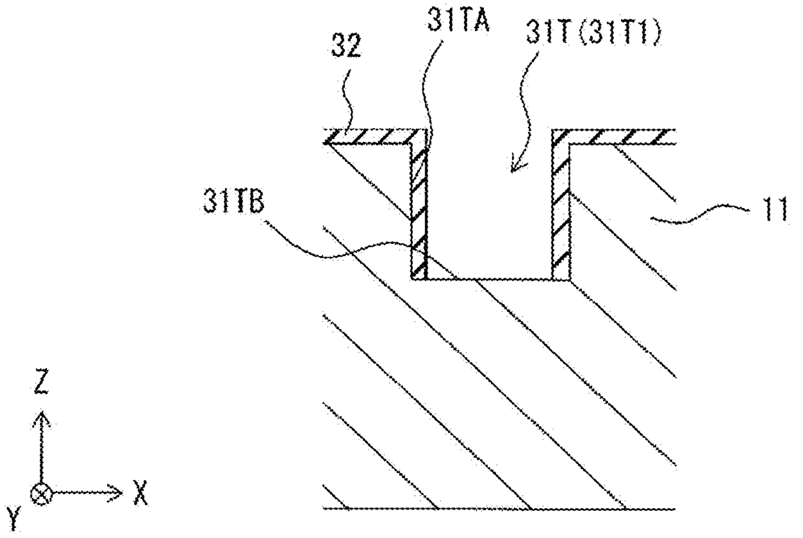
FIG. 14A is a cross-sectional view of one step in a method of manufacturing the imaging device illustrated in FIG. 13.

First, as illustrated in FIG. 14A, similarly to the solid-state imaging device 103 of the third embodiment, a trench 31T (31T1) is formed at a position where the vertical light-shielding part 31V is to be formed. At that time, an insulating layer 32 is selectively formed, as a film, using $SiO_2$ or the like to cover the front surface 11A, and thereafter the insulating layer 32 is used as a hard mask to partially remove the Si {111} constituting the semiconductor substrate 11 by dry etchback. The depth of the trench 31T1 at this time corresponds to a dimension in the Z-axis direction of a part, of the vertical light-shielding part 31V formed subsequently, above the horizontal light-shielding part 31H. Next, the insulating layer 32 is further formed to cover a side surface 31TA and a bottom surface 31TB of the trench 31T1. Thereafter, the dry etchback is used to remove only a part, of the insulating layer 32, covering the bottom surface 31TB.

Figure 14B:
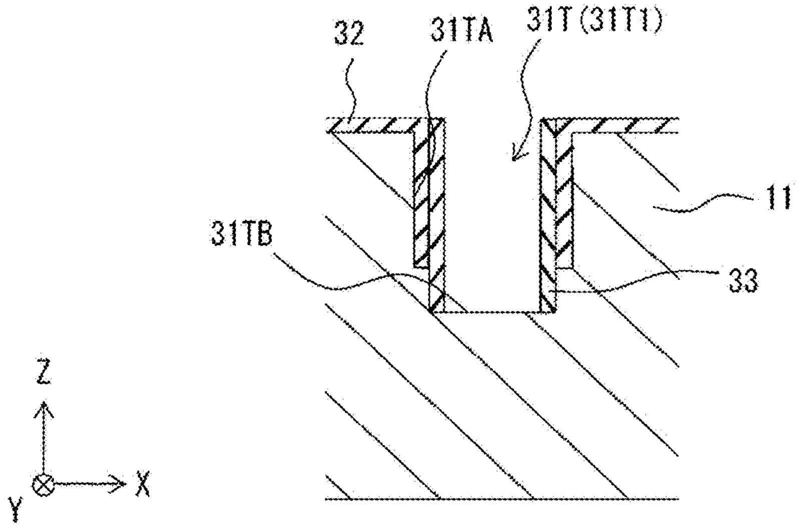
FIG. 14B is a cross-sectional view of one step subsequent to FIG. 14A.

Subsequently, as illustrated in FIG. 14B, the Si {111} constituting the semiconductor substrate 11 is partially removed by dry etchback to further dig down the bottom surface 31TB of the trench 31T1. Thereafter, an insulating layer 33 is formed all over using SiN, for example, to fill the trench 31T1, and then the dry etchback is used to partially remove the insulating layer 33 filling the trench 31T1. This allows only a part, of the insulating layer 33, covering the side surface 31TA of the trench 31T1 to remain, leading to a state where the Si {111} is exposed to the bottom surface 31TB of the trench 31T1 (FIG. 14B).

Figure 14C:
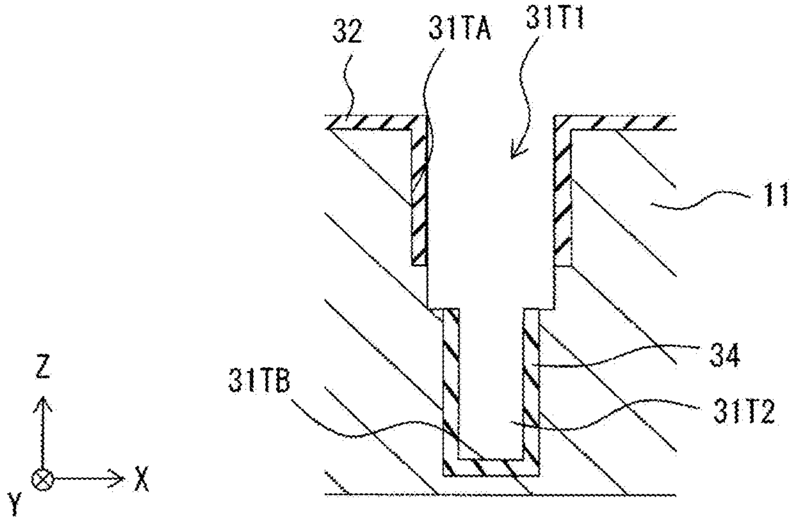
FIG. 14C is a cross-sectional view of one step subsequent to FIG. 14B.

Subsequently, as illustrated in FIG. 14C, the Si {111} constituting the semiconductor substrate 11 is partially removed by dry etchback to further dig down the bottom surface 31TB of the trench 31T1. This allows for formation, below the trench 31T1, of a trench 31T2 to be in communication with the trench 31T1. The Si {111} is exposed to a side surface and a bottom surface of the trench 31T2. Thereafter, the Si {111} exposed to the side surface and the bottom surface of the trench 31T2 is heated and thermally oxidized to thereby form an insulating layer 34 including $SiO_2$ or the like covering the side surface and the bottom surface of the trench 31T2. Further, only a part, of the insulating layer 33, covering the side surface 31TA is dissolved and removed by phosphoric acid or the like, for example. As a result, the Si {111} is exposed to a gap between the insulating layer 32 and the insulating layer 34.

Figure 14D:
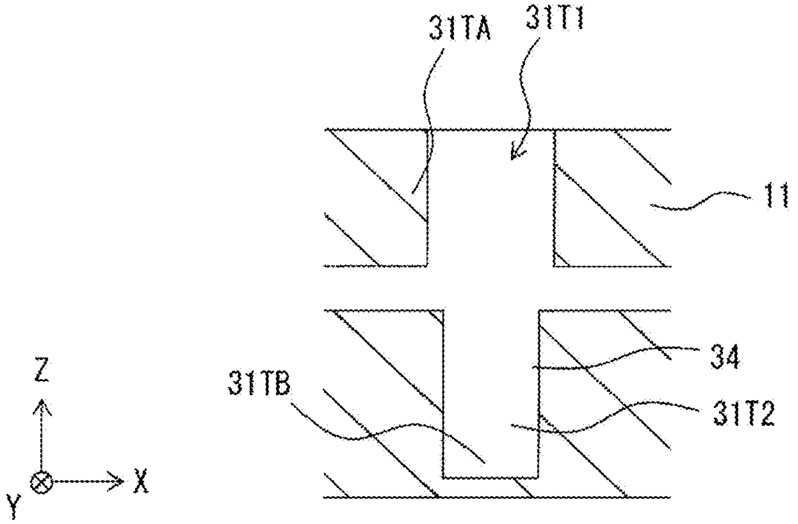
FIG. 14D is a cross-sectional view of one step subsequent to FIG. 14C.

Subsequently, as illustrated in FIG. 14D, the Si {111} exposed to the gap between the insulating layer 32 and the insulating layer 34 is subjected to crystalline anisotropic etching using an alkaline aqueous solution to thereby form a space 31Z. Thereafter, the insulating layer 32 and the insulating layer 34 are removed.

Figure 14E:
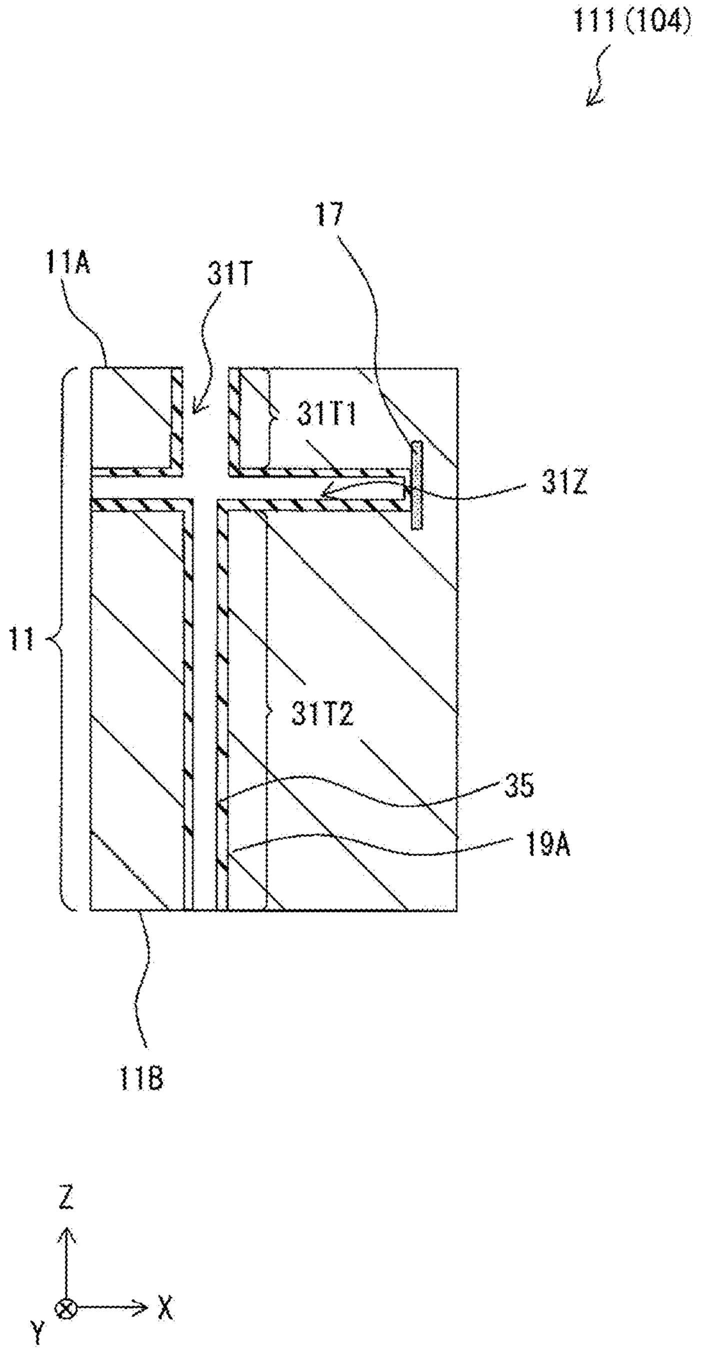
FIG. 14E is a cross-sectional view of one step subsequent to FIG. 14D.

Next, as illustrated in FIG. 14E, an insulating layer 35 such as an $SiO_2$ film containing, for example, P (phosphorus), which is an N type impurity element, is formed to cover inner surfaces of the trenches 31T1 and 31T2 and an inner surfaces of the space 31Z. Thereafter, the P (phosphorus) contained in the insulating layer 35 is solid-phase diffused by heat treatment to the inner surfaces of the trenches 31T1 and 31T2 and the inner surface of the space 31Z in the semiconductor substrate 11.

Figure 14F:
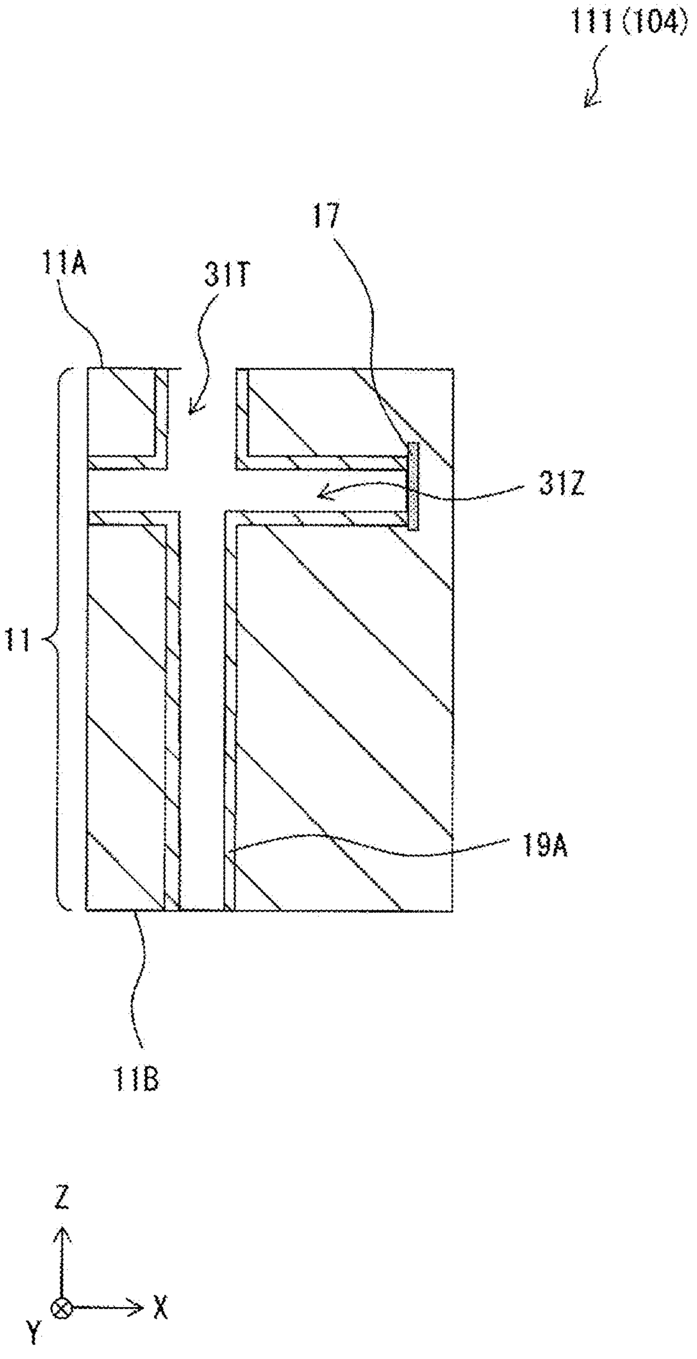
FIG. 14F is a cross-sectional view of one step subsequent to FIG. 14E.

Further, as illustrated in FIG. 14F, after removing the insulating layer 35, the heat treatment is performed again to diffuse the P (phosphorus) into the inside of the semiconductor substrate 11, thus forming an N type region 19A.

Figure 14G:
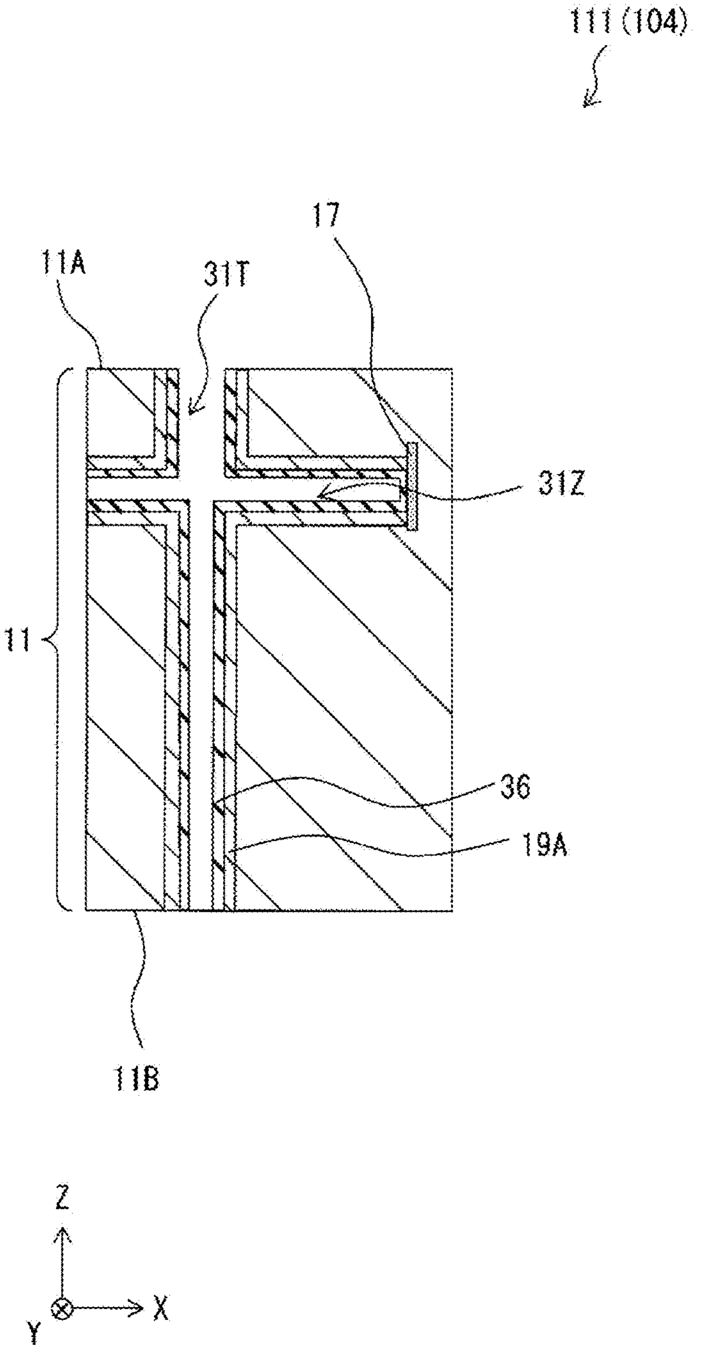
FIG. 14G is a cross-sectional view of one step subsequent to FIG. 14F.
Figure 14H:
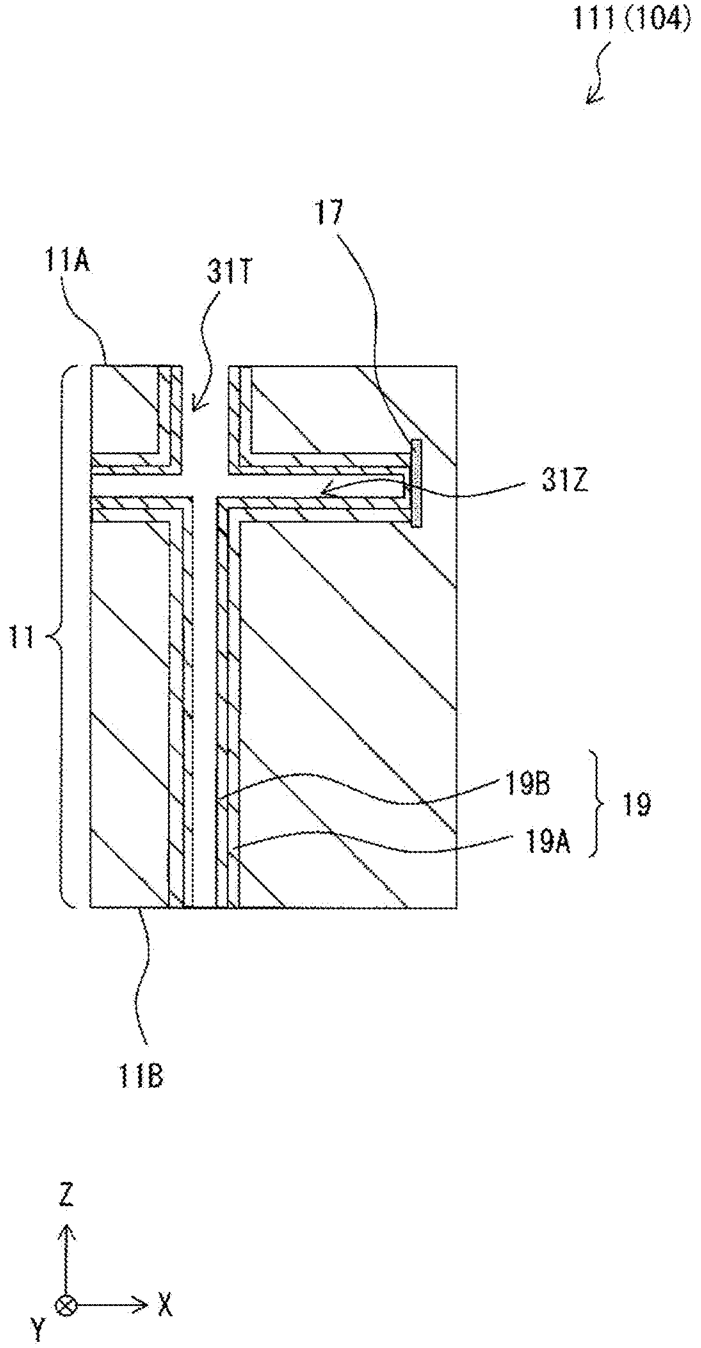
FIG. 14H is a cross-sectional view of one step subsequent to FIG. 14G.

Next, as illustrated in FIG. 14G, an insulating layer 36 such as an $SiO_2$ film containing B (boron), which is a P type impurity element, is formed to cover the N type region 19A. Thereafter, the heat treatment is used to solid-phase diffuse the B (boron) contained in the insulating layer 36 toward the inner surfaces of the trenches 31T1 and 31T2 and the inner surface of the space 31Z. As a result, as illustrated in FIG. 14H, it becomes possible to form a P type region 19B inside the N type region 19A, thus allowing the solid-phase diffusion layer 19 to be obtained.

Subsequently, the outer layer part 31B and the inner layer part 31A are sequentially formed to fill the trenches 31T1 and 31T2 and the space 31Z covered with the solid-phase diffusion layer 19, thereby forming the light-shielding section 31.

[Workings and Effects of Solid-State Imaging Device 104]

As described above, the solid-state imaging device 104 of the present embodiment includes the light-shielding section 31 that shields the MEM 54 from light and also functions as an element separation section separating photoelectric conversion sections 51 adjacent to each other, thus allowing for simplification of the structure and the manufacturing process. Further, the solid-state imaging device 104 is provided with the solid-phase diffusion layer 19 including a p-n junction around the light-shielding section 31 extending from the front surface 11A up to the back surface 11B, thus making it possible to expect an improvement in a pixel capacity Qs.

5. Modification of Fourth Embodiment

[Configuration of Solid-State Imaging Device 104A]

Figure 15:
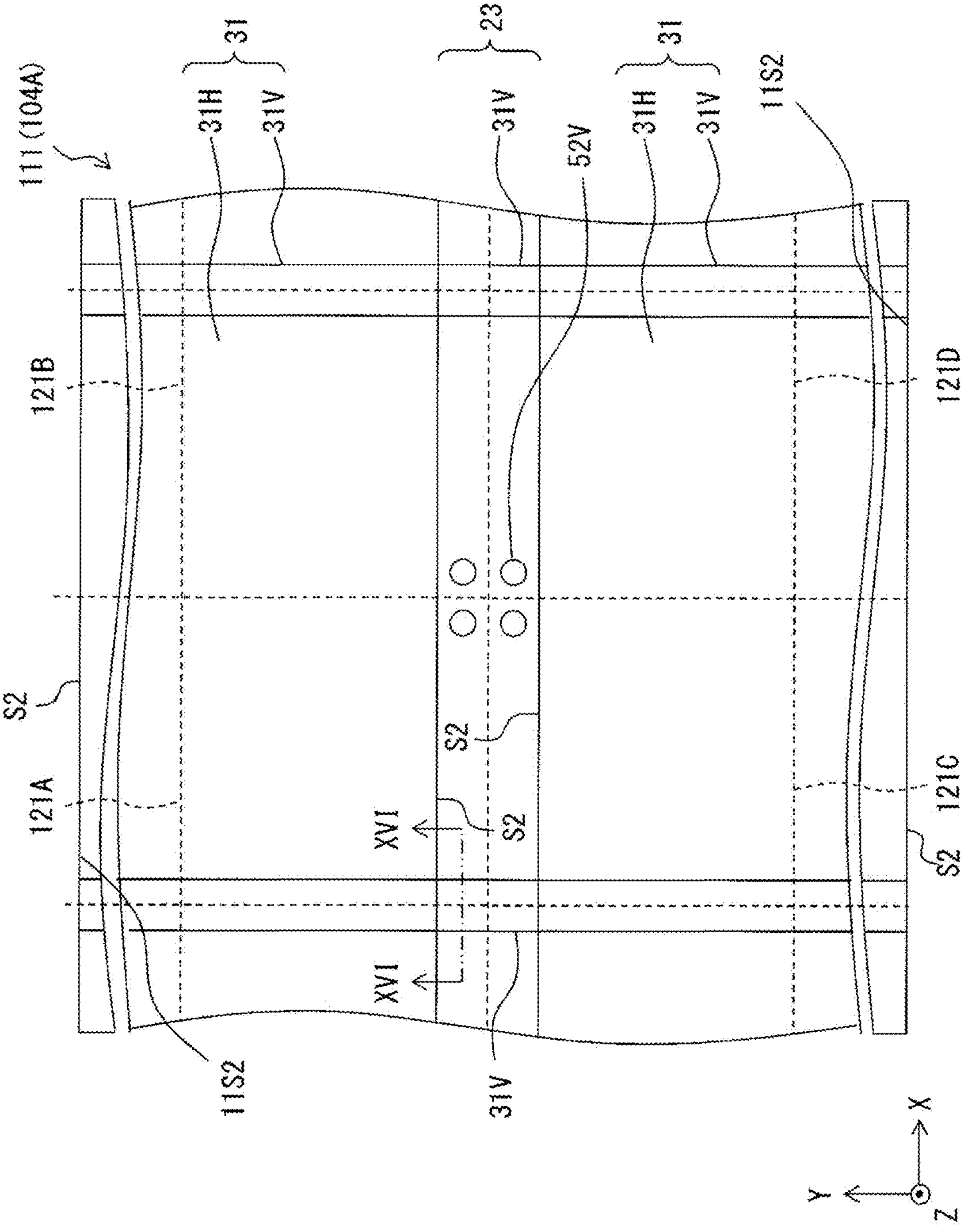
FIG. 15 is a plan view schematically illustrating a configuration of some of sensor pixels in a modification example of the imaging device according to the fourth embodiment of the present disclosure.

FIG. 15 is an enlarged plan view of a partial region of the pixel array section 111 in a solid-state imaging device 104A as a modification example of the fourth embodiment, and schematically illustrates configurations of the four sensor pixels 121A to 121D adjacent to each other. It is to be noted that FIG. 15 corresponds to FIG. 5B of the first embodiment, and mainly indicates a shape of the light-shielding section 31 with a solid line.

The solid-state imaging device 104A as the present modification example includes the band-shaped Si-remaining region 23 as in the solid-state imaging device 102 illustrated in FIG. 7. In the solid-state imaging device 104A, only the vertical light-shielding part 31V, of the light-shielding section 31, is provided in the band-shaped Si-remaining region 23, whereas no horizontal light-shielding part 31H extending in a horizontal plane is present in the band-shaped Si-remaining region 23. Except for this point, the solid-state imaging device 104A has substantially the same configuration, in other points, as that of the solid-state imaging device 104 as the foregoing fourth embodiment.

[Method of Manufacturing Solid-State Imaging Device 104A]

Here, description is given, with reference to FIGS. 16A to 16D, of a method of forming the light-shielding section 31 including only the vertical light-shielding part 31V in the band-shaped Si-remaining region 23. FIGS. 16A to 16D are each a cross-sectional view corresponding to a cross-section in a direction of an arrow along a line XVI-XVI indicated in FIG. 15. The method of forming the light-shielding section 31 to be formed on a region other than the band-shaped Si-remaining region 23 is similar to that in the foregoing fourth embodiment, and thus the description thereof is omitted.

Figure 16A:
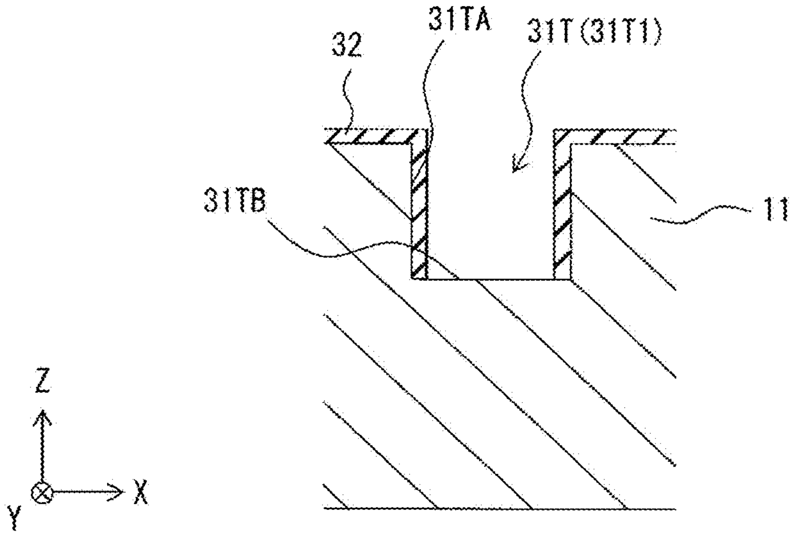
FIG. 16A is a cross-sectional view of one step in a method of manufacturing the imaging device illustrated in FIG. 15.

First, as illustrated in FIG. 16A, similarly to the solid-state imaging device 104 of the fourth embodiment, the trench 31T (31T1) is formed at a position where the vertical light-shielding part 31V is to be formed. At that time, an insulating layer 32 is selectively formed, as a film, using $SiO_2$ or the like to cover the front surface 11A, and thereafter the insulating layer 32 is used as a hard mask to partially remove the Si {111} constituting the semiconductor substrate 11 by dry etchback. The depth of the trench 31T1 at this time corresponds to a dimension in the Z-axis direction of a part, of the vertical light-shielding part 31V formed subsequently, above the horizontal light-shielding part 31H. Next, the insulating layer 32 is further formed to cover the side surface 31TA and the bottom surface 31TB of the trench 31T1. Thereafter, the dry etchback is used to remove only a part, of the insulating layer 32, covering the bottom surface 31TB.

Figure 16B:
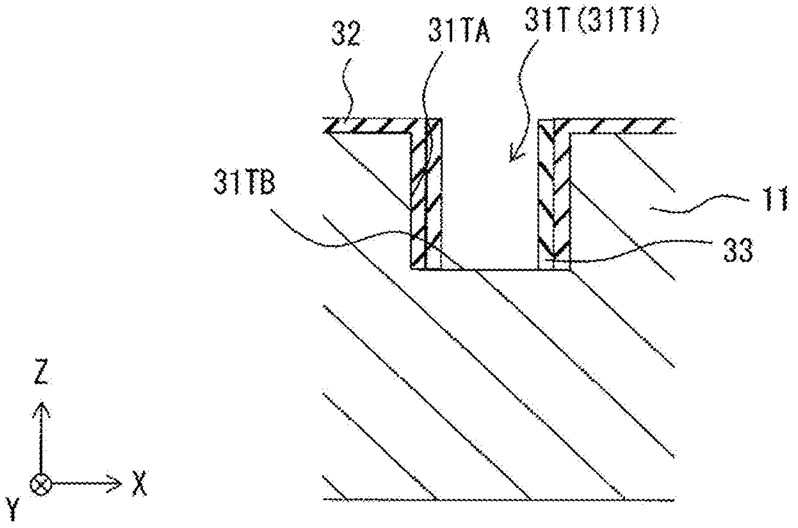
FIG. 16B is a cross-sectional view of one step subsequent to FIG. 16A.

Subsequently, in the trench 31T1 of a region other than the band-shaped Si-remaining region 23, as illustrated in FIG. 14B, an operation is performed, in which the Si {111} constituting the semiconductor substrate 11 is partially removed by dry etchback to further dig down the bottom surface 31TB of the trench 31T1. At this time, the trench 31T1 of the band-shaped Si-remaining region 23 is selectively protected by a resist mask not to allow the bottom surface 31TB of the trench 31T1 to be dug down. After removing the resist mask, as illustrated in FIG. 16B, the insulating layer 33 is formed all over using SiN, for example, to fill the trench 31T1, and then the dry etchback is used to partially remove the insulating layer 33 filling the trench 31T1. This allows only a part, of the insulating layer 33, covering the side surface 31TA of the trench 31T1 to remain, leading to a state where the Si {111} is exposed to the bottom surface 31TB of the trench 31T1 (FIG. 16B).

Figure 16C:
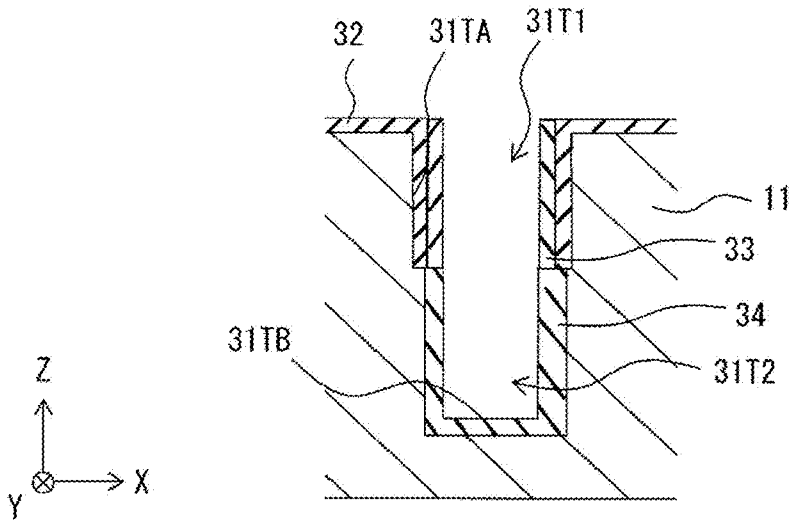
FIG. 16C is a cross-sectional view of one step subsequent to FIG. 16B.
Figure 16D:
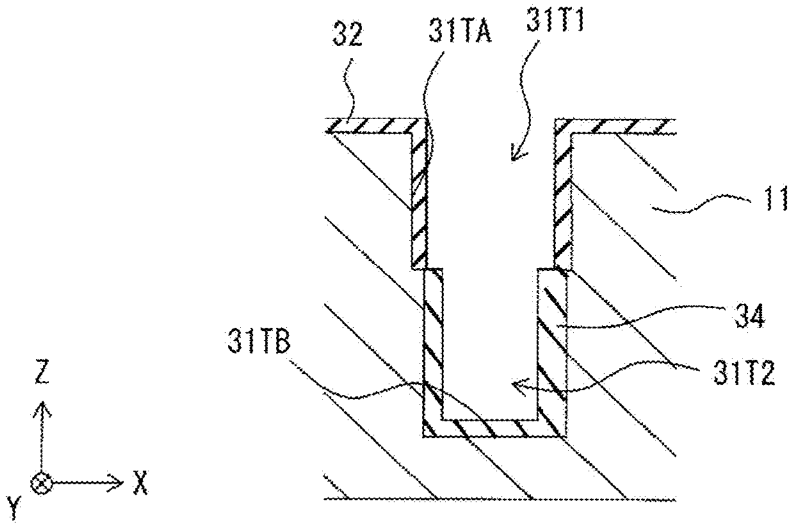
FIG. 16D is a cross-sectional view of one step subsequent to FIG. 16C.

Subsequently, as illustrated in FIG. 16C, the Si {111} constituting the semiconductor substrate 11 is partially removed by dry etchback to further dig down the bottom surface 31TB of the trench 31T1. This allows for formation, below the trench 31T1, of the trench 31T2 to be in communication with the trench 31T1. The Si {111} is exposed to a side surface and a bottom surface of the trench 31T2. Thereafter, the Si {111} exposed to the side surface and the bottom surface of the trench 31T2 is heated and thermally oxidized to thereby form the insulating layer 34 including $SiO_2$ or the like covering the side surface and the bottom surface of the trench 31T2. Further, only a part, of the insulating layer 33, covering the side surface 31TA is dissolved and removed by phosphoric acid or the like, for example. As a result, as illustrated in FIG. 16D, a series of the trenches 31T appears which is covered with the insulating layers 32 to 34 without gap. It is to be noted that even in a case where a step difference is generated at a joint portion between a trench T1 and a trench T2, the thickness of the insulating layer 34 is appropriately adjusted, thereby making it possible to avoid exposure of the Si {111} to the gap between the insulating layer 32 and the insulating layer 34.

Thereafter, in the trench 31T1 of a region other than the band-shaped Si-remaining region 23, as illustrated in FIG. 14D, the space 31Z is formed by carrying out crystalline anisotropic etching using an alkaline aqueous solution. However, the Si {111} is not exposed in the band-shaped Si-remaining region 23, and thus the Si {111} is not etched. Further, sequentially performing the steps of FIGS. 14E to 14H completes the formation of the light-shielding section 31 including only the vertical light-shielding part 31V without including the horizontal light-shielding part 31H in the band-shaped Si-remaining region 23.

[Workings and Effects of Solid-State Imaging Device 104A]

As described above, according to the solid-state imaging device 104A as the present modification example, an area of the Si-remaining region 23 is larger than an area of the Si-remaining region 22 of the solid-state imaging device 101 according to the foregoing first embodiment, thus making it possible to enhance mechanical strength at the time of forming the space 31Z. In addition, according to the method of manufacturing the solid-state imaging device 104A, it is possible to achieve the manufacture of the solid-state imaging device 104A.

6. Fifth Embodiment

[Configuration of Solid-State Imaging Device 105]

Figure 17:
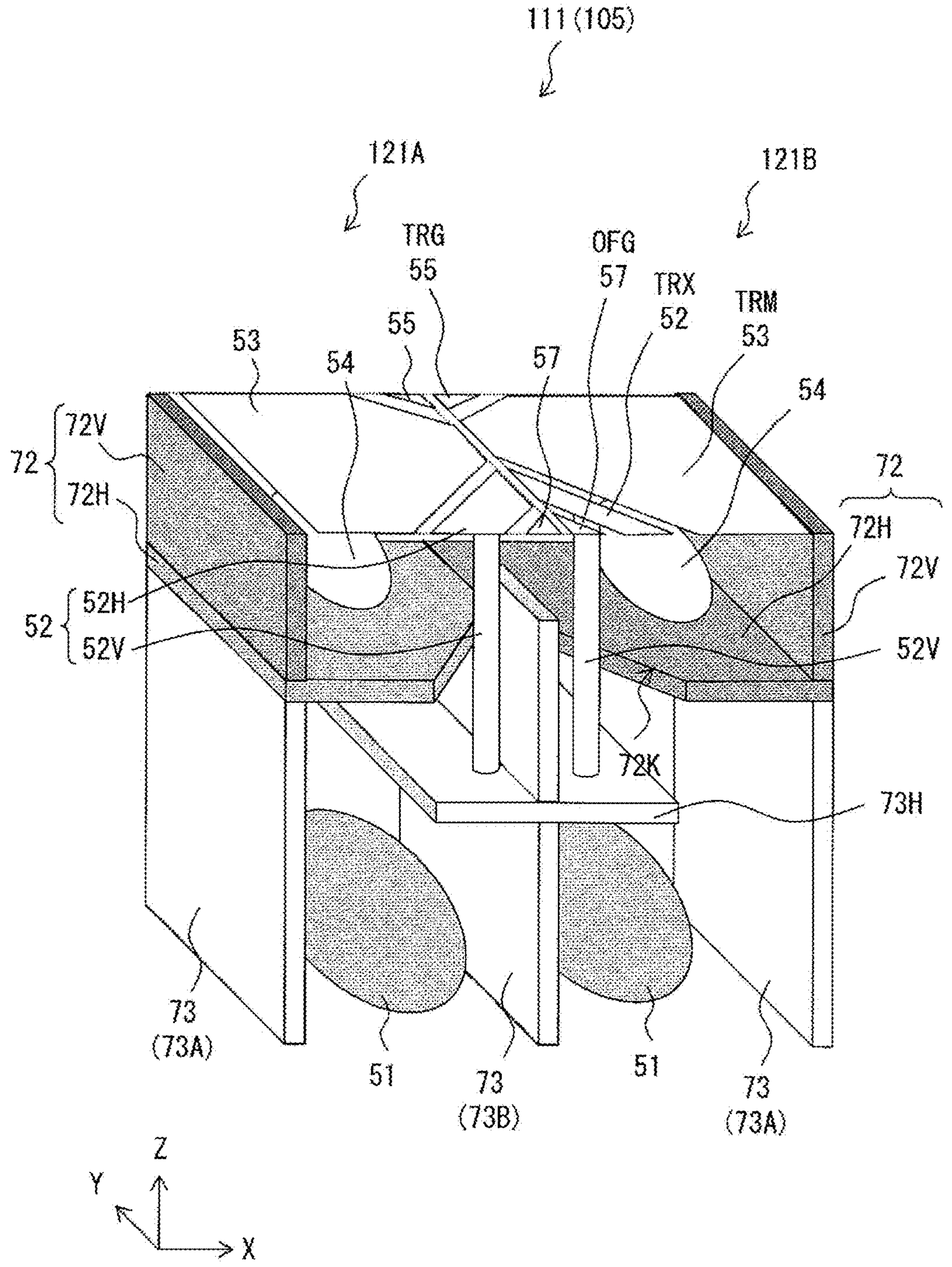
FIG. 17 is a perspective view schematically illustrating a configuration of some of sensor pixels in an imaging device according to a fifth embodiment of the present disclosure.
Figure 18:
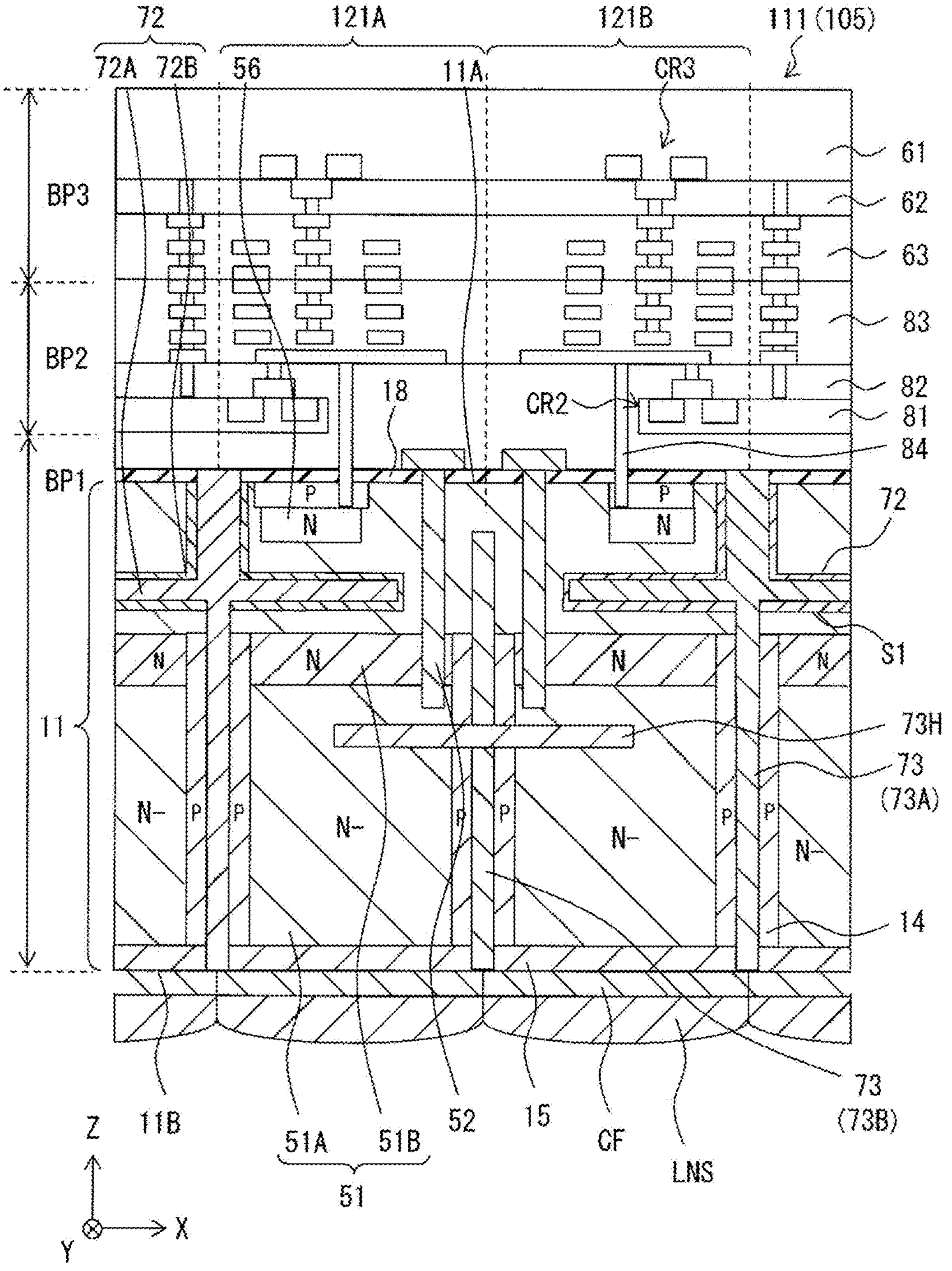
FIG. 18 is a cross-sectional view schematically illustrating a configuration of some of the sensor pixels in the imaging device illustrated in FIG. 17.

FIG. 17 is a perspective view schematically illustrating some of configurations of any two sensor pixels 121A and 121B adjacent to each other in a solid-state imaging device 105 according to a fifth embodiment of the present technology, and corresponds to FIG. 3 of the first embodiment. In addition, FIG. 18 illustrates a cross-sectional configuration of the solid-state imaging device 105.

The solid-state imaging device 105 has a three-dimensional structure in which three substrates, i.e., a first substrate BP1, a second substrate BP2, and a third substrate BP3 are stacked in order. The first substrate BP1 is provided with a plurality of sensor pixels 121 in the semiconductor substrate 11. The second substrate BP2 includes a semiconductor substrate 81 including a readout circuit CR2, an insulating layer 82 embedding the semiconductor substrate 81 and joined to the first substrate BP1, and a wiring layer 83 joined to the third substrate BP3. The second substrate BP2 further includes a through wiring line 84 coupling together the wiring layer 83 and the FD 56 in the sensor pixel 121 of the first substrate BP1. The readout circuit CR2 outputs a pixel signal based on charges outputted from the sensor pixel 121. A plurality of pixel drive lines 122 and a plurality of vertical signal lines 123 are formed in the wiring layer 83. The third substrate BP3 includes a semiconductor substrate 61 including a logic circuit CR3, a wiring layer 63 joined to the wiring layer 83 of the second substrate BP2, and an insulating layer 62 provided between the semiconductor substrate 61 and the wiring layer 63. The logic circuit CR3 includes, for example, the vertical drive section 112, the ramp wave module 113, the column signal processing section 114, the clock module 115, the data storage section 116, the horizontal drive section 117, the system control section 118, and the signal processing section 119, etc.

The sensor pixel 121 in the solid-state imaging device 105 includes a light-shielding section 72 instead of the light-shielding section 12, and includes an element separation section 73 instead of the element separation section 13. Except for these points, the sensor pixel 121 in the solid-state imaging device 105 have substantially the same configuration, in other points, as that of the sensor pixel 121 in the solid-state imaging device 101.

The light-shielding section 72 has, for example, a two-layer structure of an inner layer part 72A and an outer layer part 72B surrounding the periphery thereof. Similarly to the inner layer part 12A, the inner layer part 72A includes, for example, a material having a light-shielding property including at least one of a single metal, a metal alloy, a metal nitride, or a metal silicide. The outer layer part 72B is a solid-phase diffusion layer including a p-n junction between a P type region and an N type region, similarly to the solid-phase diffusion layer 19. In addition, similarly to the light-shielding section 12, the light-shielding section 72 includes a horizontal light-shielding part 72H provided on side opposite to the back surface 11B as viewed from the photoelectric conversion section 51 and extending along the horizontal plane, and a vertical light-shielding part 72V extending along the YZ plane to be orthogonal to the horizontal light-shielding part 72H. The horizontal light-shielding part 72H functions as a reflector, and functions to suppress generation of a noise due to incidence of light transmitted through the photoelectric conversion section 51 on the MEM 54. In addition, the vertical light-shielding part 72V functions to prevent generation of a noise such as color mixture due to incidence of leakage light from a neighboring sensor pixel 121 on the photoelectric conversion section 51. The horizontal light-shielding part 72H is provided with an opening 72K to be penetrated by the vertical terminal section 52V. The element separation section 73 is a wall-like member extending in the Z-axis direction to penetrate the semiconductor substrate 11 at a boundary position between the sensor pixels 121 adjacent to each other and surrounding each photoelectric conversion section 51. The element separation section 73 allows the sensor pixels 121 adjacent to each other to be electrically separated. It is to be noted that, in FIGS. 17 and 18, among the element separation sections 73, the one provided at a position corresponding to the vertical light-shielding part 72V in the Z-axis direction is denoted by an element separation section 73A, whereas the one including a portion at a position corresponding to the opening 72K in the Z-axis direction is denoted by an element separation section 73B. The element separation section 73B includes a horizontal light-shielding part 73H overlapping a region corresponding to the opening 72K in the Z-axis direction.

[Method of Manufacturing Solid-State Imaging Device 105]

Next, description is given, with reference to FIGS. 19A to 19D, of a method of manufacturing the solid-state imaging device 105. FIGS. 19A to 19D are each a cross-sectional view of a step of manufacturing the solid-state imaging device 105, and correspond to FIG. 18.

Figure 19A:
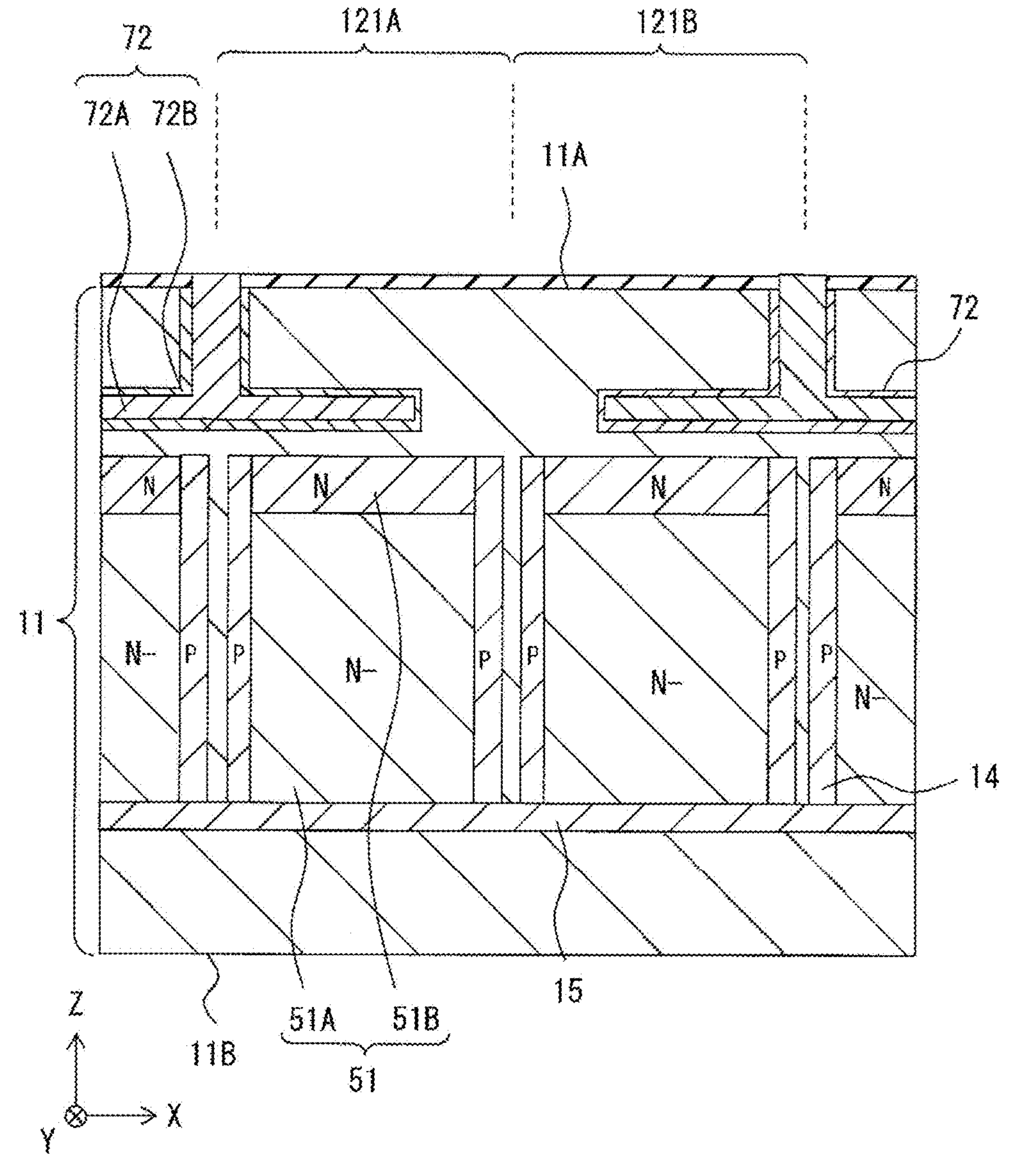
FIG. 19A is a cross-sectional view of one step in a method of manufacturing the imaging device illustrated in FIG. 18.

First, as illustrated in FIG. 19A, the semiconductor substrate 11 is prepared, in which the photoelectric conversion section 51, the P type semiconductor region 14, the fixed-charge film 15, and the etching stopper 17 are formed at respective predetermined positions. Thereafter, the light-shielding section 72 is formed similarly to the light-shielding section 12 of the solid-state imaging device 101 of the foregoing first embodiment. However, the inner layer part 72A is formed by a temporary filling material such as polysilicon. In addition, the outer layer part 72B, which is a solid-phase diffusion layer, is formed similarly to the solid-phase diffusion layer 19 in the solid-state imaging device 104 of the foregoing fourth embodiment.

Figure 19B:
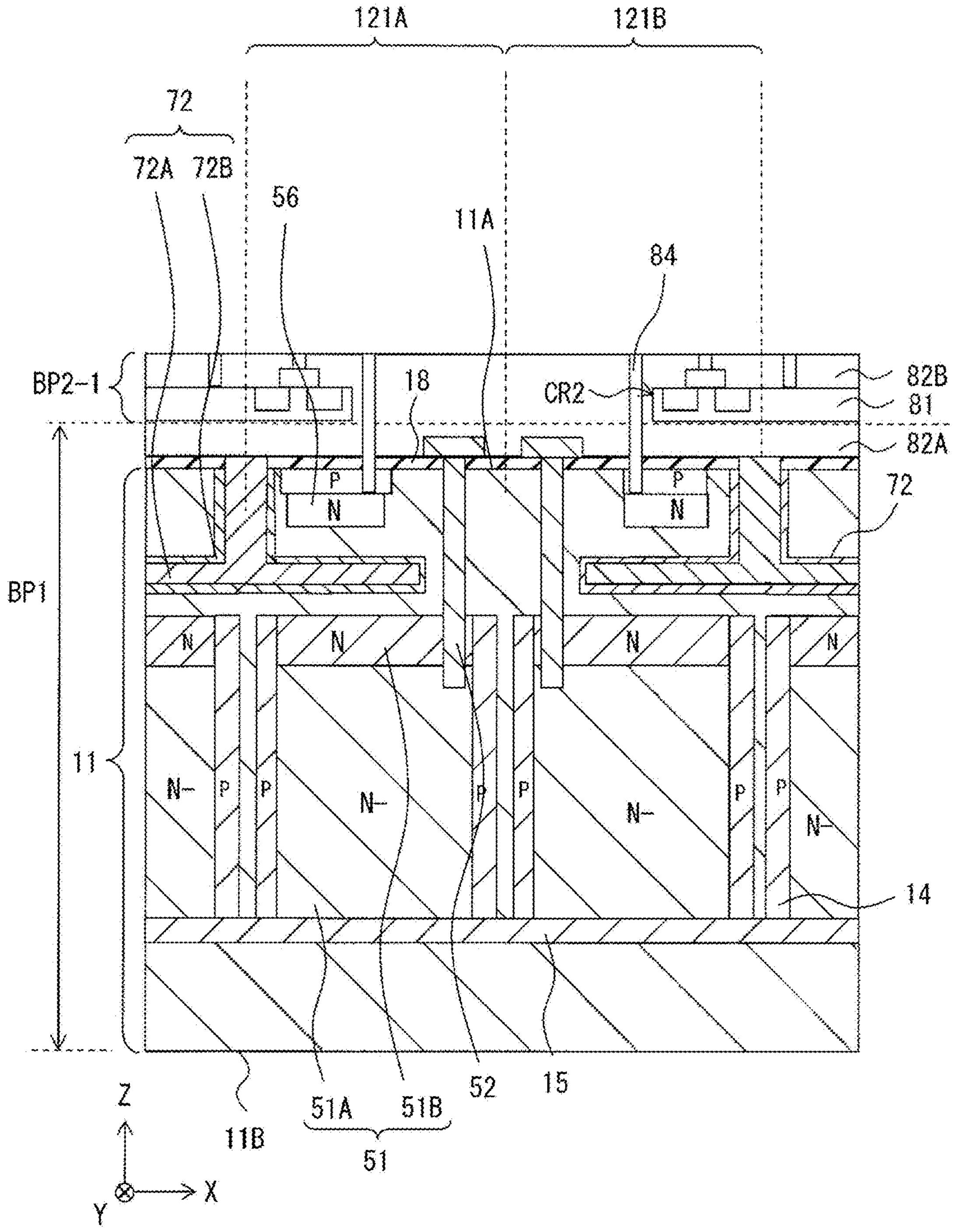
FIG. 19B is a cross-sectional view of one step subsequent to FIG. 19A.

Next, as illustrated in FIG. 19B, the TRX 52, the TRM 53, the MEM 54, the TRG 55, and the OFG 57 are formed using a known method on the front surface 11A of the semiconductor substrate 11, and an insulating layer 82A that covers the TRX 52, the TRM 53, the MEM 54, the TRG 55, and the OFG 57. Thereafter, a second substrate lower part BP2-1 including an insulating layer 82B in which the semiconductor substrate 81 including the readout circuit CR2 is embedded is joined to an upper surface of the insulating layer 82A. The insulating layer 82A and the insulating layer 82B are joined to form the insulating layer 82. Thereafter, the through wiring line 84 is further formed to penetrate the second substrate lower part BP2-1.

Figure 19C:
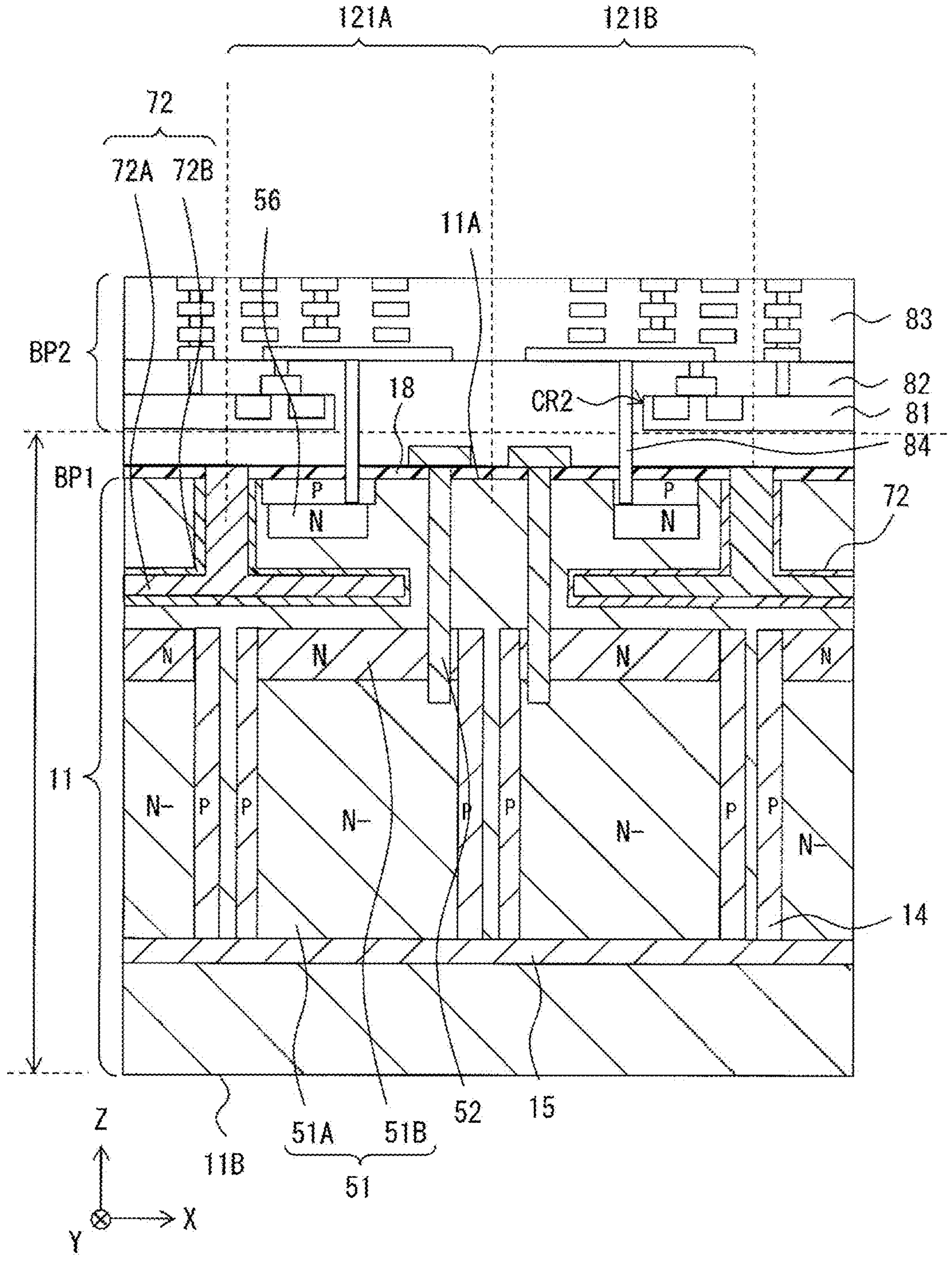
FIG. 19C is a cross-sectional view of one step subsequent to FIG. 19B.

Next, as illustrated in FIG. 19C, the wiring layer 83 is formed on the second substrate lower part BP2-1. This leads to a state where the second substrate BP2 is provided on the first substrate BP1. Thereafter, the semiconductor substrate 11 is thinned from side of the back surface 11B.

Figure 19D:
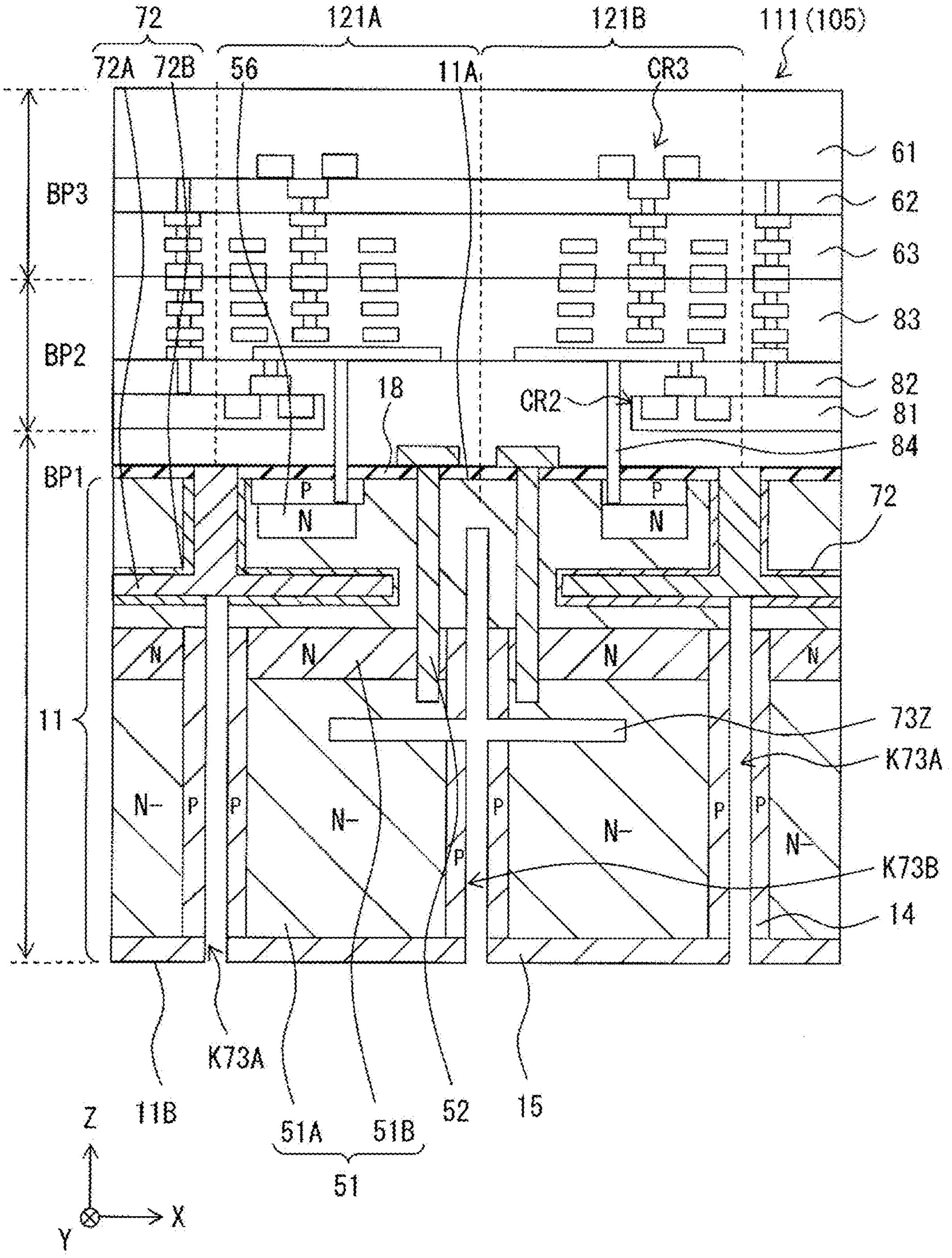
FIG. 19D is a cross-sectional view of one step subsequent to FIG. 19C.

Next, as illustrated in FIG. 19D, the third substrate BP3 is prepared, and the wiring layer 83 of the second substrate BP2 and the wiring layer 63 of the third substrate BP3 are joined to face each other.

Thereafter, the element separation section 73 is formed from side of the back surface 11B. Specifically, first, as illustrated in FIG. 19D, a long hole K73A and a long hole K73B both extending in the Z-axis direction are formed by digging down the semiconductor substrate 11 from the side of the back surface 11B at positions where the element separation section 73A and the element separation section 73B are to be formed, respectively. At this time, the long hole K73A is formed to reach the light-shielding section 72. Subsequently, the temporary filling material filled as the inner layer part 72A is removed, followed by refilling of a material having a light-shielding property including at least one of a single metal, a metal alloy, a metal nitride, or a metal silicide, thereby forming the element separation section 73A. Meanwhile, a method similar to that of the horizontal light-shielding part 72H, i.e., crystalline anisotropic etching using an etching solution such as an alkaline aqueous solution is adopted to form a space 73Z for formation of the horizontal light-shielding part 73H of the element separation section 73B. Thereafter, the long hole K73B and the space 73Z are filled with the material having a light-shielding property including at least one of a single metal, a metal alloy, a metal nitride, or a metal silicide to thereby form the element separation section 73B including the horizontal light-shielding part 73H. Note that it is desirable to simultaneously perform the formation of the long hole K73A and the formation of the long hole K73B, and then to simultaneously perform the above-described refilling of the long hole K73A with the material having the light-shielding property and the above-described filling of the long hole K73B and the space 73Z with the material having the light-shielding property. However, the formation of the long hole K73A and the formation of the long hole K73B may be performed separately, or the refilling operation of the long hole K73A and the filling operation of the long hole K73B may be performed separately. Finally, the color filter CF and the light-receiving lens LNS are joined in order onto the back surface 11B to thereby complete the solid-state imaging device 105.

[Workings and Effects of Solid-State Imaging Device 105]

As described above, it is possible, in the solid-state imaging device 105, to form the second substrate BP2 including the readout circuit CR2 and the third substrate BP3 including the logic circuit CR3 separately from the first substrate BP1 including the sensor pixel 121, and then to stack the first to third substrates BP1 to BP3. Therefore, a general-purpose product may be used as the readout circuit CR2 or the logic circuit CR3, thus making it possible to enhance the degree of freedom in designing and to expect suppression of manufacturing costs.

In addition, in the solid-state imaging device 105, the element separation section 73 is also provided with the horizontal light-shielding part 73H. This further enhance the light-shielding property for the MEM 54 and the FD 56. In addition, the mechanical strength is also improved. Further, it is considered that charges are transferred more smoothly as compared with the configuration in which two light-shielding sections 12 and 24 are provided as in the solid-state imaging device 103 of the foregoing third embodiment.

7. Sixth Embodiment

[Configuration of Solid-State Imaging Device 106]

Figure 20:
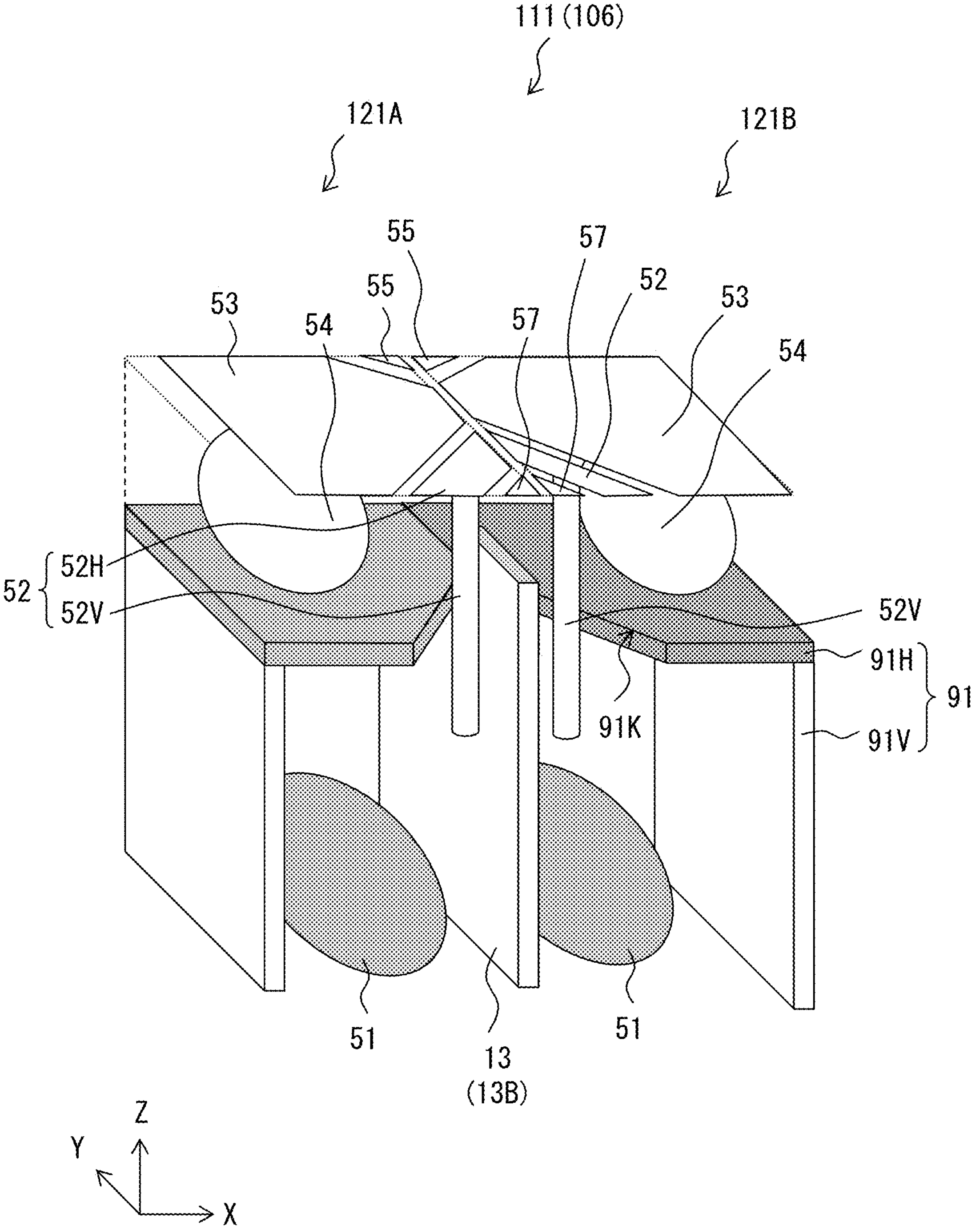
FIG. 20 is a perspective view schematically illustrating a configuration of some of sensor pixels in an imaging device according to a sixth embodiment of the present disclosure.
Figure 21:
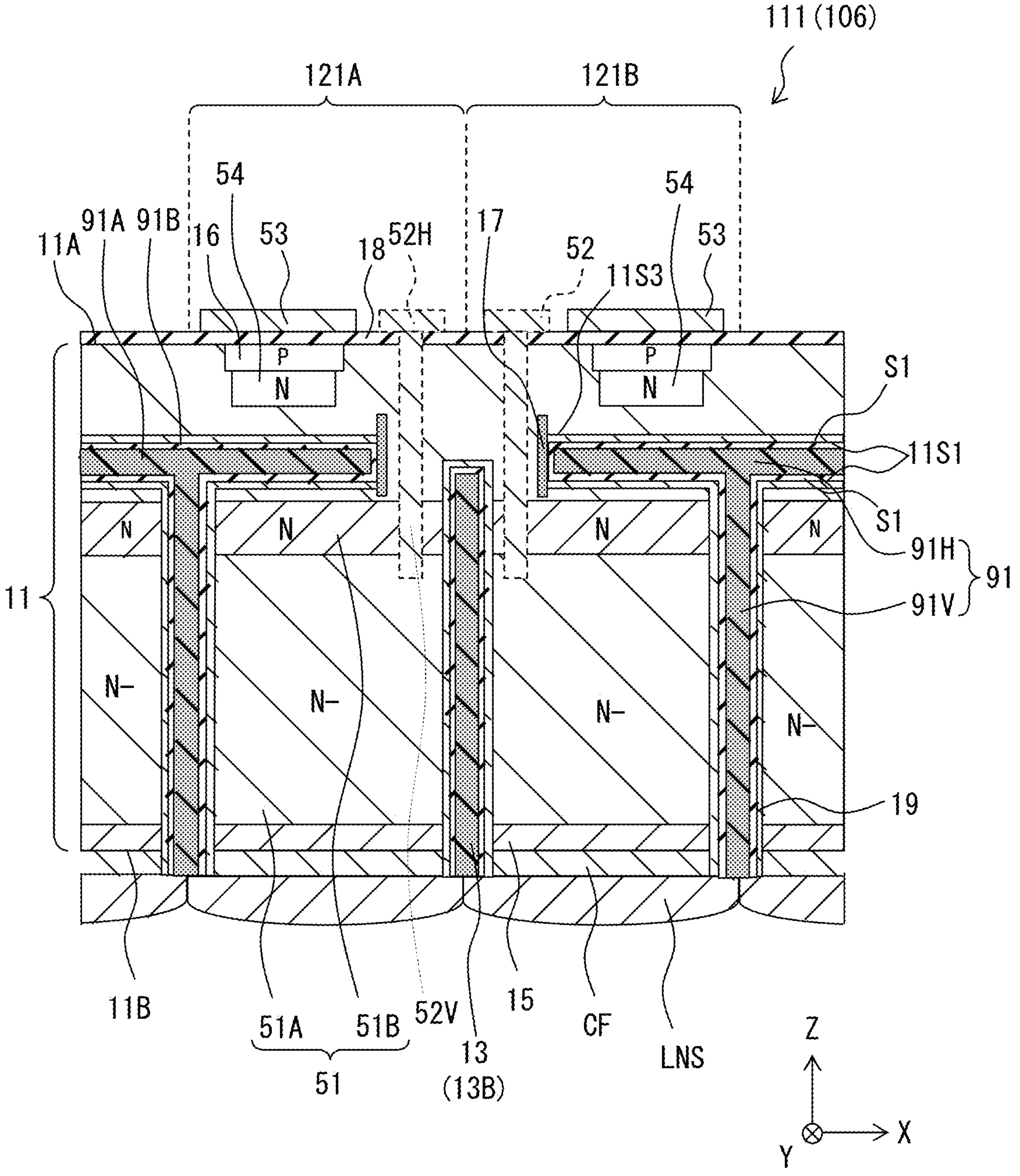
FIG. 21 is a cross-sectional view schematically illustrating a configuration of some of the sensor pixels in the imaging device illustrated in FIG. 20.

FIG. 20 is a perspective view schematically illustrating configurations of any two sensor pixels 121A and 121B adjacent to each other in a solid-state imaging device 106 according to a sixth embodiment of the present technology. FIG. 21 schematically illustrates cross-sectional configurations of the sensor pixels 121A and 121B.

In the solid-state imaging device 101 of the first embodiment, the vertical light-shielding part 12V and the horizontal light-shielding part 12H constituting the light-shielding section 12 are formed by etching from the front surface 11A of the semiconductor substrate 11. In contrast, in the solid-state imaging device 106 according to the present embodiment, a horizontal light-shielding part and an element separation section are integrated by etching from the back surface 11B of the semiconductor substrate 11. In addition, the solid-state imaging device 106 according to the present embodiment includes no horizontal light-shielding part 12H. That is, the solid-state imaging device 106 is provided with a light-shielding section 91 including a vertical light-shielding part 91V corresponding to the element separation section 13 of the foregoing first embodiment, and a horizontal light-shielding part 91H extending in a horizontal plane to be orthogonal to the vertical light-shielding part 91V. Similarly to the light-shielding section 31 of the foregoing fourth embodiment, the light-shielding section 91 has a two-layer structure of an inner layer part 91A and an outer layer part 91B surrounding the periphery thereof. The inner layer part 91A and the outer layer part 91B are configured by, for example, the same type of materials as those of the inner layer part 12A and the outer layer part 12B, respectively. Further, the solid-phase diffusion layer 19 including a P type region and an N type region is formed around the light-shielding section 91. Except for these points, the solid-state imaging device 106 has a substantially similar configuration, in other points, to that of the solid-state imaging device 101 according to the foregoing first embodiment.

[Method of Manufacturing Solid-State Imaging Device 106]

Next, description is given, with reference to FIGS. 22A to 22F, of an example of a method of manufacturing the solid-state imaging device 106.

Figure 22A:
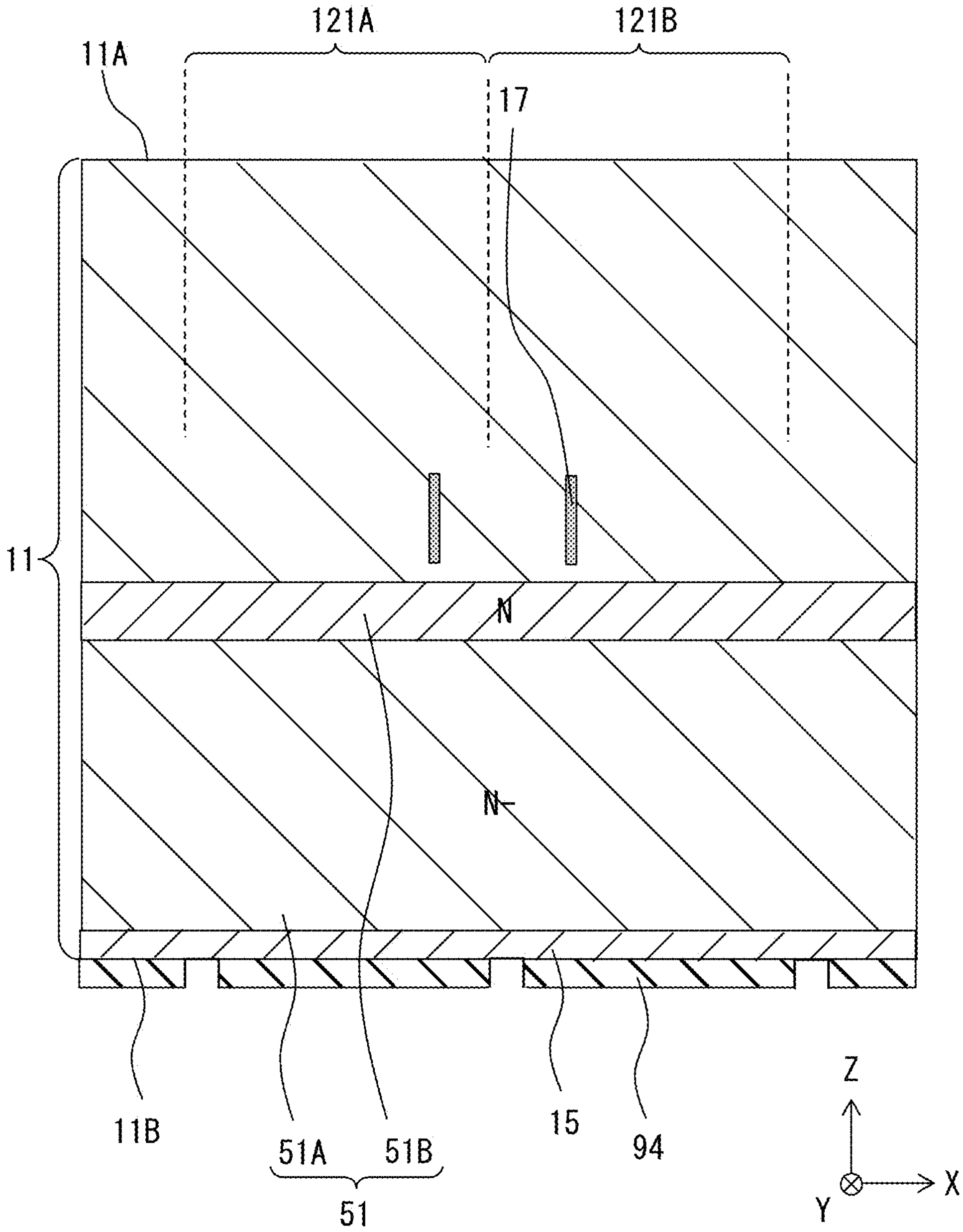
FIG. 22A is a cross-sectional view of one step in a method of manufacturing the imaging device illustrated in FIG. 20.

First, as illustrated in FIG. 22A, the semiconductor substrate 11 is prepared in which the etching stopper 17, the photoelectric conversion section 51, and the fixed-charge film 15 are each formed, and thereafter an insulating layer 94 is formed as the hard mask HM selectively covering the back surface 11B of the semiconductor substrate 11.

Figure 22B:
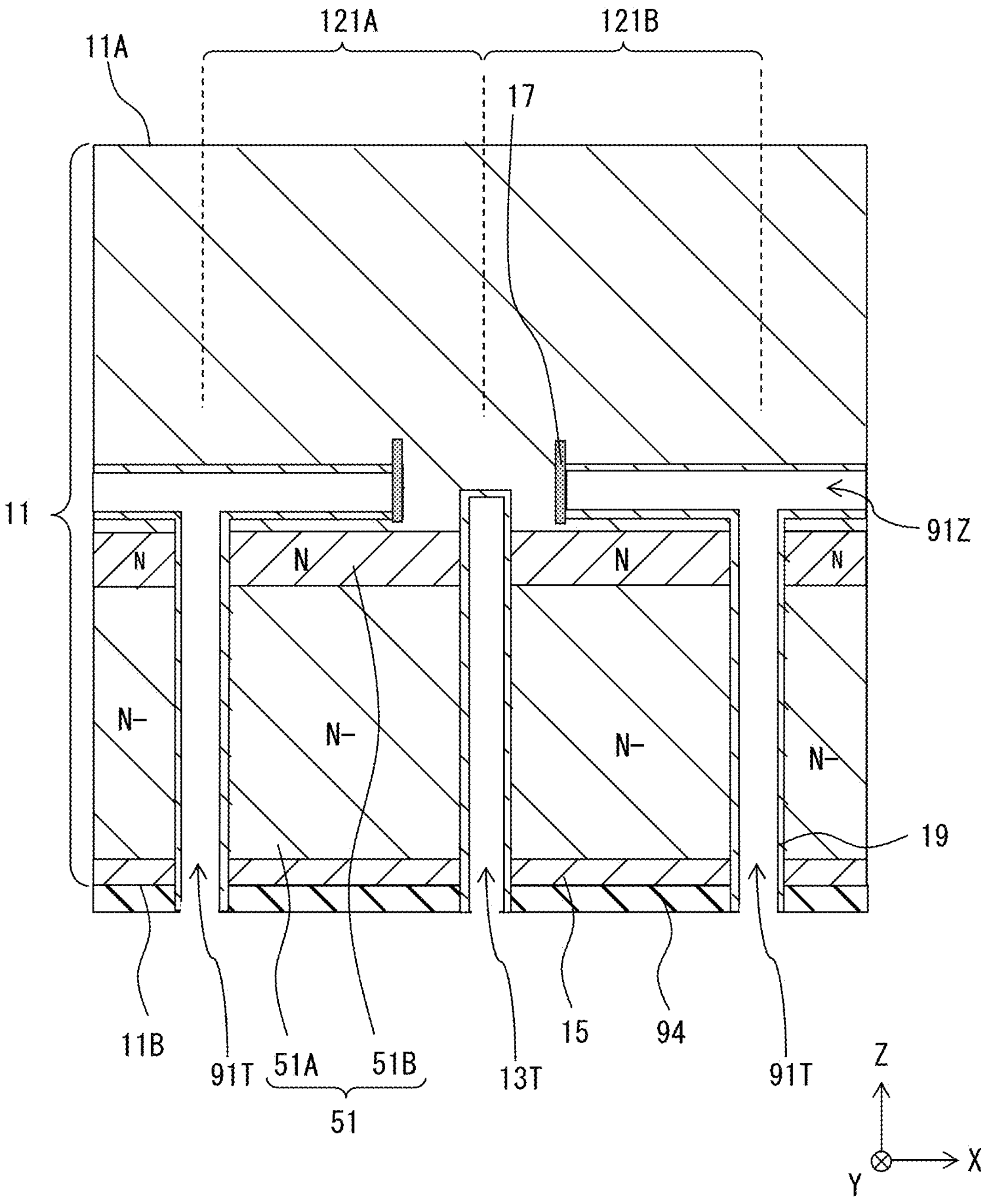
FIG. 22B is a cross-sectional view of one step subsequent to FIG. 22A.

Next, as illustrated in FIG. 22B, there are formed trenches 13T and 91T at positions where the vertical light-shielding part 91V and the element separation section 13 are to be formed, a space 91Z to be in communication with the trench 91T, and the solid-phase diffusion layer 19 including an N type region on outer side and a P type region on inner side. At that time, first, similarly to the trench 12T and the space 12Z in the first embodiment, the trench 91T and the space 91Z are formed from the back surface 11B, and then the trench 13T is formed. Thereafter, the solid-phase diffusion layer 19 is formed similarly to the solid-state imaging device 104 of the fourth embodiment.

Figure 22C:
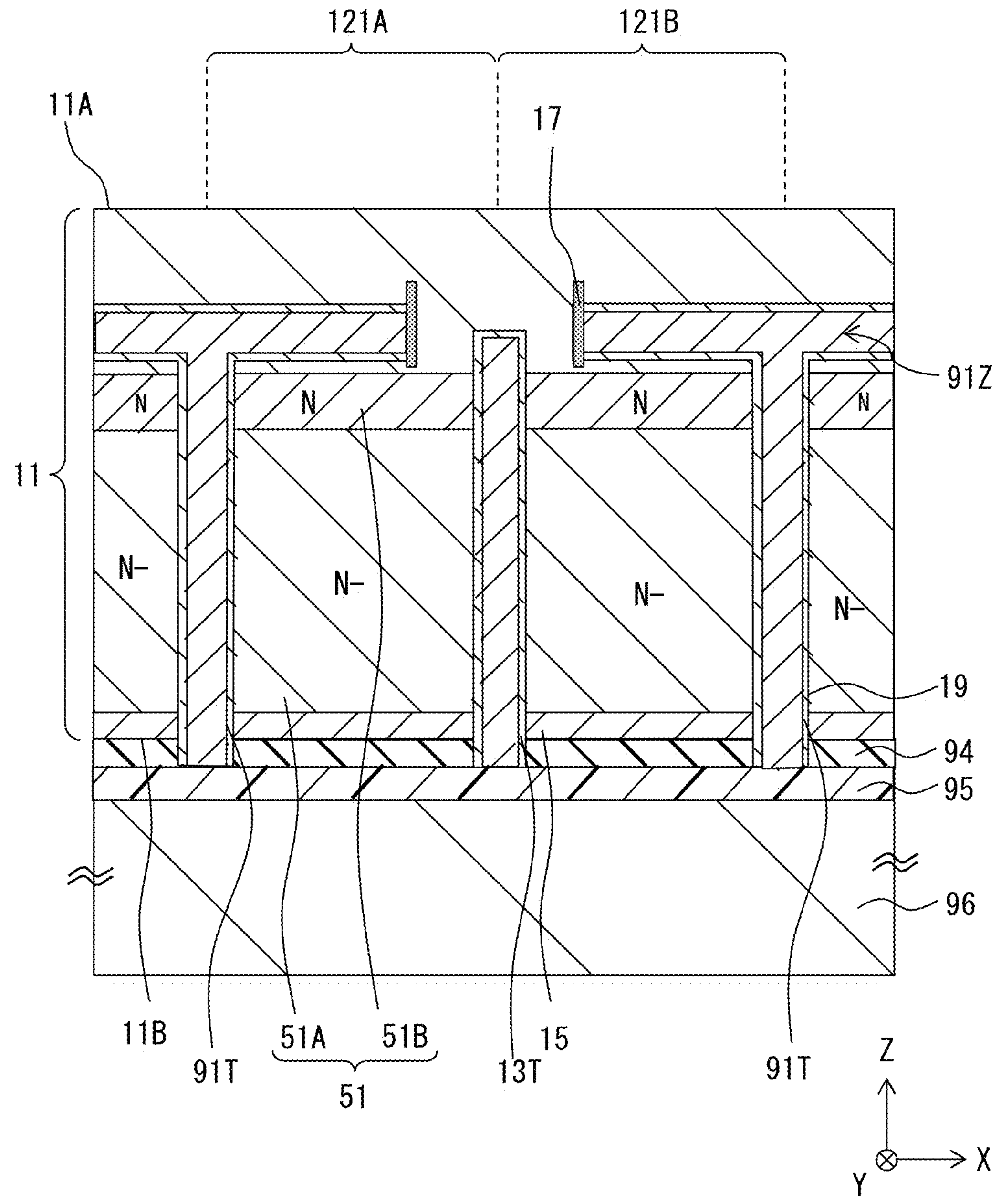
FIG. 22C is a cross-sectional view of one step subsequent to FIG. 22B.

Subsequently, as illustrated in FIG. 22C, after temporarily filling the trenches 13T and 91T and the space 91Z, the back surface 11B of the semiconductor substrate 11 is joined to a temporary substrate 96, with an insulating layer 95 interposed therebetween, and the front surface 11A of the semiconductor substrate 11 is thinned. At that time, a material having relatively superior heat resistance, such as $SiO_2$, SiN, or polysilicone is used to temporarily fill the trenches 13T and 91T and the space 91Z.

Figure 22D:
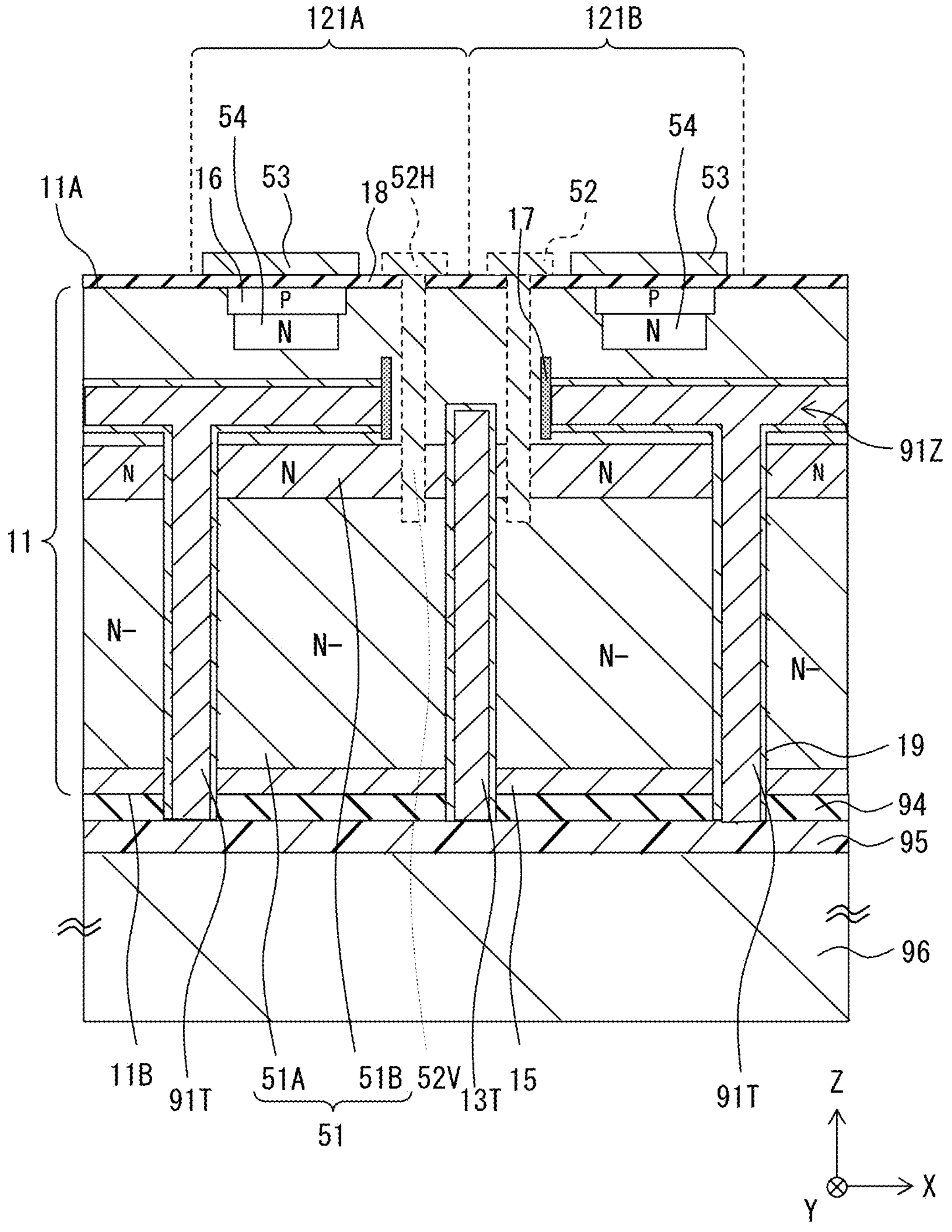
FIG. 22D is a cross-sectional view of one step subsequent to FIG. 22C.
Figure 22E:
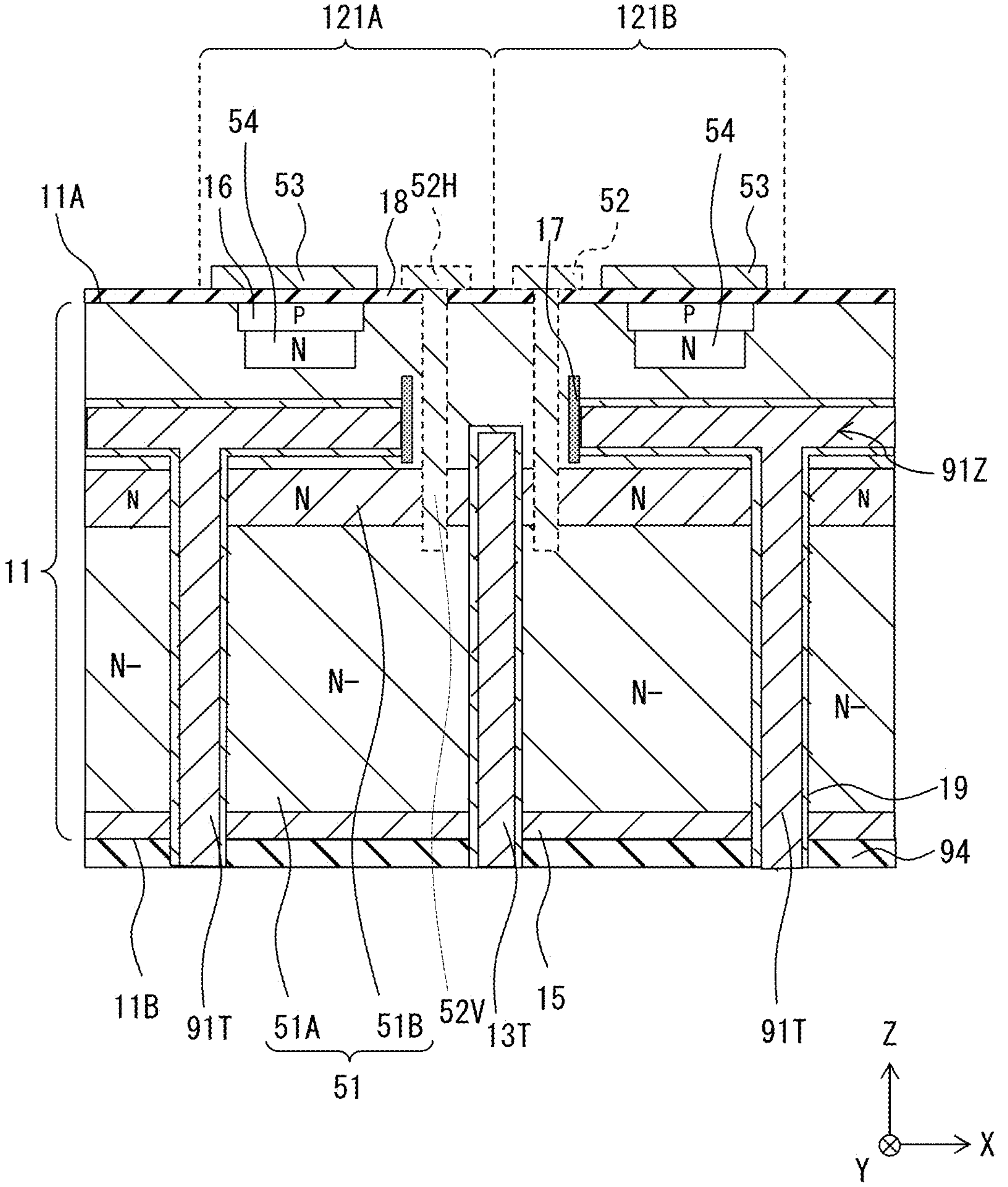
FIG. 22E is a cross-sectional view of one step subsequent to FIG. 22D.
Figure 22F:
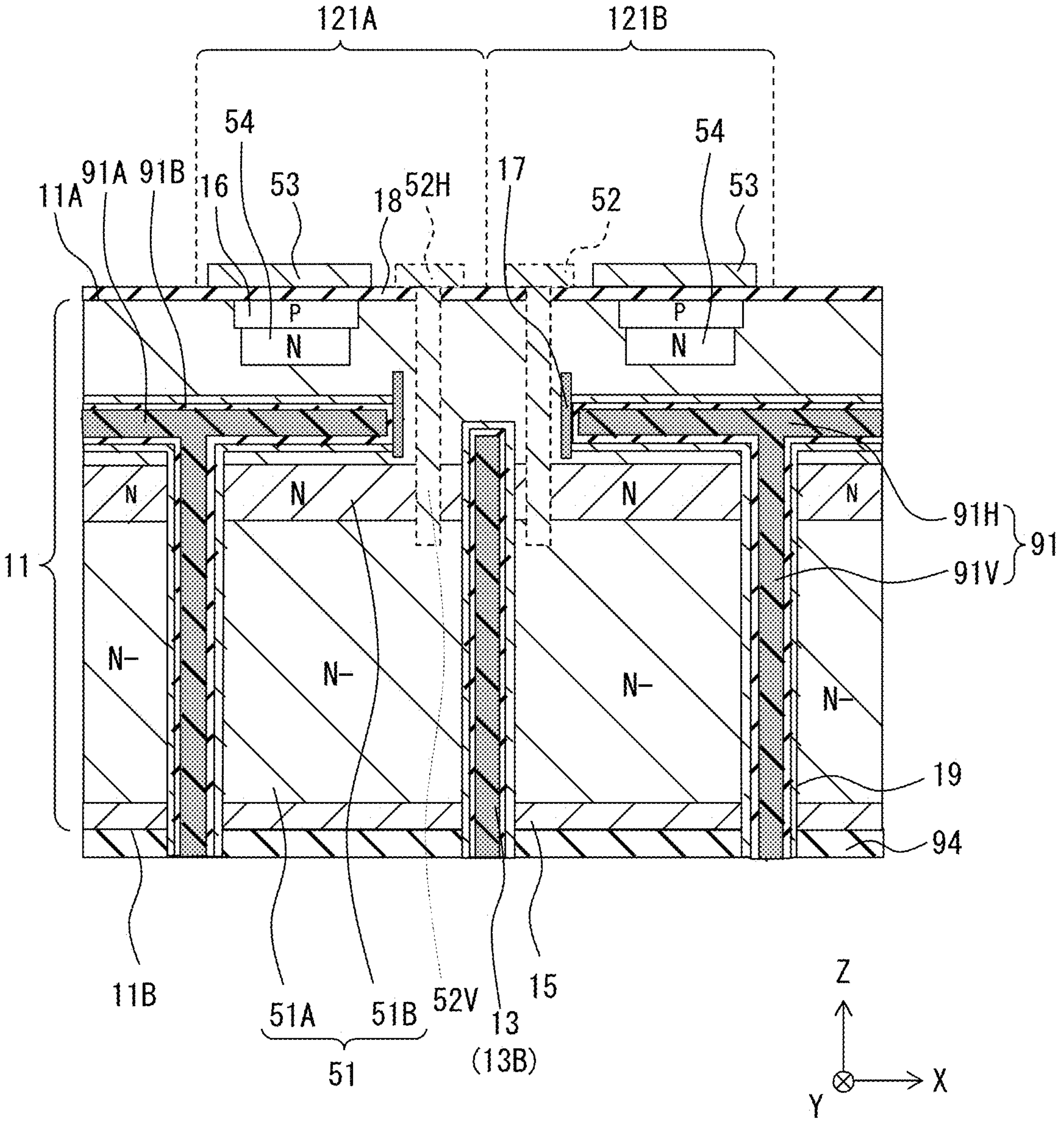
FIG. 22F is a cross-sectional view of one step subsequent to FIG. 22E.

Next, as illustrated in FIG. 22D, the TRX 52, the TRM 53, the MEM 54, the TRG 55, and the OFG 57 are formed using a known method. Then, after removing the temporary substrate 96 and the insulating layer 95 as illustrated in FIG. 22E, the temporary filling materials in the trenches 13T and 91T and the space 91Z are removed as illustrated in FIG. 22F, and the outer layer part 91B and the inner layer part 91A are formed sequentially to fill the trenches 13T and 91T and the space 91Z. This allows for formation of the element separation section 13 (13B) and the light-shielding section 91. Finally, the color filter CF and the light-receiving lens LNS are joined in order onto the back surface 11B to thereby complete the solid-state imaging device 106.

[Workings and Effects of Solid-State Imaging Device 106]

As described above, the solid-state imaging device 106 of the present embodiment is provided with the light-shielding section 91 including the vertical light-shielding part 91V also serving as the element separation section 13 and the horizontal light-shielding part 91H, without being provided with the vertical light-shielding part 12V in the first embodiment, etc. Therefore, it is possible to improve the degree of freedom in layout on the side of the front surface 11A of the semiconductor substrate 11. As an example, it is possible to expand a region for forming the charge-holding section (MEM) 54, by the region for the vertical light-shielding part 12V.

It is to be noted that the light-shielding section 91 of the present embodiment is formable by providing, prior to FEOL (Front End of Line), the trench 91T (91T and 93T) also serving as an element separation section and the space 91Z to be in communication with the trench 91T by means of etching from the back surface 11B of the semiconductor substrate 11.

In addition, the solid-state imaging device 106 of the present embodiment is provided with the solid-phase diffusion layer 19 including a p-n junction around the light-shielding section 91, thus making it possible to expect an improvement in the pixel capacity Qs.

8. Modification Example of Sixth Embodiment

[Configuration of Solid-State Imaging Device 106A]

Figure 23:
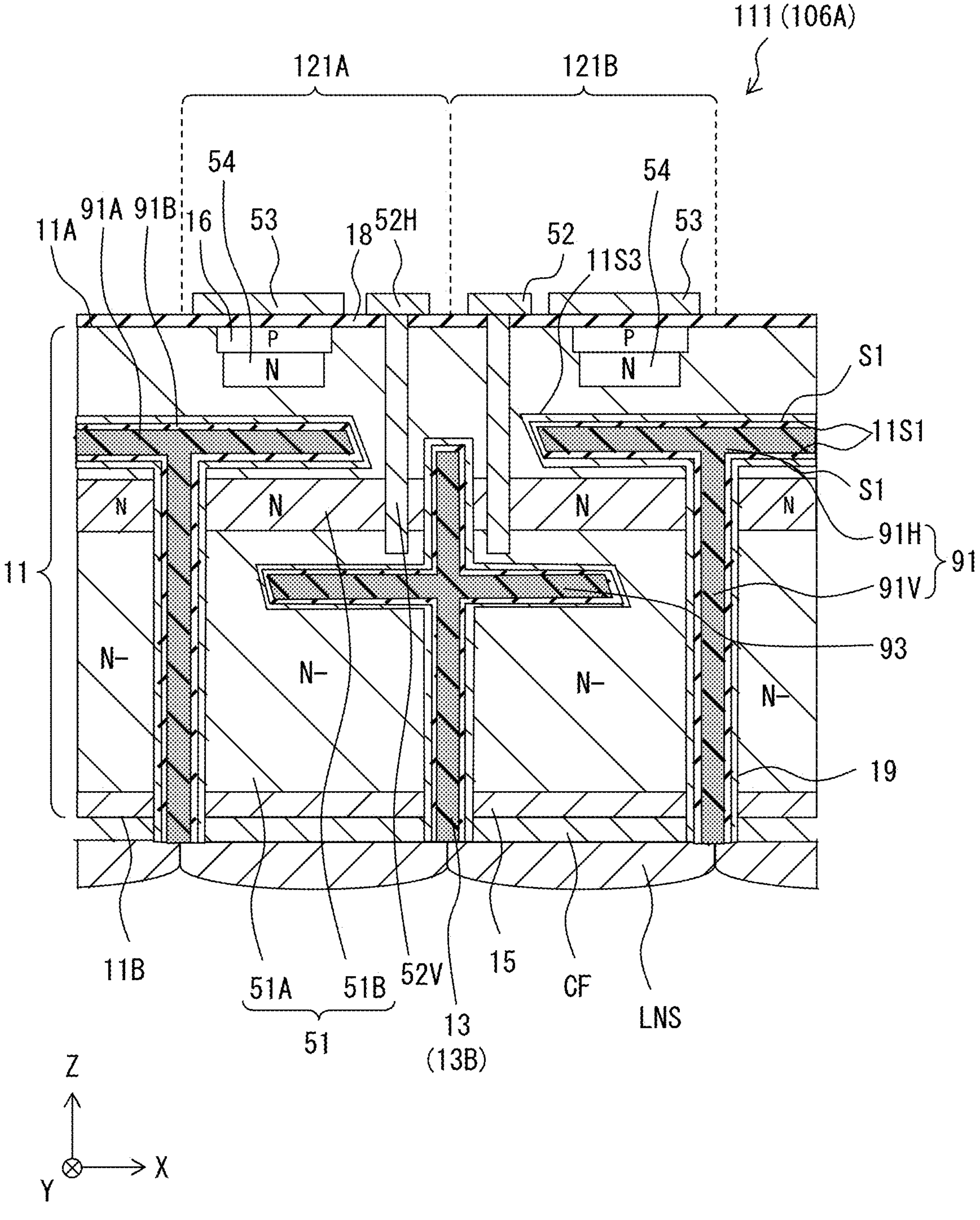
FIG. 23 is a cross-sectional view schematically illustrating a configuration of some of sensor pixels in a modification example of the imaging device according to the sixth embodiment of the present disclosure.

FIG. 23 schematically illustrates cross-sectional configurations of any two sensor pixels 121A and 121B adjacent to each other in a solid-state imaging device 106A as a modification example of the sixth embodiment.

The solid-state imaging device 106A as the present modification example further includes a light-shielding section 93 in addition to the light-shielding section 91, as in the solid-state imaging device 103 illustrated in FIG. 9C and FIG. 10. Except for this point, the solid-state imaging device 106A has a substantially similar configuration, in other points, to the solid-state imaging device 106 according to the foregoing sixth embodiment. It is to be noted that FIG. 23 illustrates a cross-section of the solid-state imaging device 106A corresponding to a direction of an arrow along a line IXC-IXC indicated in FIG. 8.

Similarly to the light-shielding section 24 in the solid-state imaging device 103 of the foregoing third embodiment, the light-shielding section 93 is provided at least in the Si-remaining region 23 (see FIG. 7) in which the Si {111} remains in an opening where the horizontal light-shielding part 91H of the light-shielding section 91 is provided. Similarly to the horizontal light-shielding part 91H, the light-shielding section 93 extends along the horizontal plane (XY plane), and is orthogonal to the element separation section 13 in the present embodiment.

[Method of Manufacturing Solid-State Imaging Device 106A]

Next, description is given, with reference to FIGS. 24A to 24D, of an example of a method of manufacturing the solid-state imaging device 106A.

Figure 24A:
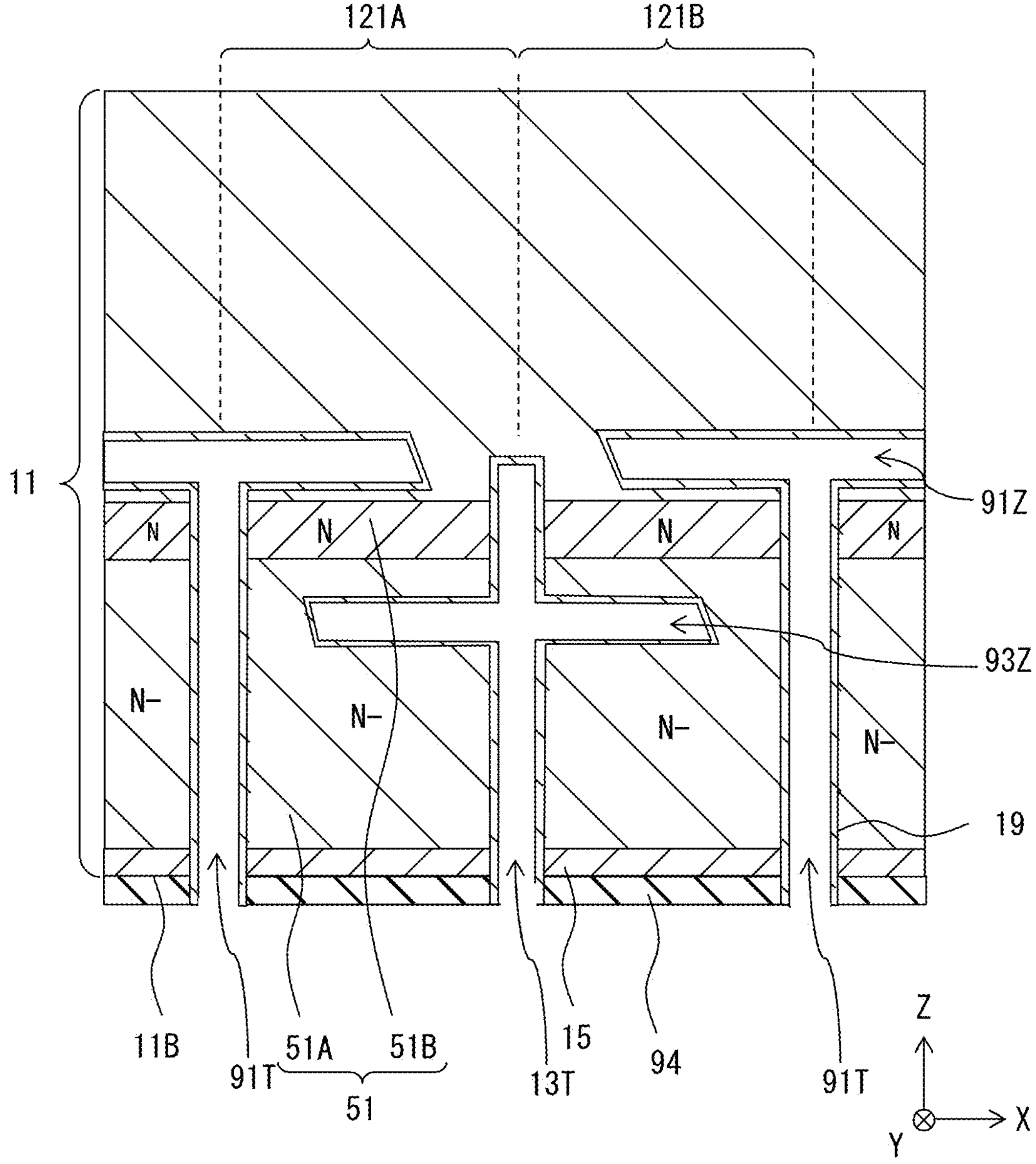
FIG. 24A is a cross-sectional view of one step in a method of manufacturing the imaging device illustrated in FIG. 23.

First, similarly to the sixth embodiment, the semiconductor substrate 11 is prepared, in which the etching stopper 17, the photoelectric conversion section 51, and the fixed-charge film 15 are each formed. Thereafter, as illustrated in FIG. 24A, there are formed the trenches 13T and 91T, spaces 93AZ and 91Z to be in communication with, respectively, the trenches 13T and 91T, and the solid-phase diffusion layer 19 including an N type region on outer side and a P type region on inner side. At that time, the trench 13T as well as the space 93Z to be in communication with the trench 93T and the trench 91T as well as the space 91Z to be in communication with the trench 91T are formed separately from each other. The trench 13T and the space 93Z to be in communication with the trench 13T may be formed similarly to the fourth embodiment, for example.

Figure 24B:
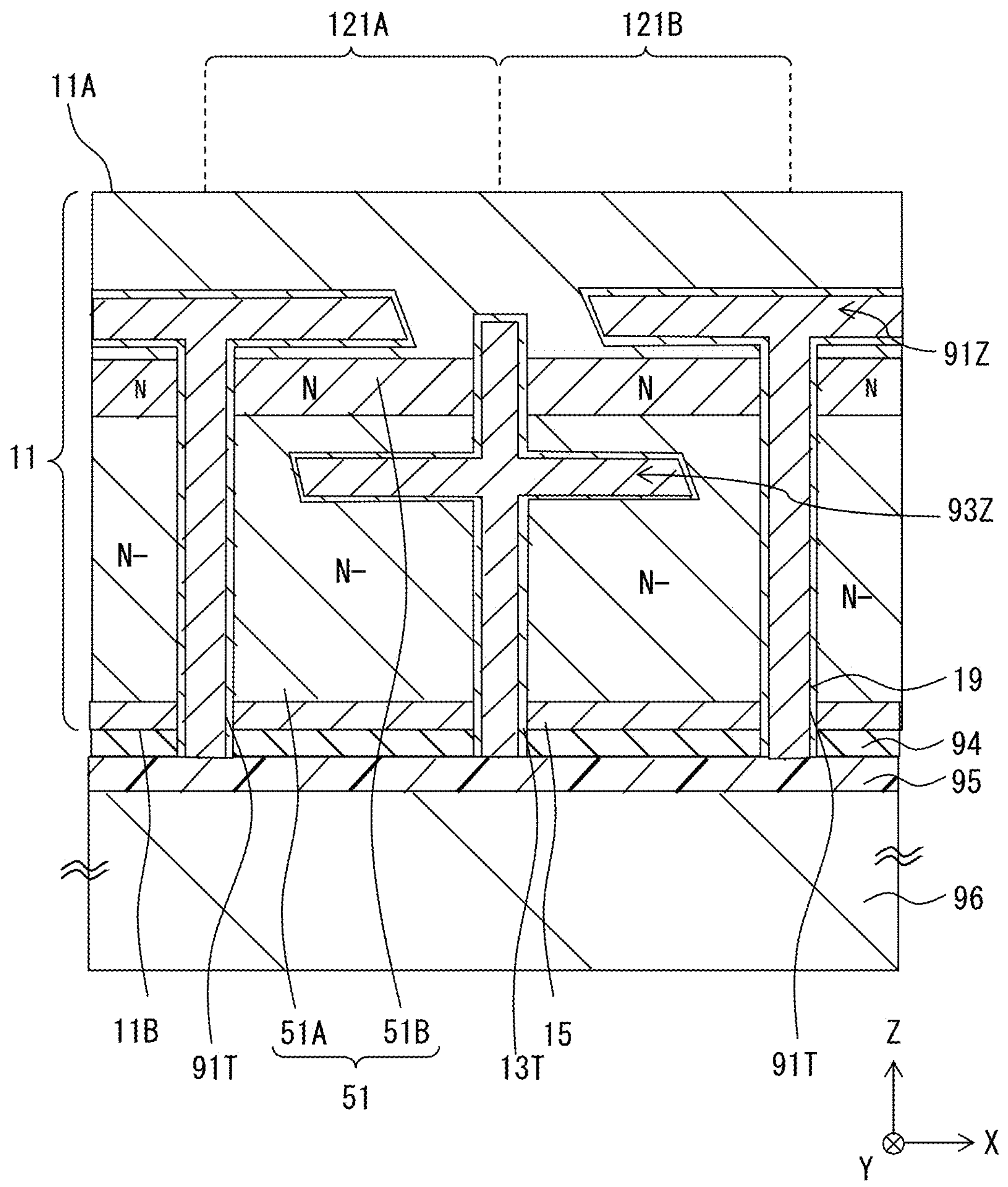
FIG. 24B is a cross-sectional view of one step subsequent to FIG. 24A.
Figure 24C:
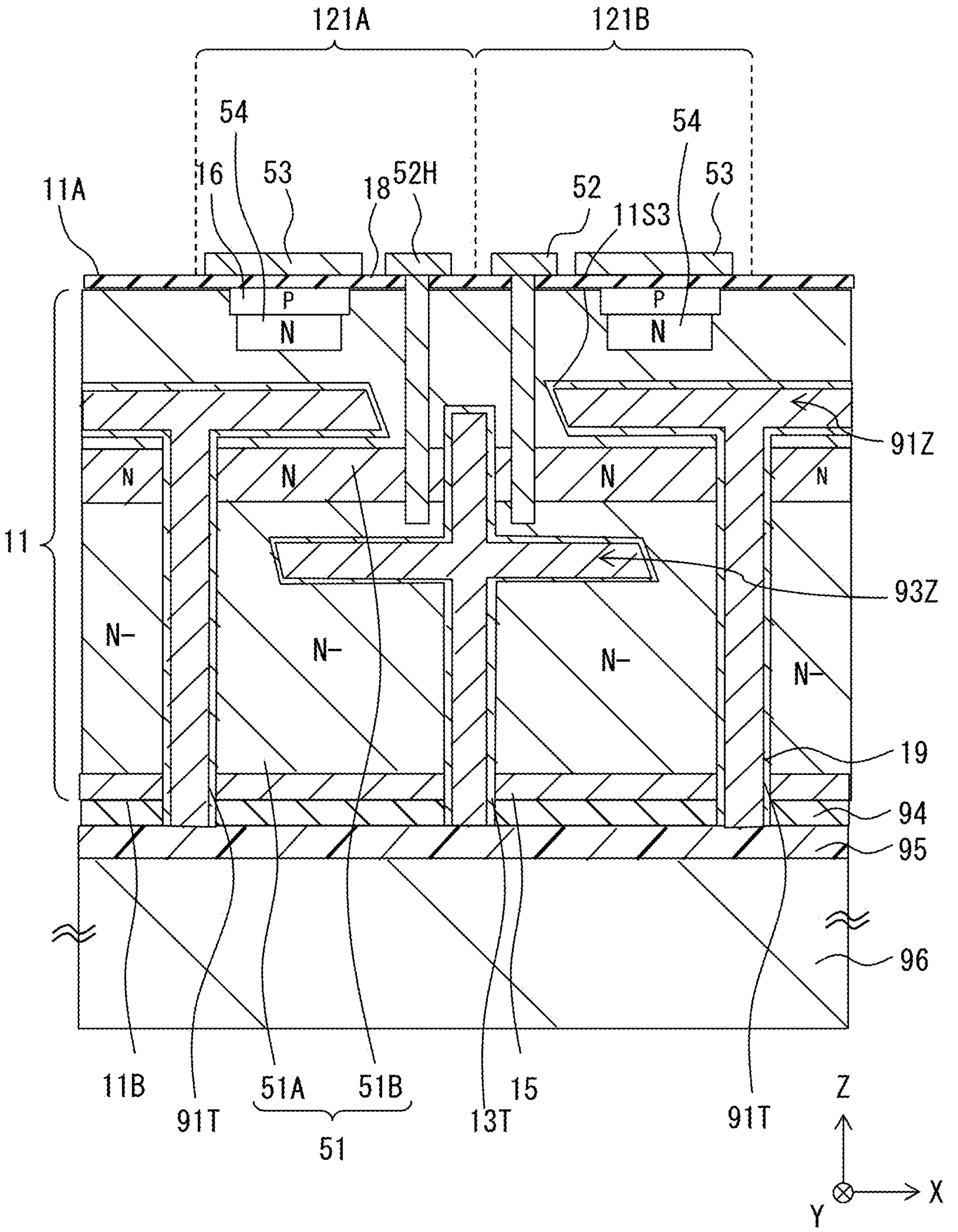
FIG. 24C is a cross-sectional view of one step subsequent to FIG. 24B.
Figure 24D:
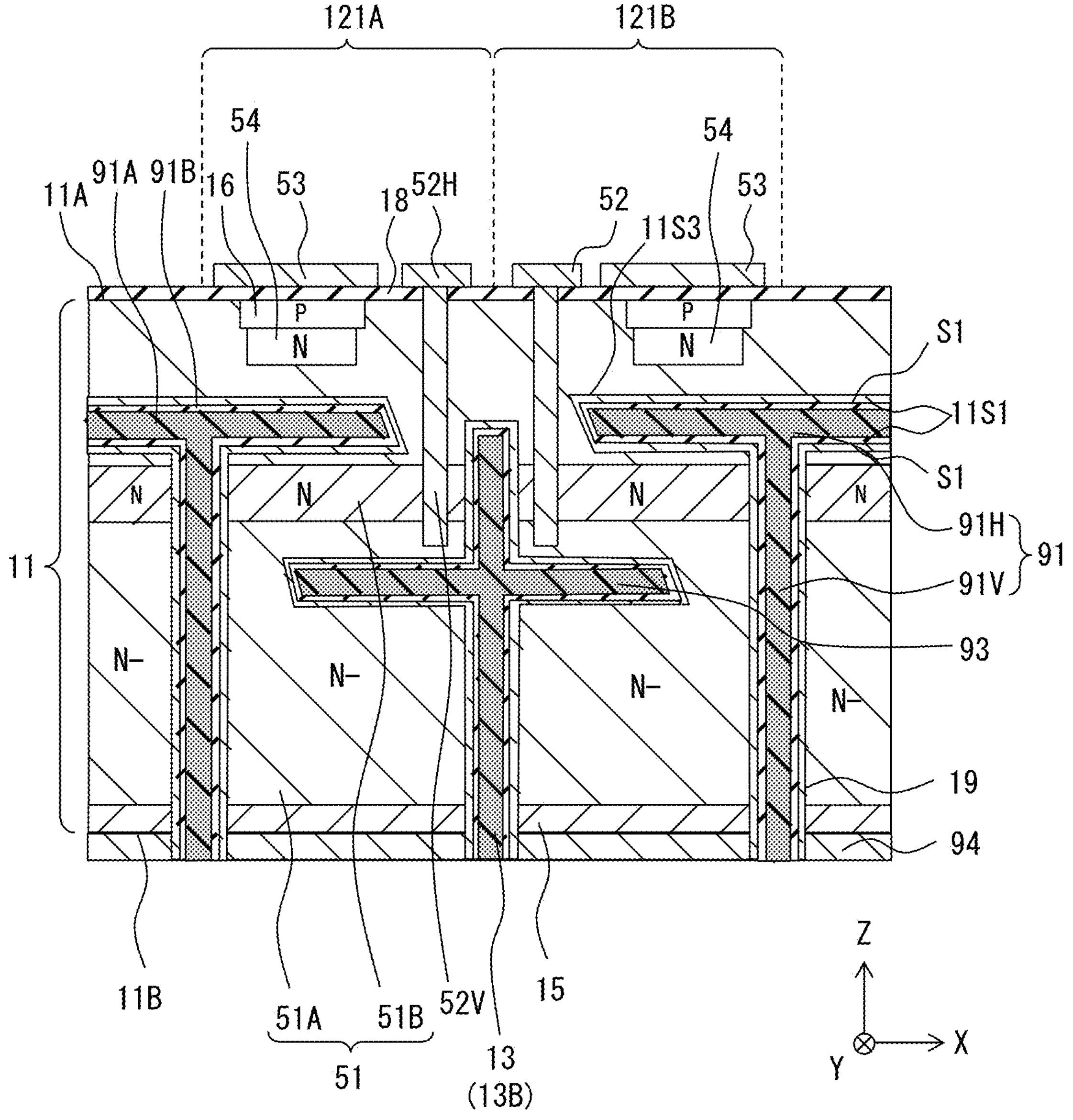
FIG. 24D is a cross-sectional view of one step subsequent to FIG. 24C.

Next, as illustrated in FIG. 24B, after temporarily filling the trenches 13T and 91T and spaces 91Z and 93Z, the back surface 11B of the semiconductor substrate 11 is joined to the temporary substrate 96, with the insulating layer 95 interposed therebetween, and the front surface 11A of the semiconductor substrate 11 is thinned. Subsequently, the TRX 52, the TRM 53, the MEM 54, the TRG 55, and the OFG 57 are formed using a known method, as illustrated in FIG. 24C. Thereafter, the temporary substrate 96 and the insulating layer 95 are removed, and then, as illustrated in FIG. 24D, the temporary filling materials in the trenches 13T and 91T and the spaces 91Z and 93Z are removed, and the outer layer part 91B and inner layer part 91A are sequentially formed. This allows for formation of the element separation section 13 (13B) and the light-shielding sections 91 and 93H. Finally, the color filter CF and the light-receiving lens LNS are sequentially joined onto the back surface 11B to thereby complete the solid-state imaging device 106A.

[Workings and Effects of Solid-State Imaging Device 106A]

As described above, in the solid-state imaging device 106A as the present modification example, the additional light-shielding section 93 is further provided in a region, which overlaps the Si-remaining region 23, where no horizontal light-shielding part 91H of the light-shielding section 91 is formed in a plan view. Therefore, in addition to the effects of the sixth embodiment, it is possible to further hinder light transmitted through the photoelectric conversion section 51 without being absorbed by the photoelectric conversion section 51 in each sensor pixel 121 from being incident on the MEM 54. Thus, it is possible to further prevent generation of a noise.

9. Modification Example of Sixth Embodiment

[Configuration of Solid-State Imaging Device 106B]

Figure 25:
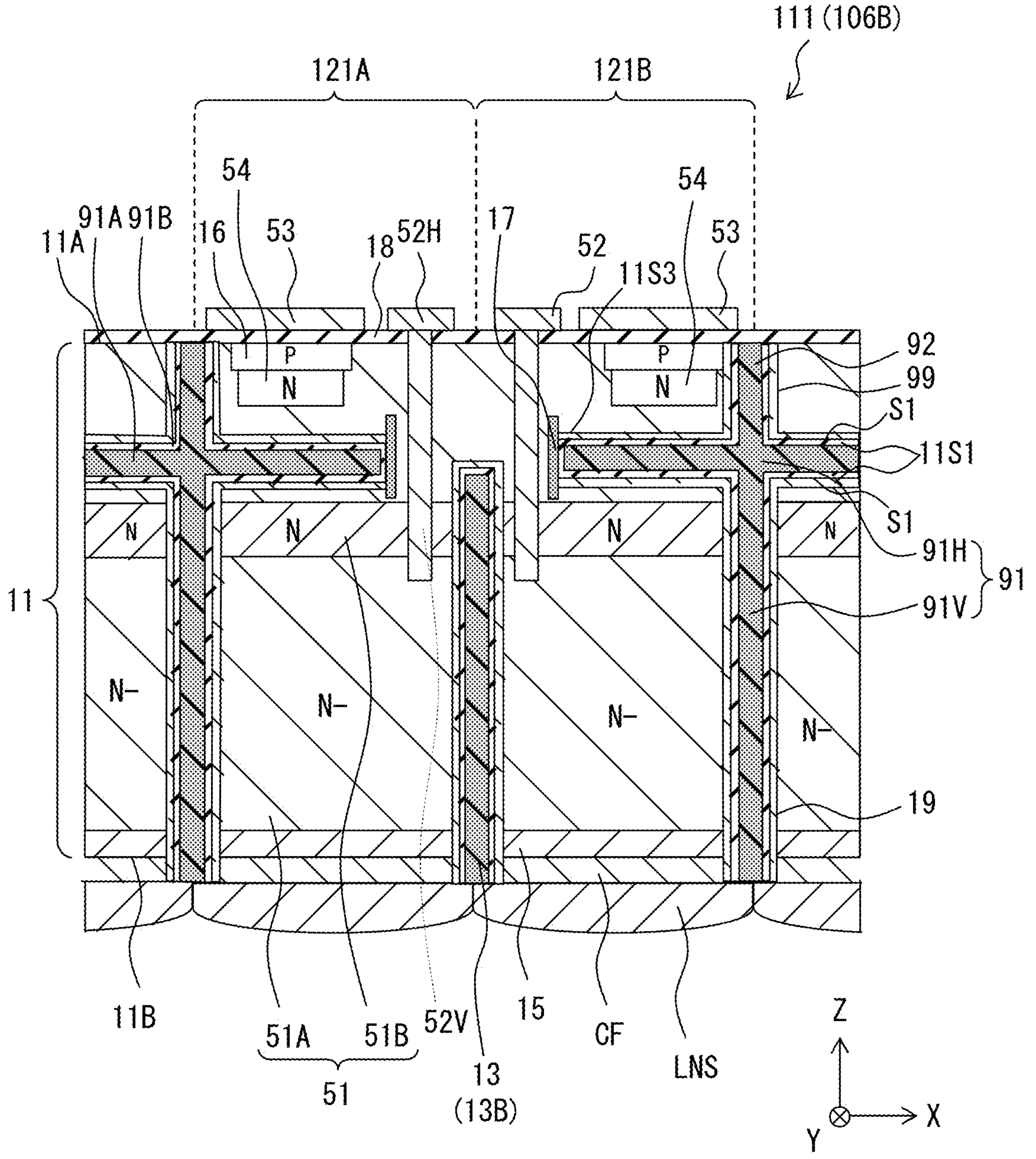
FIG. 25 is a cross-sectional view schematically illustrating a configuration of some of sensor pixels in a modification example of the imaging device according to the sixth embodiment of the present disclosure.

FIG. 25 schematically illustrates cross-sectional configurations of any two sensor pixels 121A and 121B adjacent to each other in a solid-state imaging device 106B as a modification example of the sixth embodiment.

The solid-state imaging device 106B as the present modification example is further provided with a light-shielding section 92 orthogonal to the horizontal light-shielding part 91H on the side of the front surface 11A of the semiconductor substrate 11. Except for this point, the solid-state imaging device 106B has a substantially similar configuration, in other points, to the solid-state imaging device 106 according to the foregoing sixth embodiment.

The light-shielding section 92 extends from the front surface 11A of the semiconductor substrate 11 toward the back surface 11B thereof, and is in contact with the horizontal light-shielding part 91H of the light-shielding section 91, and is integrated with the light-shielding section 91. That is, similarly to the solid-state imaging device 104 of the fourth embodiment, the solid-state imaging device 106B of the present embodiment is provided with a light-shielding section including the horizontal light-shielding part (91V and 92) extending in the Z-axis direction from the front surface 11A of the semiconductor substrate 11 up to the back surface 11B thereof and the horizontal light-shielding part 91H extending in a horizontal plane to be orthogonal to the vertical light-shielding part (e.g., 91V). A solid-phase diffusion layer 99 including a P type region and an N type region is formed around the light-shielding section 92. The solid-phase diffusion layer 99 may have a configuration similar to that of the solid-phase diffusion layer 19, or may have a configuration having an impurity concentration and containing impurities different from those of the solid-phase diffusion layer 19.

[Method of Manufacturing Solid-State Imaging Device 106B]

Figure 26A:
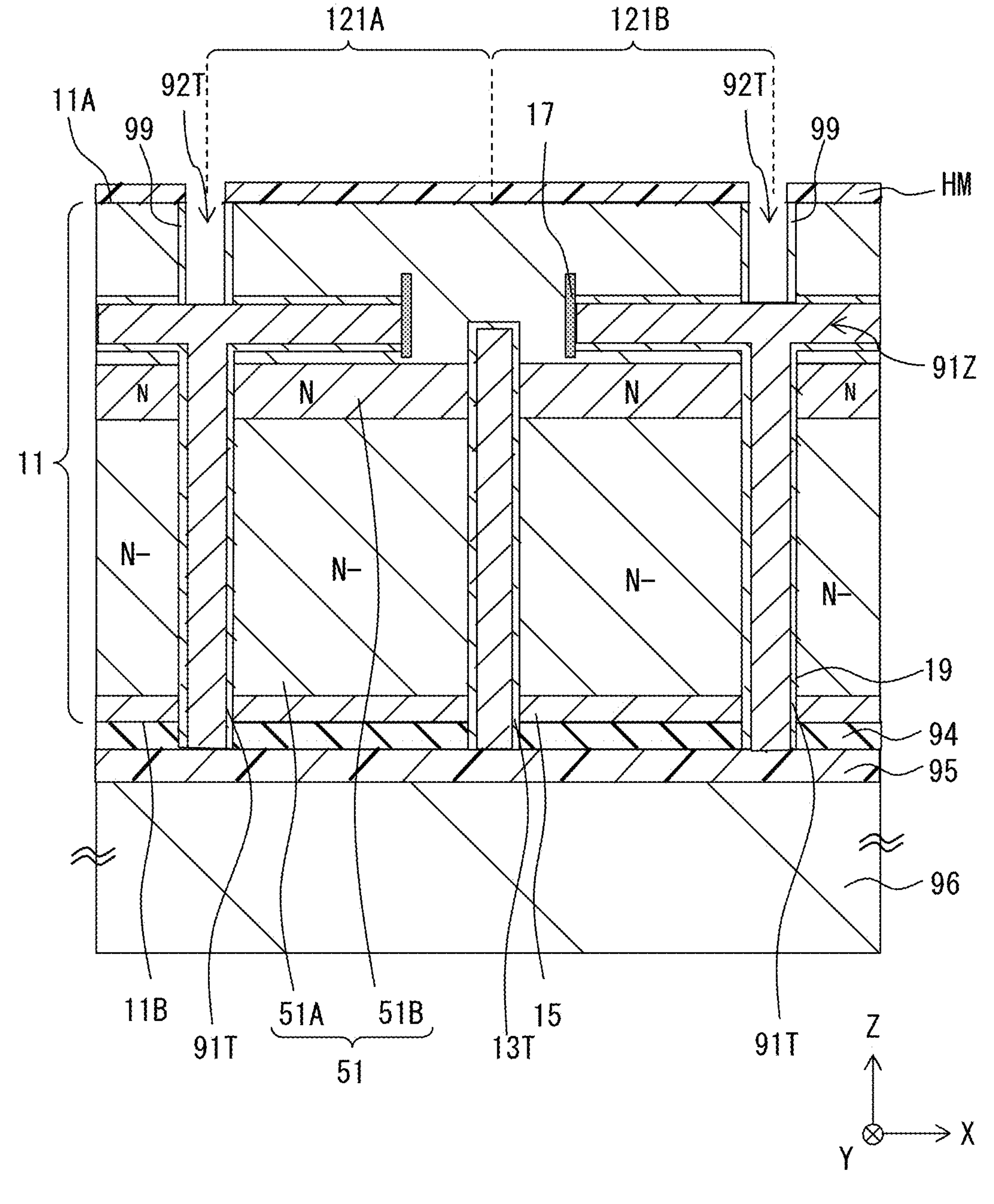
FIG. 26A is a cross-sectional view of one step in a method of manufacturing the imaging device illustrated in FIG. 25.
Figure 26B:
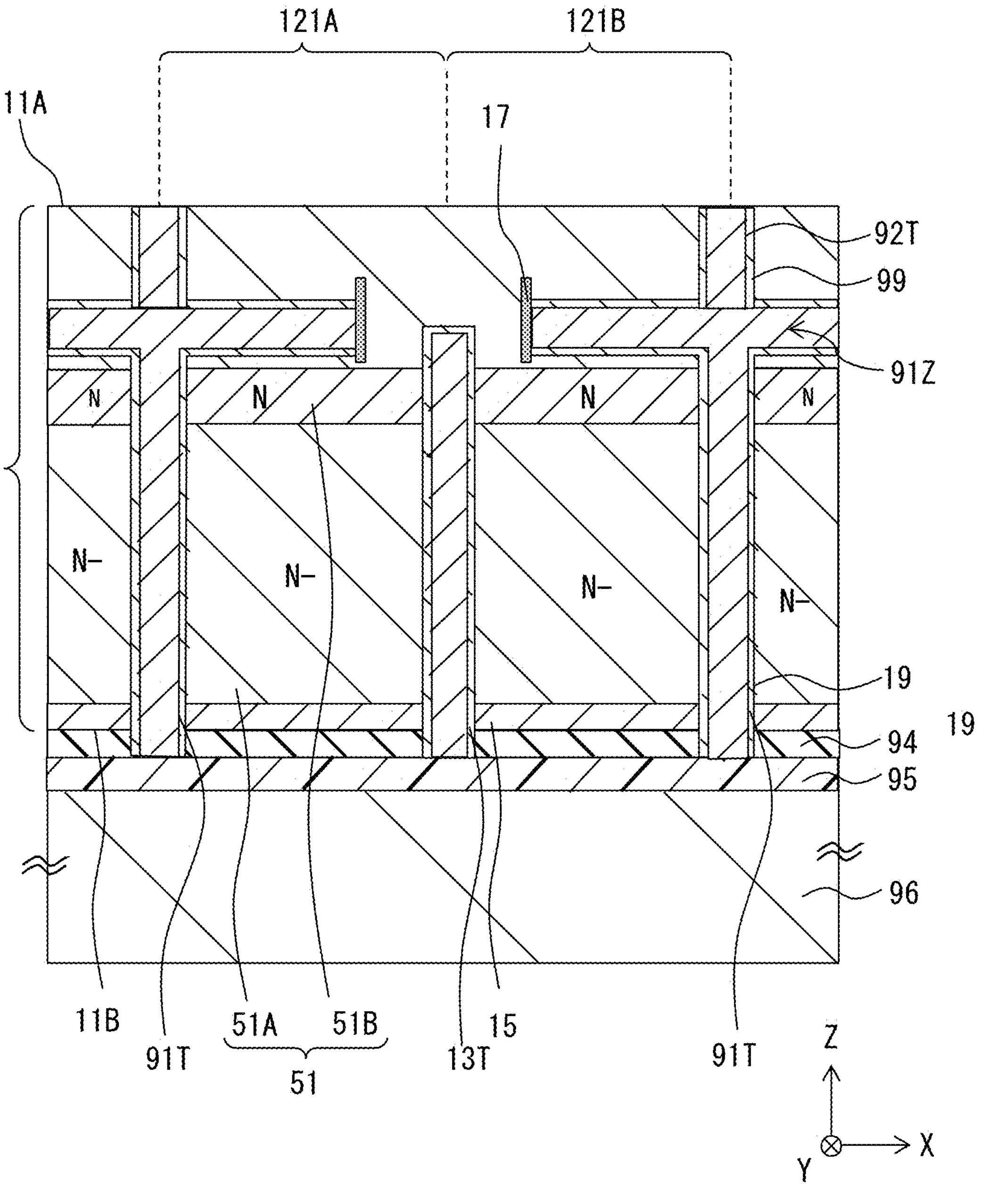
FIG. 26B is a cross-sectional view of one step subsequent to FIG. 26A.

Next, description is given, with reference to FIGS. 26A to 26C, of an example of a method of manufacturing the solid-state imaging device 106B.

First, similarly to the sixth embodiment, after temporarily filling the trenches 13T and 91T and the space 91Z, the back surface 11B of the semiconductor substrate 11 is joined to the temporary substrate 96, with the insulating layer 95 interposed therebetween, and the front surface 11A of the semiconductor substrate 11 is thinned.

Subsequently, as illustrated in FIG. 26A, the hard mask HM selectively covering the front surface 11A of the semiconductor substrate 11 is formed, and thereafter a trench 92T is formed at a position where the vertical light-shielding part 91V is formed. Further, the solid-phase diffusion layer 19 is formed similarly to the solid-state imaging device 104 of the fourth embodiment. Subsequently, as illustrated in FIG. 26B, the trench 92T is temporarily filled, and the hard mask HM is removed. Thereafter, similarly to the sixth embodiment, a known method is used to form the TRX 52, the TRM 53, the MEM 54, the TRG 55, and the OFG 57. Next, after removing the temporary substrate 96 and the insulating layer 95, the temporary filling materials in the trenches 13T, 91T and 92T and the space 91Z are removed, and the outer layer part 91B and the inner layer part 91A are sequentially formed to fill the trenches 13T, 91T and 92T and the space 91Z. This allows for collective formation of the light-shielding sections 91 and 92. In addition, the element separation section 13 (13B) is also formed simultaneously. Finally, the color filter CF and the light-receiving lens LNS are joined in order onto the back surface 11B to complete the solid-state imaging device 106B.

[Workings and Effects of Solid-State Imaging Device 106B]

As described above, the solid-state imaging device 106B as the present modification example is further provided with the light-shielding section 92, and the trench 92T constituting the light-shielding section 92 is formed separately from the side of the front surface 11A of the semiconductor substrate 11. This allows for formation of the solid-phase diffusion layer 99 having an impurity concentration different from that of the solid-phase diffusion layer 19, for example, around the trench 92T. For example, it is possible to form, independently of the photoelectric conversion section 51, the solid-phase diffusion layer 99 having an impurity concentration and containing an impurity material suitable for the charge-holding section (MEM) 54. Thus, in addition to the effects of the fourth embodiment, optimum profile formation becomes possible for each component.

10. Modification Example of Sixth Embodiment

[Configuration of Solid-State Imaging Device 106C]

Figure 27:
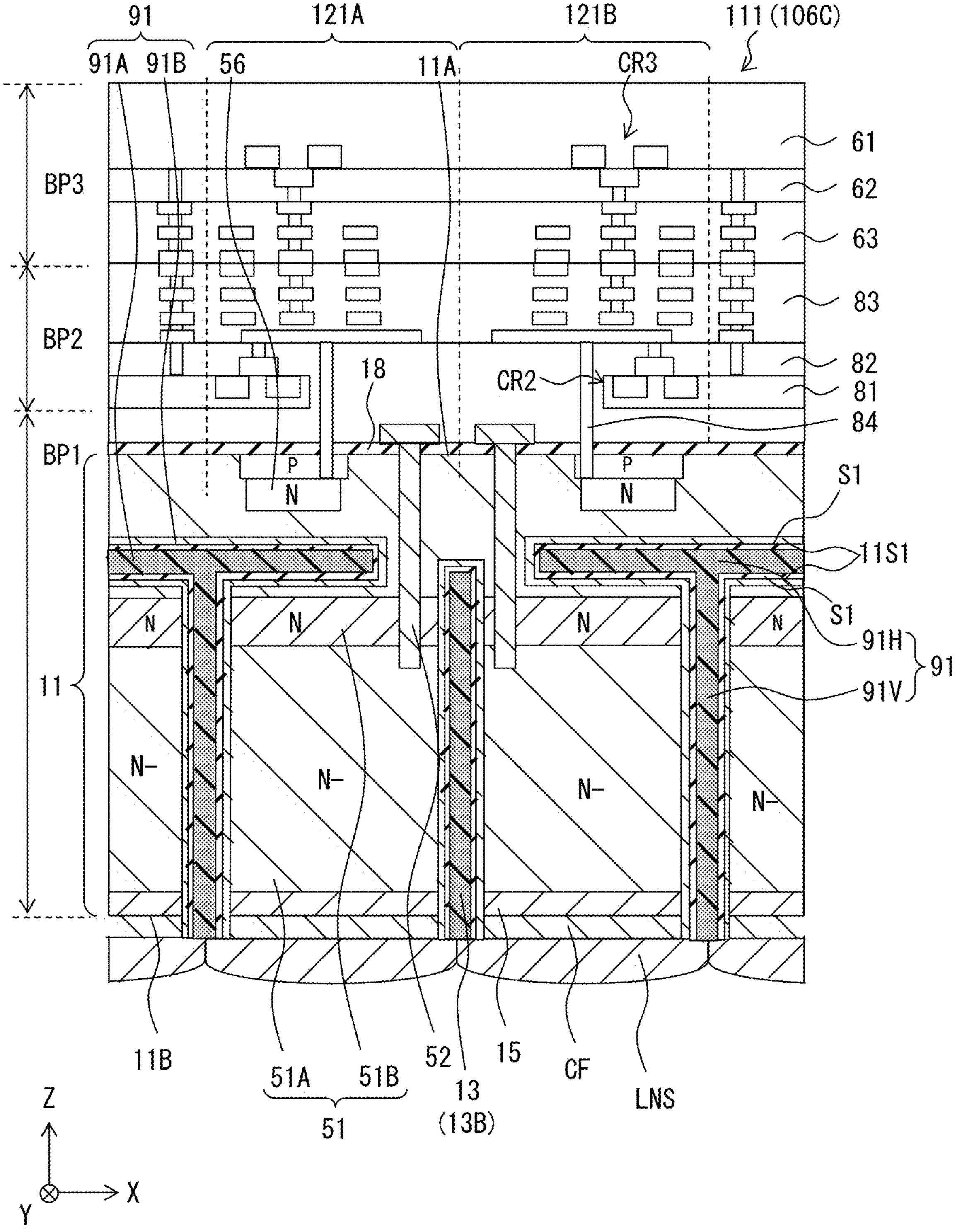
FIG. 27 is a cross-sectional view schematically illustrating a configuration of some of sensor pixels in a modification example of the imaging device according to the sixth embodiment of the present disclosure.

FIG. 27 schematically illustrates cross-sectional configurations of any two sensor pixels 121A and 121B adjacent to each other in a solid-state imaging device 106C as a modification example of the sixth embodiment.

The solid-state imaging device 106C is a combination of the solid-state imaging device 106 of the sixth embodiment and the solid-state imaging device 105 of the fifth embodiment, and has a three-dimensional structure in which the second substrate BP2 and the third substrate BP3 are stacked in order on the semiconductor substrate 11 (first substrate BP1) constituting the solid-state imaging device 106.

[Workings and Effects of Solid-State Imaging Device 106C]

As described above, similarly to the solid-state imaging device 105 of the fifth embodiment, it is possible, in the solid-state imaging device 106C, to form the second substrate BP2 including the readout circuit CR2 and the third substrate BP3 including the logic circuit CR3 separately from the first substrate BP1 including the sensor pixel 121, and then to stack the first to third substrates BP1 to BP3. Therefore, a general-purpose product may be used as the readout circuit CR2 or the logic circuit CR3, thus making it possible to enhance the degree of freedom in designing and to expect suppression of manufacturing costs.

11. Example of Application to Electronic Apparatus

Figure 28:
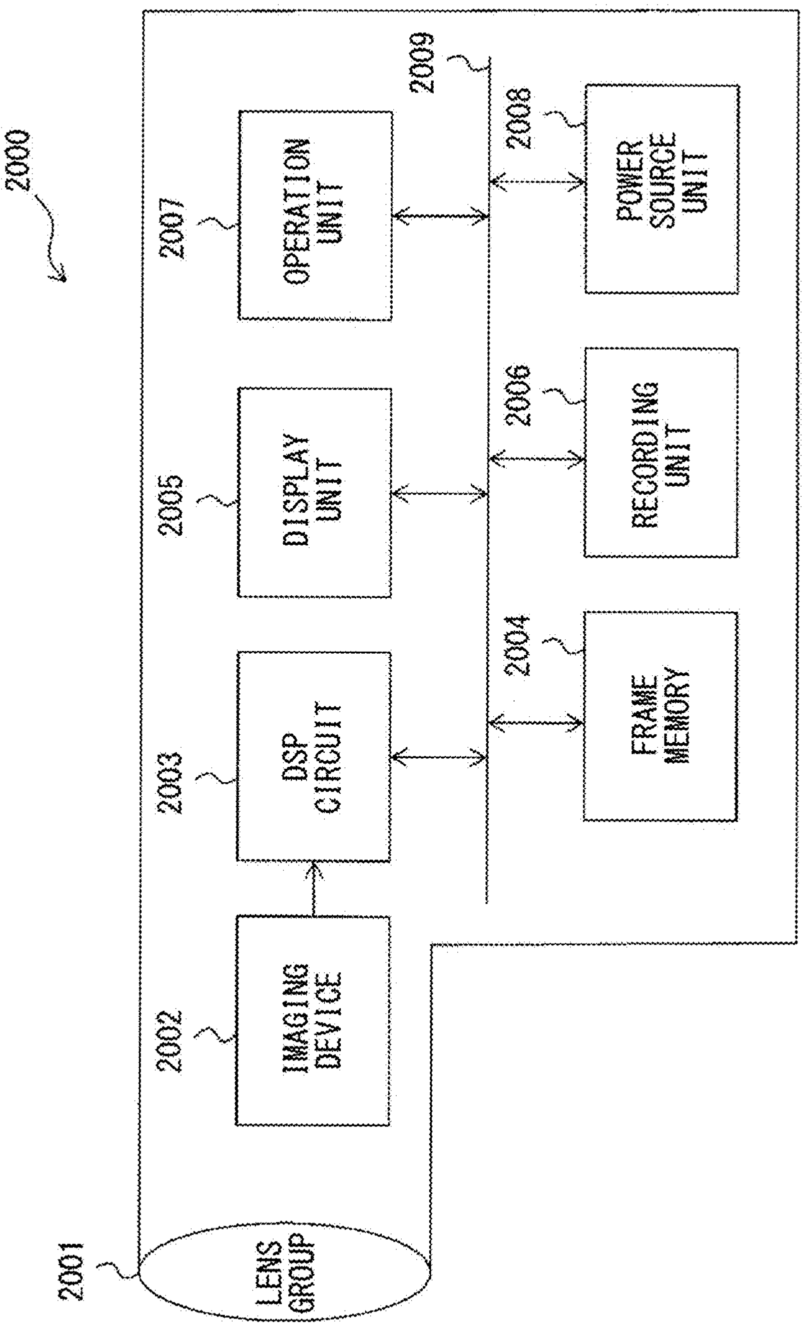
FIG. 28 is a schematic view of an overall configuration example of an electronic apparatus.

FIG. 28 is a block diagram illustrating a configuration example of a camera 2000 as an electronic apparatus to which the present technology is applied.

The camera 2000 includes an optical unit 2001 including a lens group or the like, an imaging device (imaging device) 2002 to which the above-described solid-state imaging device 101 or the like (hereinafter, referred to as the solid-state imaging device 101, etc.) is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power source unit 2008. The DSP circuit 2003, the frame memory 2004, the display unit 2005, the recording unit 2006, the operation unit 2007, and the power source unit 2008 are coupled to one another via a bus line 2009.

The optical unit 2001 takes in incident light (image light) from a subject to form an image on an imaging surface of the imaging device 2002. The imaging device 2002 converts a light amount of the incident light formed, as an image, on the imaging surface by the optical unit 2001 into an electric signal on a pixel unit basis, and outputs the converted electric signal as a pixel signal.

The display unit 2005 includes, for example, a panel-type display device such as a liquid crystal panel or an organic EL panel, and displays a moving image or a still image captured by the imaging device 2002. The recording unit 2006 records the moving image or the still image captured by the imaging device 2002 in a recording medium such as a hard disk or a semiconductor memory.

The operation unit 2007 issues an operation command for various functions of the camera 2000 under the operation of a user. The power source unit 2008 appropriately supplies various types of power for operation to the DSP circuit 2003, the frame memory 2004, the display unit 2005, the recording unit 2006, and the operation unit 2007 which are supply targets.

As described above, obtainment of a favorable image is expectable by using the above-described solid-state imaging device 101, etc. as the imaging device 2002.

12. Example of Practical Application to Mobile Body

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
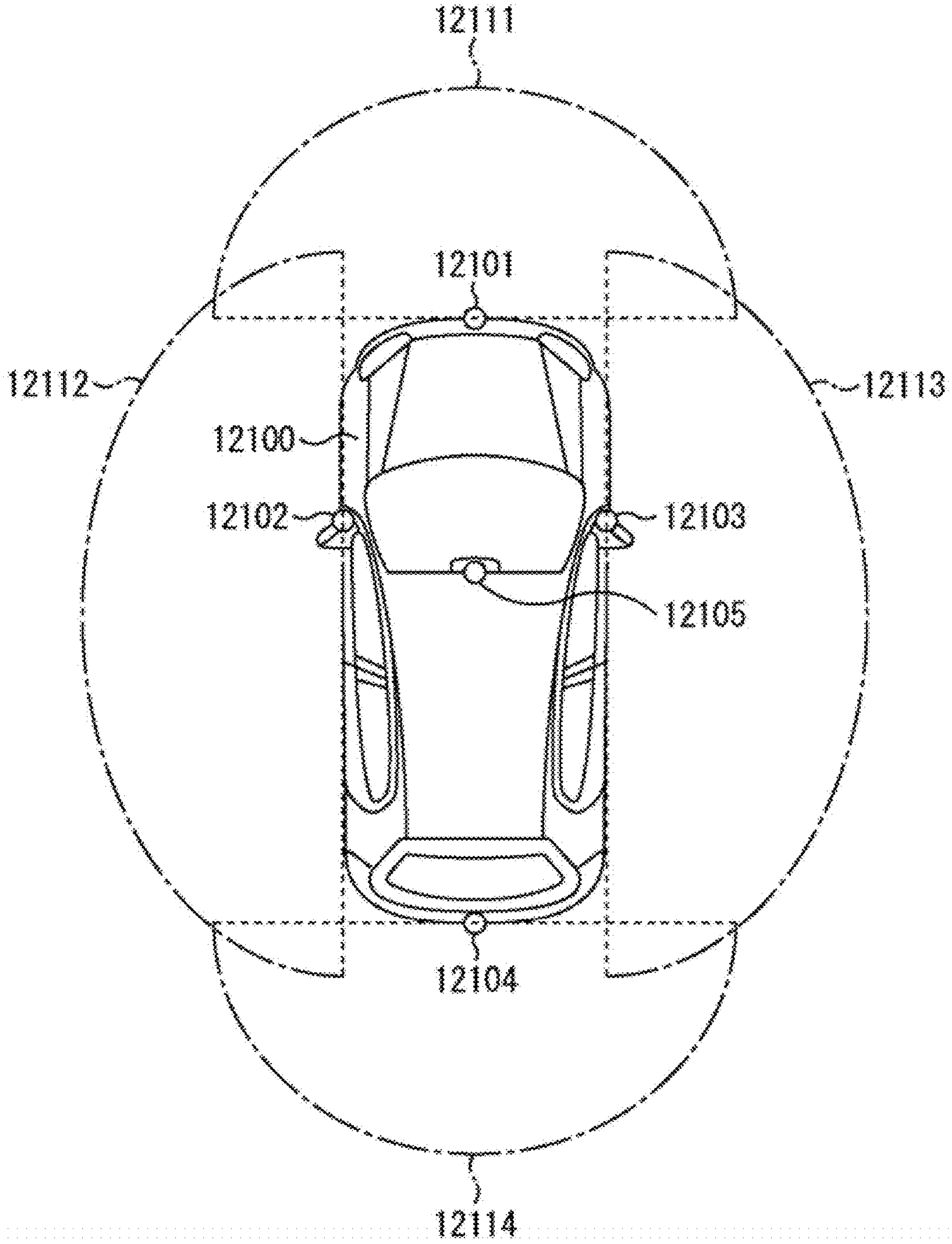
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to an embodiment of the present disclosure may be applied. The technology according to an embodiment of the present disclosure may be applied to the imaging section 12031 among components of the configuration described above. Specifically, the solid-state imaging device 101, etc. illustrated in FIG. 1 and other drawings is applicable to the imaging section 12031. A superior operation of the vehicle control system is expectable by application of the technology according to an embodiment of the present disclosure to the imaging section 12031.

13. Other Modification Examples

Figure 31:
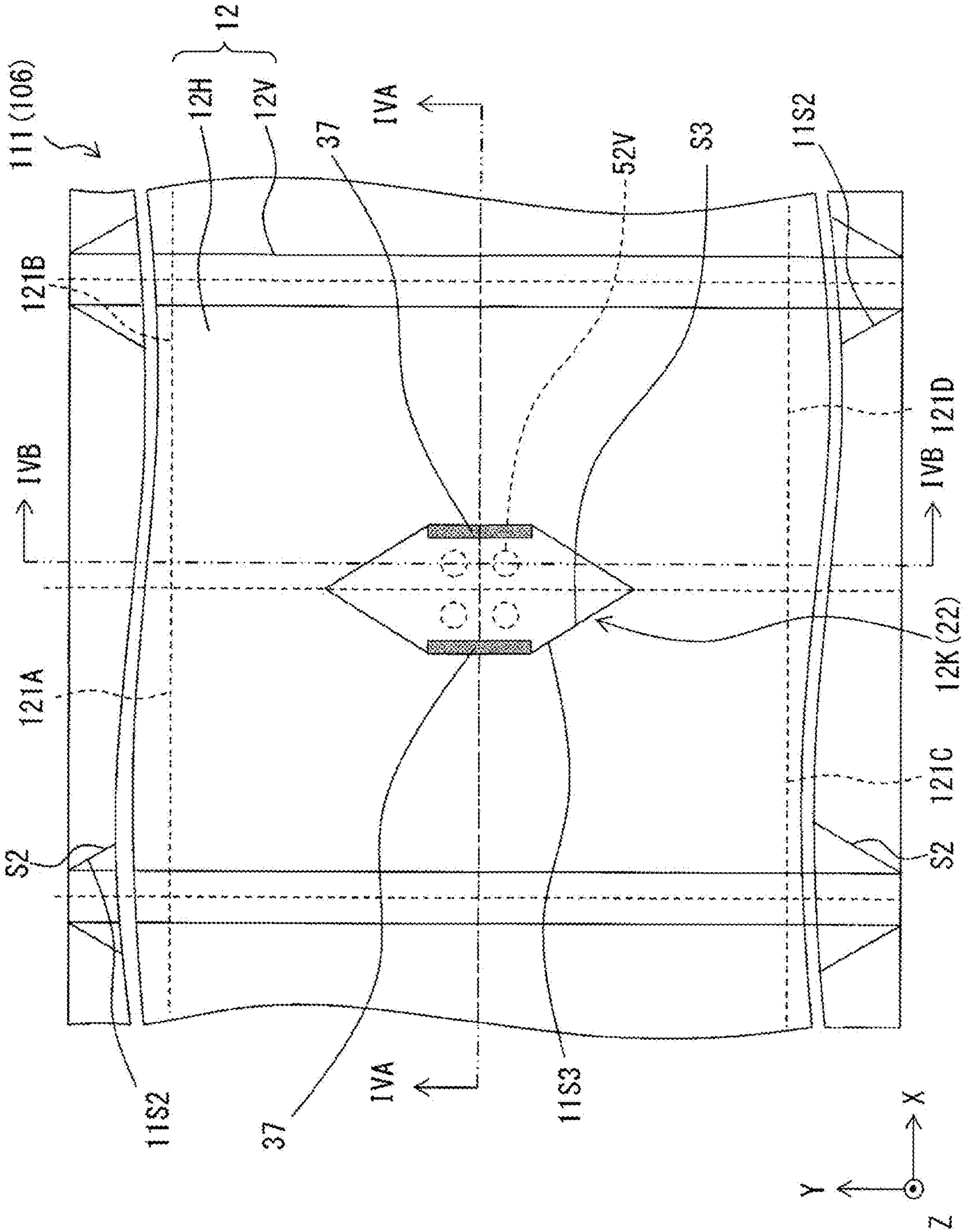
FIG. 31 is a plan view schematically illustrating, in an enlarged manner, a main part of a pixel array section in an imaging device as another modification example of the present disclosure.
Figure 32:
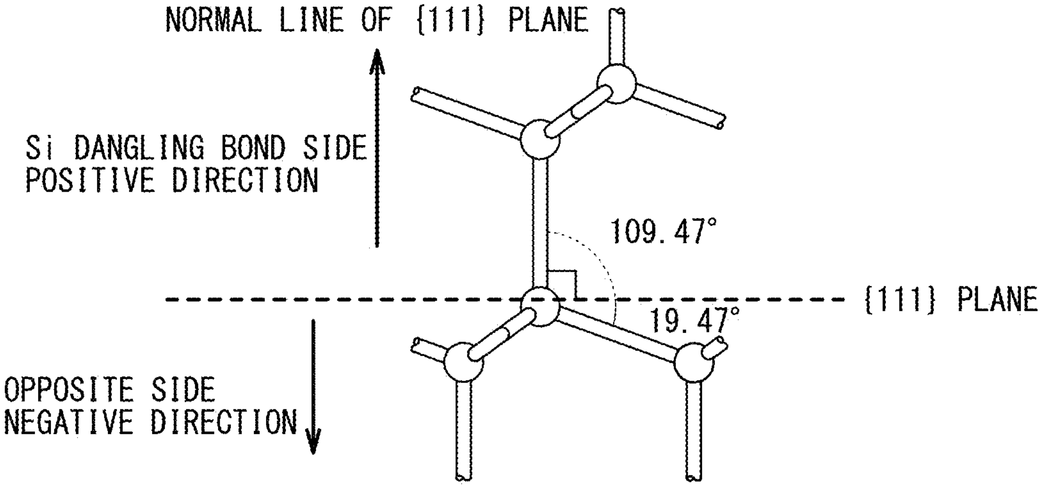
FIG. 32 is an explanatory schematic view of a backbond in crystal plane of an Si substrate of the present disclosure.

Although the description has been given hereinabove of the present disclosure with reference to several embodiments and the modification examples, the present disclosure is not limited to the above-described embodiments and the like, and various modifications may be made. For example, in the foregoing first embodiment, the description has been given of the solid-state imaging device 101 including the columnar etching stopper 17; however, the shape of the etching stopper is not limited thereto. For example, as in a solid-state imaging device 107 illustrated in FIG. 31, a wall-like etching stopper 37 extending along the Y-axis may be provided. In this case, the opening 12K is substantially hexagonal. In a case where a sufficient area of a region for forming the vertical terminal section 52V is desired to be secured, it is better to provide the etching stopper 37 extending in the Y-axis direction parallel to the vertical light-shielding part 12V of the light-shielding section 12, as in the solid-state imaging device 107. Meanwhile, in order to further reduce an area of the region of the opening 12K, it is better to provide the etching stopper 17 having a shape of small occupied area in the XY plane, as in the solid-state imaging device 101 of the foregoing first embodiment.

In addition, in the solid-state imaging device 104 according to the foregoing fourth embodiment, the solid-phase diffusion layer 19 having the p-n junction is formed around the light-shielding section 31; however, a solid-phase diffusion layer may be formed around the light-shielding section or the element separation section also in the solid-state imaging device described in another embodiment. One reason for this is that it is possible to expect an improvement in the pixel capacity Qs. For example, a solid-phase diffusion layer having a p-n junction may be formed around the light-shielding sections 12 and 24 in the solid-state imaging devices 101 to 103 in the foregoing first to third embodiments and the element separation section 73.

In addition, the foregoing fifth embodiment exemplifies the solid-state imaging device 105 having a three-dimensional structure in which the three substrate are stacked; however, the type and number of substrates to be stacked are not limited thereto. In addition, in the solid-state imaging device 105 of the fifth embodiment, the element separation section 73 is provided with the horizontal light-shielding part 73H; however, the horizontal light-shielding part 73H may not be provided. In addition, also in the solid-state imaging device having a three-dimensional structure, the light-shielding section and the element separation section may be formed integrally. In that case, the light-shielding section and the element separation section are collectively formable from the front surface (side opposite to light incident side) of the semiconductor substrate on which the sensor pixel is formed. Further, in that case, a solid-phase diffusion layer including a p-n junction may be provided around both of the light-shielding section and the element separation section.

The Si {111} substrate in the present disclosure refers to a substrate or a wafer including a silicon single crystal and having a crystal plane represented by {111} in Mirror index notation. The Si {111} substrate in the present disclosure also includes a substrate or a wafer having a crystal orientation shifted several degrees, e.g., shifted several degrees from an {111} plane to a nearest direction. Further, the Si {111} substrate also includes a silicon single crystal grown on a portion or the entire surface of the substrate or the wafer by means of an epitaxial method or the like.

In addition, in the notation of the present disclosure, the {111} plane is a generic term of a (111) plane, a (−111) plane, a (1-11) plane, a (11-1) plane, a (−1-11) plane, a (−11-1) plane, a (1-1-1) plane, and a (−1-1-1) plane, which are mutually equivalent crystal planes in terms of symmetry. Accordingly, the description of the Si {111} substrate in the specification, etc. of the present disclosure may be read as an Si (1-11) substrate, for example. Here, a symbol of a bar for expressing an exponent in a negative direction of the Mirror index is substituted by a minus symbol.

In addition, the <110> direction in the description of the present invention is a generic term of a direction, a direction, a direction, a [−110] direction, a [1-10] direction, a [−101] direction, a [10-1] direction, a [0-11] direction, a [01-1] direction, a [−1-10] direction, a [−10-1] direction, and [0-1-1] direction, which are mutually equivalent crystal plane directions in terms of symmetry, and may be read as any of the above. In the present disclosure, however, etching is performed in a direction orthogonal to an element forming surface and in a direction further orthogonal to the direction orthogonal to the element forming surface (i.e., a direction parallel to the element forming surface).

Table 1 exhibits specific combinations of planes and orientations in which etching in the <110> direction is established in the {111} plane that is the crystal plane of the Si {111} substrate in the present invention.

TABLE 1

| Etching | Element-Forming Surface | | | | | | | |
|---|---|---|---|---|---|---|---|---|
| Orientation | -111 | (-111) | (1-11) | (11-1) | (-1-11) | (-11-1) | (1-1-1) | (-1-1-1) |
| [110] | | ○ | ○ | | | ○ | ○ | |
| [101] | | ○ | | ○ | ○ | | ○ | |
| [011] | | | ○ | ○ | ○ | ○ | | |
| [-110] | ○ | | | ○ | ○ | | | ○ |
| [1-10] | ○ | | | ○ | ○ | | | ○ |

TABLE 1-continued

| Etching Orientation | Element-Forming Surface -111 | (-111) | (1-11) | (11-1) | (-1-11) | (-11-1) | (1-1-1) | (-1-1-1) |
|---|---|---|---|---|---|---|---|---|
| [-101] | ○ | | ○ | | | ○ | | ○ |
| [10-1] | ○ | | ○ | | | ○ | | ○ |
| [0-11] | ○ | ○ | | | | | ○ | ○ |
| [01-1] | ○ | ○ | | | | | ○ | ○ |
| [-1-10] | | ○ | ○ | | | ○ | ○ | |
| [-10-1] | | ○ | | ○ | ○ | | ○ | |
| [0-1-1] | | | ○ | ○ | ○ | ○ | | |

As illustrated in Table 1, there are 96 (=8×12) combinations of the {111} plane and the <110> direction. However, the <110> direction of the present disclosure is limited to a direction orthogonal to the {111} plane that is an element forming surface and a direction parallel to the element forming surface. That is, the combination of the element forming surface in the Si {111} substrate of the present disclosure and an orientation in which the etching is performed on the Si {111} substrate is selected from one of the combinations indicated by ○ in Table 1.

Figure 33:
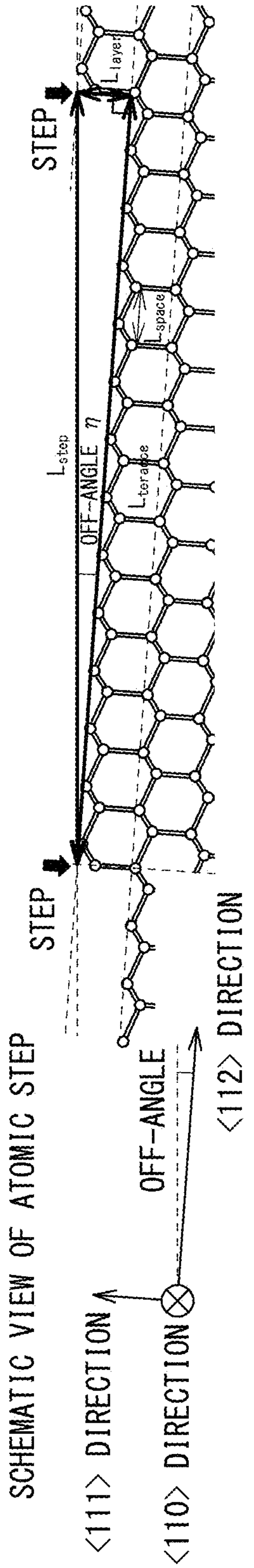
FIG. 33 is an explanatory schematic view of an off-angle at a front surface of the Si substrate of the present disclosure.

In addition, the foregoing first embodiment exemplifies the case of using the Si {111} substrate to cause the etching to progress in the X-axis direction, whereas the etching does not progress in the Y-axis direction and the Z-axis direction. However, the present disclosure is not limited thereto; there may be an etching progress orientation in both of the X-axis direction and the Y-axis direction or in either the X-axis direction or the Y-axis direction. In addition, the Si {111} substrate also includes a case of a substrate of which a substrate surface is processed to have an off-angle relative to a <112> direction, for example, as illustrated in FIG. 33. In a case where the off-angle is 19.47° or less, even a substrate having an off-angle maintains a relationship in which an etching rate of the <110> direction, i.e., the direction with one Si backbond is sufficiently higher than an etching rate of the <111> direction, i.e. the direction with three Si backbonds. As the off-angle becomes larger, the number of steps increases, thus causing density of a micro step difference to be high; therefore, the off-angle is preferably 5° or less. Incidentally, FIG. 33 exemplifies the case where the substrate surface has an off-angle in the <112> direction; however, a case of having an off-angle in the <110> direction may also be employed, and it does not matter which direction the off-angle is in. In addition, an Si plane orientation is analyzable using an X-ray diffraction method, an electron beam diffraction method, an electron beam backscatter diffraction method, etc. The number of Si backbonds is determined by an Si crystal structure, and thus the number of backbonds is also analyzable by analyzing the Si plane orientation.

It is to be noted that the effects described herein are merely exemplary and are not limited thereto, and may have other effects. In addition, the present technology may have the following configurations.

(1)

An imaging device including:

an Si {111} substrate having a first direction as a thickness direction and including a first crystal plane represented by a plane index {111} extending along a horizontal plane orthogonal to the first direction;

a photoelectric conversion section provided in the Si {111} substrate and generating charges corresponding to an amount of light reception by means of photoelectric conversion;

a charge-holding section provided in the Si {111} substrate and holding the charges transferred from the photoelectric conversion section; and a light-shielding section including a horizontal light-shielding part and a vertical light-shielding part, the horizontal light-shielding part positioned between the photoelectric conversion section and the charge-holding section in the first direction and extending along the horizontal plane, the vertical light-shielding part being orthogonal to the horizontal light-shielding part;

the horizontal light-shielding part including a first plane along the first crystal plane of the Si {111} substrate being orthogonal to the first direction and represented by the plane index {111}, and a second plane along a second crystal plane of the Si {111} substrate being inclined relative to the first direction and represented by the plane index {111}.

(2)

The imaging device according to (1), in which the horizontal light-shielding part further includes a third plane along a third crystal plane of the Si {111} substrate being inclined relative to the first direction and represented by the plane index {111}.

(3)

The imaging device according to (2), in which the vertical light-shielding part extends in a second direction orthogonal to the first direction.

(4)

The imaging device according to any one of (1) to (3), further including an etching stopper that exhibits etching resistance to an etching solution allowing for etching in a <110> direction of the Si {111} substrate.

(5)

The imaging device according to (4), in which the etching stopper includes an impurity element, a crystal defect structure, or an insulator.

(6)

The imaging device according to any one of (1) to (3), in which an Si-remaining region other than a region occupied by the horizontal light-shielding part in a plane orthogonal to the first direction is island-shaped or band-shaped.

(7)

The imaging device according to any one of (1) to (6), further including a vertical electrode extending in the first direction, which is provided in the Si-remaining region other than the region occupied by the horizontal light-shielding part in the plane orthogonal to the first direction, and through which charges traveling from the photoelectric conversion section to the charge-holding section pass.

(8)

The imaging device according to any one of (1) to (7), in which the light-shielding section further includes an additional horizontal light-shielding part provided at a position different from the horizontal light-shielding part in the first direction and extending along the horizontal plane.

(9)

The imaging device according to (8), in which the additional horizontal light-shielding part is provided in a region overlapping, in the first direction, the Si-remaining region other than the region occupied by the horizontal light-shielding part in the plane orthogonal to the first direction.

(10)

The imaging device according to any one of (1) to (9), in which the vertical light-shielding part is exposed to a front surface, of the Si {111} substrate, positioned opposite to the photoelectric conversion section as viewed from the horizontal light-shielding part.

(11)

The imaging device according to (10), further including an additional light-shielding section including an additional horizontal light-shielding part and an additional vertical light-shielding part, the additional horizontal light-shielding part being provided at a position different from the horizontal light-shielding part in the first direction and extending along the horizontal plane, the additional vertical light-shielding part being orthogonal to the additional horizontal light-shielding part.

(12)

The imaging device according to (11), in which the additional horizontal light-shielding part is provided in the region overlapping, in the first direction, the Si-remaining region other than the region occupied by the horizontal light-shielding part in the plane orthogonal to the first direction.

(13)

The imaging device according to (11) or (12), in which the additional vertical light-shielding part is exposed to a back surface positioned opposite to the front surface of the Si {111} substrate.

(14)

The imaging device according to any one of (1) to (13), further including a semiconductor region in which P type or N type impurities are diffused around the vertical light-shielding part, in which at least one of impurity concentrations or impurity materials differ from each other across the horizontal light-shielding part in the semiconductor region.

(15)

An electronic apparatus including an imaging device, the imaging device including an Si {111} substrate having a first direction as a thickness direction and extending along a horizontal plane orthogonal to the first direction, a photoelectric conversion section provided in the Si {111} substrate and generating charges corresponding to an amount of light reception by means of photoelectric conversion, a charge-holding section provided in the Si {111} substrate and holding the charges transferred from the photoelectric conversion section, and a light-shielding section including a horizontal light-shielding part and a vertical light-shielding part, the horizontal light-shielding part positioned between the photoelectric conversion section and the charge-holding section in the first direction and extending along the horizontal plane, the vertical light-shielding part being orthogonal to the horizontal light-shielding part, the horizontal light-shielding part including a first plane along the first crystal plane of the Si {111} substrate being orthogonal to the first direction and represented by the plane index {111}, and a second plane along a second crystal plane of the Si {111} substrate being inclined relative to the first direction and represented by the plane index {111}.

(16)

The electronic apparatus according to (15), in which the horizontal light-shielding part further includes a third plane along a third crystal plane of the Si {111} substrate being inclined relative to the first direction and represented by the plane index {111}.

(17)

A method of manufacturing an imaging device, the method including:

preparing an Si {111} substrate having a first direction as a thickness direction and extending along a horizontal plane orthogonal to the first direction;

forming, in the Si {111} substrate, a photoelectric conversion section generating charges corresponding to an amount of light reception by means of photoelectric conversion;

forming, in the Si {111} substrate, a charge-holding section holding the charges transferred from the photoelectric conversion section; and forming a light-shielding section including a horizontal light-shielding part and a vertical light-shielding part, the horizontal light-shielding part positioned between the photoelectric conversion section and the charge-holding section in the first direction and extending along the horizontal plane, the vertical light-shielding part being orthogonal to the horizontal light-shielding part; in which the first crystal plane of the Si {111} substrate orthogonal to the first direction and represented by the plane index {111} and a second crystal plane of the Si {111} substrate inclined relative to the first direction and represented by the plane index {111} are each formed by performing crystalline anisotropic etching on the Si {111} substrate using an etching solution to form the horizontal light-shielding part including a first plane along the first crystal plane and a second plane along the second crystal plane.

(18)

The method of manufacturing the imaging device according to (17), in which a third crystal plane of the Si {111} substrate inclined relative to the first direction and represented by the plane index {111} is further formed by performing the crystalline anisotropic etching to further form the horizontal light-shielding part including a third plane along the third crystal plane.

(19)

The method of manufacturing the imaging device according to (17), in which a trench is formed that serves as the horizontal light-shielding part and the vertical light-shielding part from one surface of the Si {111} substrate, and thereafter the charge-holding section is formed on side of another surface opposed to the one surface.

(20)

An imaging device including:

an Si substrate having a first direction as a thickness direction and extending along a horizontal plane orthogonal to the first direction;

a photoelectric conversion section provided in the Si substrate and generating charges corresponding to an amount of light reception by means of photoelectric conversion;

a charge-holding section provided in the Si substrate and holding the charges transferred from the photoelectric conversion section; and a light-shielding section including a horizontal light-shielding part and a vertical light-shielding part, the horizontal light-shielding part positioned between the photoelectric conversion section and the charge-holding section in the first direction and extending along the horizontal plane, the vertical light-shielding part being orthogonal to the horizontal light-shielding part;

the horizontal light-shielding part including a first plane along a crystal plane being orthogonal to the first direction and having three Si backbonds, and a second plane along a second crystal plane being inclined relative to the first direction and having three Si backbonds.

This application claims the benefit of Japanese Priority Patent Application JP2018-114537 filed with the Japan Patent Office on Jun. 15, 2018 and Japanese Priority Patent Application JP2019-108072 filed with the Japan Patent Office on Jun. 10, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light detecting device comprising:
- a semiconductor substrate having a first direction as a thickness direction and including a first crystal plane represented by a plane index extending along a horizontal plane orthogonal to the first direction;
- a photoelectric conversion section provided in the semiconductor substrate;
- a charge-holding section provided in the semiconductor substrate; and
- a light-shielding section including a horizontal light-shielding part and a vertical light-shielding part, wherein the horizontal light-shielding part is positioned between the photoelectric conversion section and the charge-holding section in the first direction and extends along the horizontal plane, wherein the horizontal light-shielding part includes an insulating material, and wherein the vertical light-shielding part is orthogonal to the horizontal light-shielding part.

2. The light detecting device according to claim 1, wherein the horizontal light-shielding part further includes:
- a first plane formed along the first crystal plane of the semiconductor substrate orthogonal to the first direction; and
- a second plane formed along a second crystal plane of the semiconductor substrate being inclined relative to the first direction and represented by the plane index.

3. The light detecting device according to claim 2, wherein the horizontal light-shielding part further includes:
- a third plane formed along a third crystal plane of the semiconductor substrate being inclined relative to the first direction and represented by the plane index.

4. The light detecting device according to claim 1, wherein the horizontal light-shielding part extends in a second direction orthogonal to the first direction.

5. The light detecting device according to claim 1, further comprising:
- an etching stopper that exhibits etching resistance to an etching solution.

6. The light detecting device according to claim 5, wherein the etching stopper comprises an impurity element, a crystal defect structure, or an insulator.

7. The light detecting device according to claim 1, further comprising:
- a transistor extending in the first direction, which is provided in a semiconductor-remaining region other than a region occupied by the horizontal light-shielding part, and through which charges traveling from the photoelectric conversion section to the charge-holding section pass.

8. The light detecting device according to claim 1, wherein the light-shielding section further includes:
- an additional horizontal light-shielding part provided at a position different from the horizontal light-shielding part in the first direction and extending along the horizontal plane.

9. The light detecting device according to claim 8, wherein the additional horizontal light-shielding part is provided in a region overlapping, in the first direction, a semiconductor-remaining region other than a region occupied by the horizontal light-shielding part in a plane orthogonal to the first direction.

10. The light detecting device according to claim 1, wherein the vertical light-shielding part is above a front surface of the semiconductor substrate, positioned opposite to the photoelectric conversion section.

11. The light detecting device according to claim 1, further comprising:
- an additional light-shielding section including an additional horizontal light-shielding part and an additional vertical light-shielding part, the additional horizontal light-shielding part being provided at a position different from the horizontal light-shielding part in the first direction and extending along the horizontal plane, the additional vertical light-shielding part being orthogonal to the additional horizontal light-shielding part.

12. The light detecting device according to claim 9, wherein the additional horizontal light-shielding part is provided in a region overlapping, in the first direction, a semiconductor-remaining region other than a region occupied by the horizontal light-shielding part in a plane orthogonal to the first direction.

13. The light detecting device according to claim 11, wherein the additional vertical light-shielding part is exposed to a back surface positioned opposite to a front surface of the semiconductor substrate.

14. The light detecting device according to claim 1, further comprising, around the vertical light-shielding part:
- a first semiconductor region in which N type impurities are diffused; and
- a second semiconductor region which is located on a side opposite to the first semiconductor region, with the horizontal light-shielding part interposed between, and in which P type impurities are diffused.

15. The light detecting device according to claim 14, wherein the first semiconductor region has a first impurity concentration that is different from a second impurity concentration of the second semiconductor region.

16. The light detecting device according to claim 14, wherein the first semiconductor region includes a first impurity material that is different from a second impurity material of the second semiconductor region.

17. The light detecting device according to claim 14, wherein a first impurity concentration and a first impurity material are different from a second impurity concentration and a second impurity material.

18. An electronic apparatus comprising a light detecting device, the light detecting device including:
- a semiconductor substrate having a first direction as a thickness direction and extending along a horizontal plane orthogonal to the first direction;
- a photoelectric conversion section provided in the semiconductor substrate;
- a charge-holding section provided in the semiconductor substrate; and
- a light-shielding section including a horizontal light-shielding part and a vertical light-shielding part, wherein the horizontal light-shielding part is positioned between the photoelectric conversion section and the charge-holding section in the first direction and extends along the horizontal plane, and wherein the vertical light-shielding part is orthogonal to the horizontal light-shielding part.

* * * * *